(12) United States Patent
Post et al.

(10) Patent No.: US 10,955,983 B2
(45) Date of Patent: Mar. 23, 2021

(54) INTERACTION SENSING

(71) Applicant: Samsung Electronics Company, Ltd., Suwon-si (KR)

(72) Inventors: Ernest Rehmi Post, San Jose, CA (US); Olivier Bau, San Francisco, CA (US); Iliya Tsekov, East Palo Alto, CA (US); Sajid Sadi, San Jose, CA (US); Mike Digman, Mountain View, CA (US); Vatche Attarian, San Jose, CA (US); Sergi Consul, San Jose, CA (US); Cody Wortham, Mountain View, CA (US)

(73) Assignee: SAMSUNG ELECTRONICS COMPANY, LTD., Suwon (KR)

( * ) Notice: Subject to any disclaimer, the term of this patent is extended or adjusted under 35 U.S.C. 154(b) by 28 days.

(21) Appl. No.: 16/431,506

(22) Filed: Jun. 4, 2019

(65) Prior Publication Data
US 2019/0286265 A1    Sep. 19, 2019

Related U.S. Application Data

(63) Continuation of application No. 14/458,097, filed on Aug. 12, 2014, now Pat. No. 10,318,090.
(Continued)

(51) Int. Cl.
*G06F 3/046*   (2006.01)
*H03K 17/96*   (2006.01)
(Continued)

(52) U.S. Cl.
CPC .............. *G06F 3/046* (2013.01); *G06F 3/011* (2013.01); *G06F 3/041* (2013.01); *H03K 17/96* (2013.01); *G06F 2203/04106* (2013.01)

(58) Field of Classification Search
CPC ........... G06F 3/041; G06F 3/044; G06F 3/046
See application file for complete search history.

(56) References Cited

U.S. PATENT DOCUMENTS 8,217,915 B2   7/2012   Philipp
9,569,055 B2 *  2/2017   Post ........................ G06F 3/011
(Continued)

FOREIGN PATENT DOCUMENTS

CN   1708672 A    12/2005
CN   101719464 A   6/2010
(Continued)

OTHER PUBLICATIONS

KR Notice of Allowance from Korean Intellectual Property Office for KR Application No. 10-2018-7010759 (w/English translation), 8 pages, dated Nov. 11, 2019.
(Continued)

*Primary Examiner* — Patrick F Marinelli
(74) *Attorney, Agent, or Firm* — Baker Botts L.L.P.

(57) ABSTRACT

In particular embodiments, an apparatus includes a single electrode configured to passively receive a charge displacement and a change in characteristics of electromagnetic signals in an environment. The apparatus further includes a touch sensor, coupled to the single electrode, configured to detect a first input based on the charge displacement, and a second input based on the change in characteristics of electromagnetic signals in the environment.

16 Claims, 40 Drawing Sheets

Related U.S. Application Data

(60) Provisional application No. 61/865,448, filed on Aug. 13, 2013, provisional application No. 61/924,558, filed on Jan. 7, 2014, provisional application No. 61/924,604, filed on Jan. 7, 2014, provisional application No. 61/924,625, filed on Jan. 7, 2014, provisional application No. 61/924,637, filed on Jan. 7, 2014, provisional application No. 61/969,544, filed on Mar. 24, 2014, provisional application No. 61/969,558, filed on Mar. 24, 2014, provisional application No. 61/969,590, filed on Mar. 24, 2014, provisional application No. 61/969,612, filed on Mar. 24, 2014, provisional application No. 62/000,429, filed on May 19, 2014.

(51) Int. Cl.
*G06F 3/01* (2006.01)
*G06F 3/041* (2006.01)

(56) References Cited

U.S. PATENT DOCUMENTS

| | | | |
|---|---|---|---|
| 10,042,446 B2 * | 8/2018 | Yoon | G06F 3/044 |
| 10,042,504 B2 * | 8/2018 | Post | G06F 3/041 |
| 10,073,578 B2 * | 9/2018 | Bau | H04W 4/023 |
| 10,101,869 B2 * | 10/2018 | Bau | G06F 1/163 |
| 10,108,305 B2 * | 10/2018 | Post | G06F 3/041 |
| 10,141,929 B2 * | 11/2018 | Rakova | G06F 3/014 |
| 10,318,090 B2 * | 6/2019 | Post | G06F 3/046 |
| 2004/0078971 A1 | 4/2004 | Muranaka | |
| 2008/0072691 A1 | 3/2008 | Gruber | |
| 2008/0117371 A1 | 5/2008 | Shin | |
| 2010/0049608 A1 | 2/2010 | Grossman | |
| 2015/0048846 A1 * | 2/2015 | Post | G06F 3/011 324/663 |
| 2015/0049034 A1 * | 2/2015 | Post | G06F 3/041 345/173 |
| 2015/0049055 A1 * | 2/2015 | Post | G06F 3/011 345/174 |
| 2015/0049056 A1 * | 2/2015 | Post | G06F 3/046 345/174 |
| 2015/0145653 A1 | 5/2015 | Katingari | |
| 2016/0216794 A1 * | 7/2016 | Yoon | G06F 3/041 |
| 2016/0259432 A1 * | 9/2016 | Bau | G06F 3/046 |
| 2016/0259451 A1 * | 9/2016 | Bau | G06F 3/046 |
| 2016/0261268 A1 * | 9/2016 | Rakova | G06F 3/04182 |
| 2018/0062543 A1 * | 3/2018 | Jung | H02N 1/04 |
| 2018/0091065 A1 * | 3/2018 | Bae | H02N 1/04 |
| 2018/0145613 A1 * | 5/2018 | Shin | H02N 1/04 |
| 2019/0004636 A1 * | 1/2019 | Bau | H04W 4/023 |
| 2019/0286265 A1 * | 9/2019 | Post | H03K 17/96 |

FOREIGN PATENT DOCUMENTS

| | | | |
|---|---|---|---|
| CN | 102239655 A | 11/2011 | |
| CN | 102576270 A | 7/2012 | |
| CN | 102804115 A | 11/2012 | |
| CN | 104111725 A | 10/2014 | |
| CN | 102854978 B | 8/2015 | |
| CN | 104346297 B | 10/2018 | |
| JP | 2000148396 | 5/2000 | |
| JP | 2004078971 A | 3/2004 | |
| JP | 2008117371 A | 5/2008 | |
| JP | 2010049608 A | 3/2010 | |
| KR | 20110061637 A | 6/2011 | |
| KR | 20120003764 A | 1/2012 | |
| KR | 20120085392 A | 8/2012 | |
| KR | 20150055018 A | 5/2015 | |
| KR | 20150055019 A | 5/2015 | |
| KR | 1020150060553 | 6/2015 | |
| KR | 1020150101213 | 9/2015 | |
| WO | WO-2015021761 A1 * | 2/2015 | ............ H02N 1/04 |
| WO | WO 2015/158189 A1 | 10/2015 | |
| WO | WO 2017/048068 | 3/2017 | |

OTHER PUBLICATIONS

Australian Patent Office—Acceptance Notice for AU Application No. 2014307232, 3 pages, dated Nov. 27, 2019.
IN Office Action for Application No. 721MUMNP2015, 6 pages, dated Jan. 23, 2020.
IN Office Action for Application No. 834MUMNP2015, 7 pages, dated Jan. 24, 2020.
KR Office Action from Korean Intellectual Property Office for KR Application No. 10-2018-7028389 (no English translation), 33 pgs, dated Jan. 29, 2020.
JP Office Action from Japanese Intellectual Property Office for JP Application No. 2018-206738 (no English translation), 2 pgs, dated Feb. 4, 2020.
KR Office Action from Korean Intellectual Property Office for KR Application No. 10-2018-7017888 (no English translation), dated Apr. 3, 2019.
KR Office Action from Korean Intellectual Property Office for KR Application No. 10-2018-7010605 (no English translation), dated Jun. 4, 2019.
EP 1st Office Action for Application No. 16846887.4, dated May 16, 2019.
EP 1st Office Action for Application No. 16868842.2, dated May 21, 2019.
Australian Patent Office—Examination Report No. 1 for AU Application No. 2014307234, dated Apr. 5, 2019.
KR Office Action from Korean Intellectual Property Office for KR Application No. 10-2018-7010759 (no English translation), dated Jun. 21, 2019.
Australian Patent Office—Notice of Allowance for AU Application No. 2014307234, dated Jul. 19, 2019.

* cited by examiner

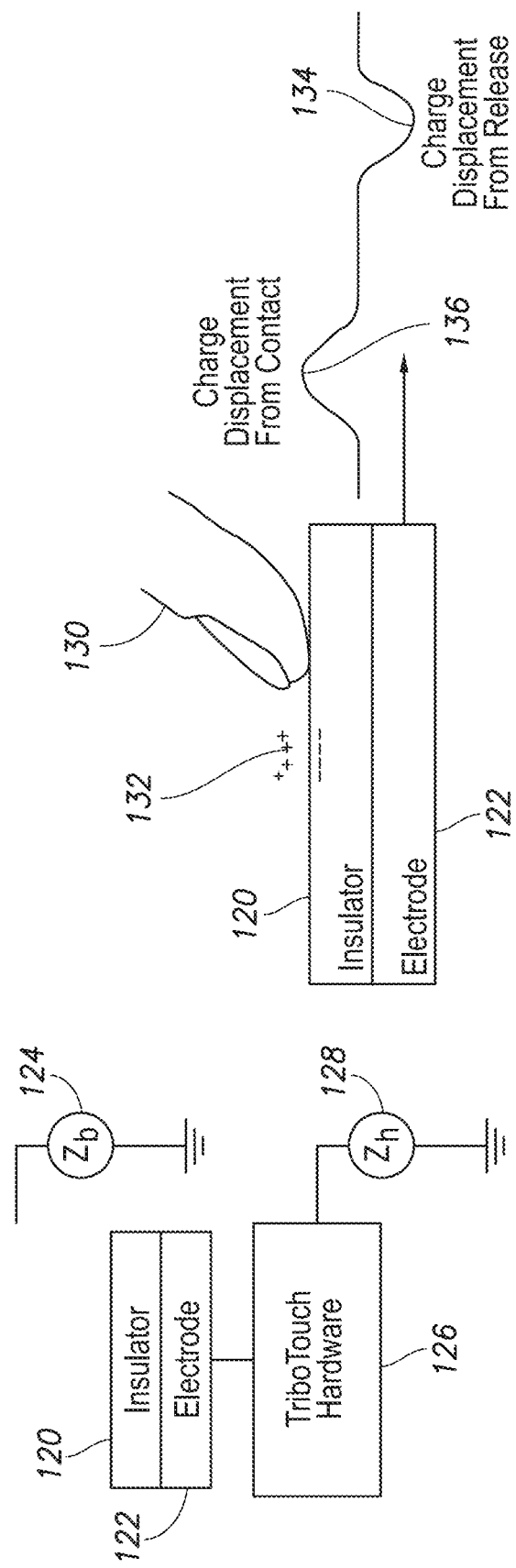

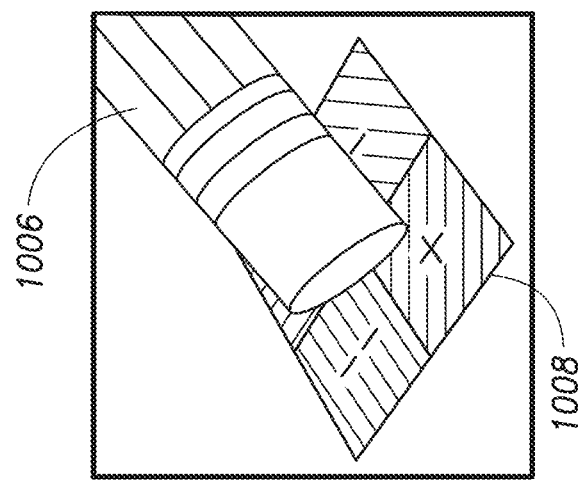
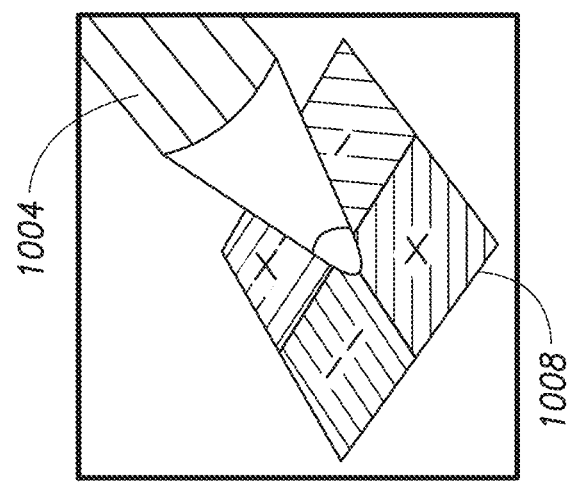
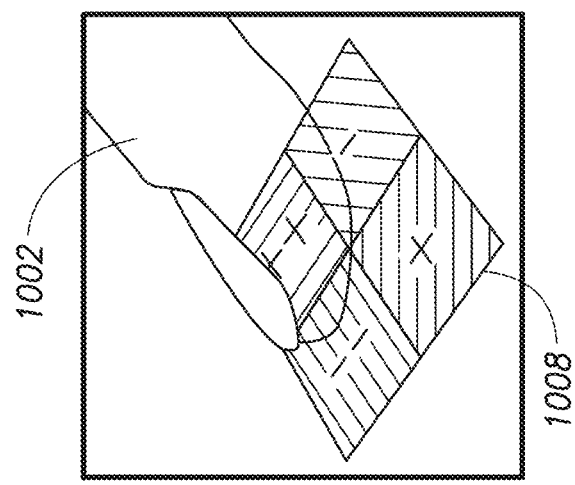
FIG. 10C
FIG. 10B
FIG. 10A

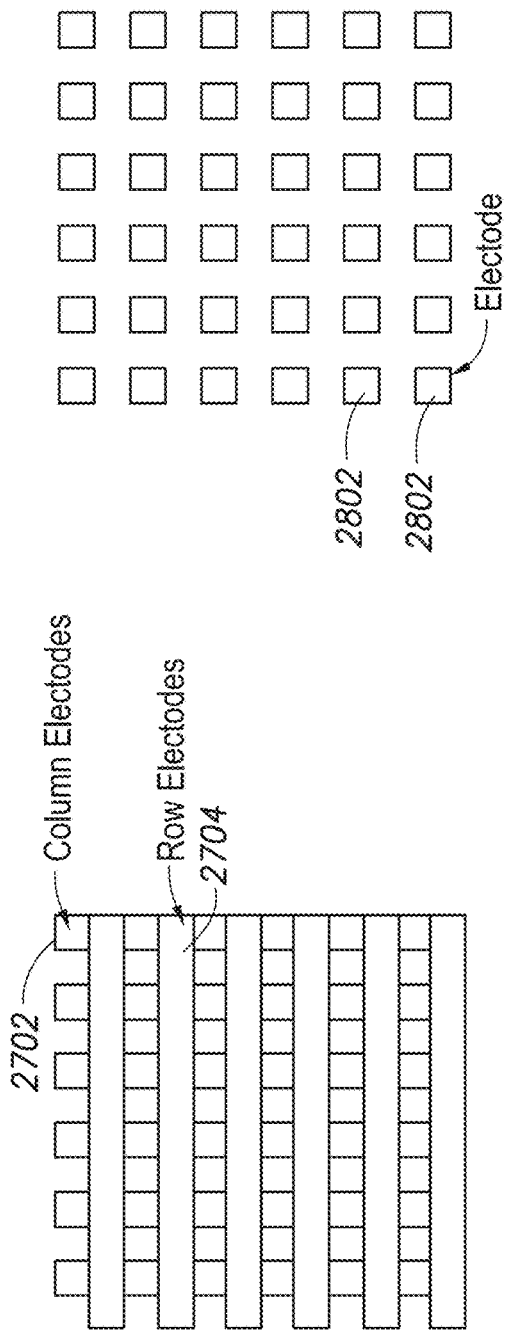
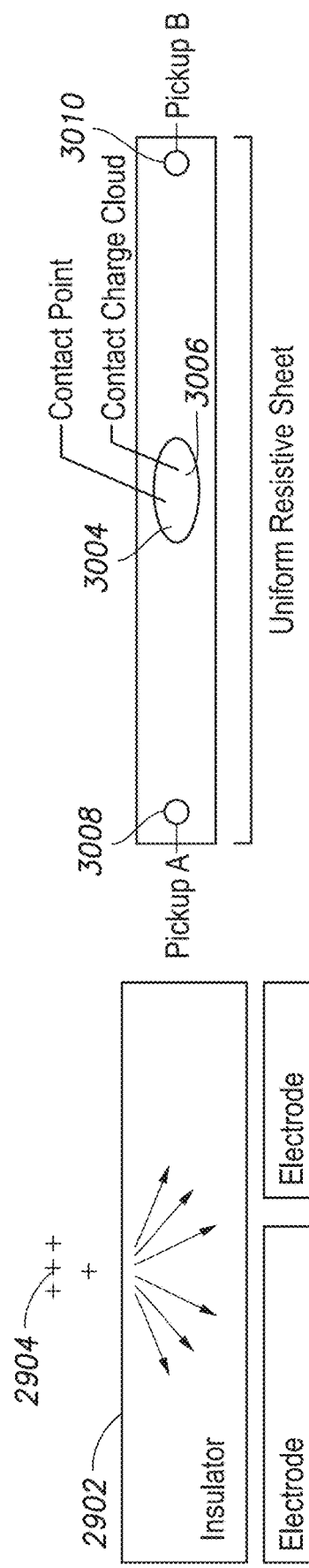
FIG. 32
FIG. 33
FIG. 34
FIG. 35

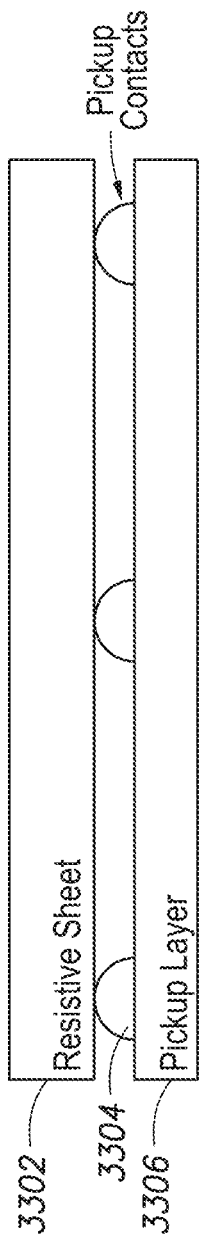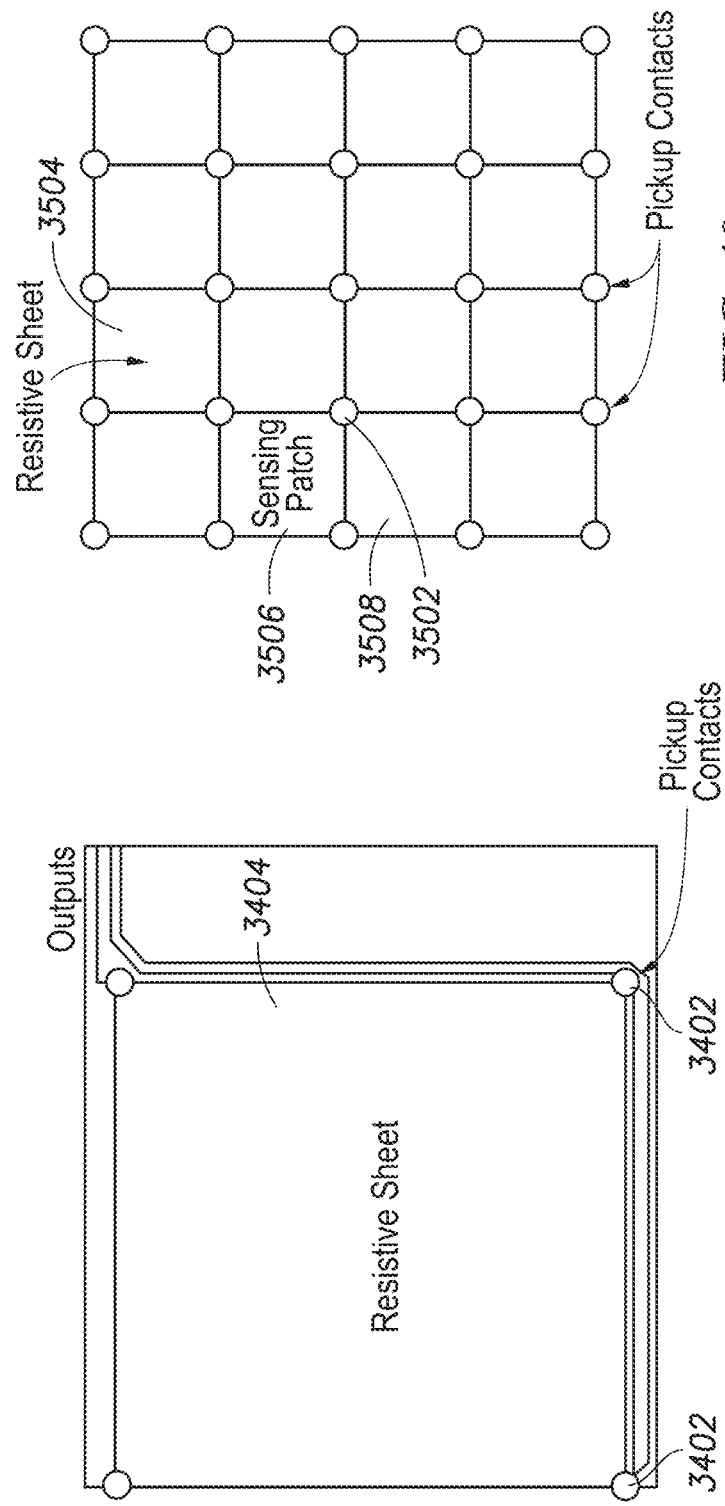

INTERACTION SENSING

PRIORITY

This application claims the benefit as a continuation under 35 U.S.C. § 120 of U.S. patent application Ser. No. 14/458,097, which claims the benefit under 35 U.S.C. § 119(e) of the following, which are all incorporated herein by reference: U.S. Provisional Patent Application No. 61/865,448, filed 13 Aug. 2013; U.S. Provisional Patent Application No. 61/924,558, filed 7 Jan. 2014; U.S. Provisional Patent Application No. 61/924,604, filed 7 Jan. 2014; U.S. Provisional Patent Application No. 61/924,625, filed 7 Jan. 2014; U.S. Provisional Patent Application No. 61/924,637, filed 7 Jan. 2014; U.S. Provisional Patent Application No. 61/969,544, filed 24 Mar. 2014; U.S. Provisional Patent Application No. 61/969,558, filed 24 Mar. 2014; U.S. Provisional Patent Application No. 61/969,590, filed 24 Mar. 2014; U.S. Provisional Patent Application No. 61/969,612, filed 24 Mar. 2014; and U.S. Provisional Patent Application No. 62/000,429, filed 19 May 2014.

TECHNICAL FIELD

This disclosure generally relates to electronic devices that detect interactions with objects, and more particularly to devices that use surface contact sensors or proximity sensors to detect interactions.

BACKGROUND

A touch sensor can detect the presence and location of a touch or object or the proximity of an object (such as a user's finger or a stylus) within a touch-sensitive area of the touch sensor overlaid on a display screen, for example. In a touch sensitive display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as, for example, resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

Capacitive touch operates by sending a signal from an electrode, and then measuring the variation caused by the presence of intervening materials. Actively emitting an electric field adds to the energy usage of the device and slows down responsiveness. Additionally, scaling the capacitive touch sensor to very large areas can be cost-prohibitive.

BRIEF DESCRIPTION OF THE DRAWINGS

FIGS. 1A and 1B illustrate an example TriboTouch system, which can determine positions of an object based on triboactivity.

FIGS. 10A-10C illustrate different positive and negative charge patterns generated when different objects make contact with the same patterned array of sensors.

FIG. 32 illustrates a row-column electrode grid that can be used to detect position of two touch points.

FIGS. 33 and 34 illustrate array multitouch configurations using single-touch electrodes in a grid.

FIG. 35 illustrates an example of continuous passive position sensing using a resistive sheet electrode.

FIGS. 38-40 illustrate example electrode-sheet configurations.

DESCRIPTION OF EXAMPLE EMBODIMENTS

FIGS. 1A and 1B illustrate an example TriboTouch system, which can determine positions of an object based on triboactivity. FIG. 1A shows an insulator surface adjacent to an electrode. The electrode is connected to TriboTouch hardware, which determines the positions of an object 130 such as a finger when contact of the object with the insulator produces a local charge displacement, as shown in FIG. 1B. The charge displacement is not a net current flow, but rather a charge displacement that is reversed when contact with the object is removed. This distortion of the internal electric field of the insulator can be picked up by the TriboTouch hardware, and interpreted as contact and separation events. Additionally, the distortion spreads out over a region from the point of contact, allowing for a continuous estimate of position.

FIGS. 2A-2E illustrate an example interaction between a finger and a TriboTouch sensor, which can be used to determine the finger's position based on triboactivity. When two objects come into contact, charge can be transferred between them due to the interaction of electron clouds around the surface atoms. This effect is known by various names, including triboelectricity, contact potential difference, and work function. In the semiconductor industry these phenomena lead to electrostatic discharge (ESD) events which can damage sensitive electronic devices. Rather than attempting to mitigate these effects, techniques disclosed herein referred to by the name "TriboTouch" use this charging mechanism to detect surface contact and motion effects. TriboTouch can directly sense insulators (e.g., gloves, brushes, etc.) as well as conductors or strong dielectrics (e.g., fingers, conductive rubber, etc.) to enable modes of interaction with sensing surfaces such as those described herein. In one aspect, TriboTsouch uses local charge transfer caused by contact and need not emit an electric field to be measured.

Figure 2A:
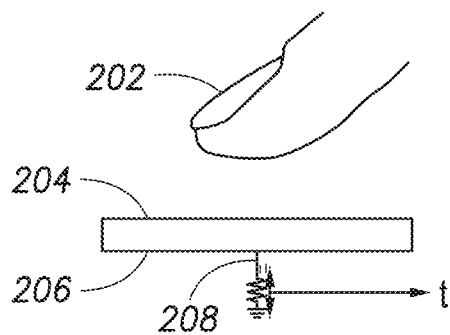
FIGS. 2A-2E illustrate an example interaction between a finger and a TriboTouch sensor.
Figure 2B:
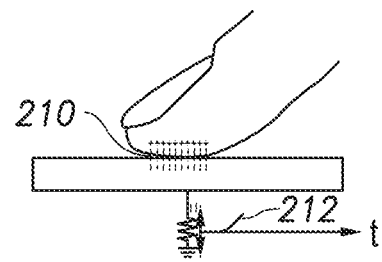
Figure 2C:
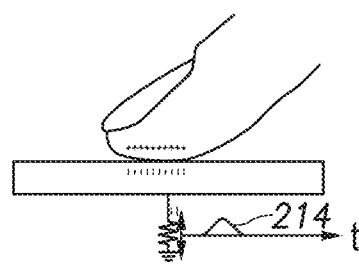
Figure 2D:
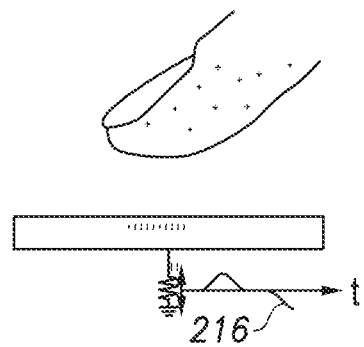
Figure 2E:
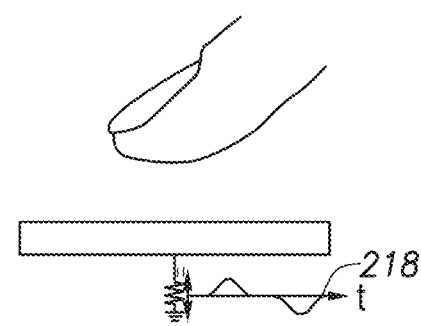

Aspects of a TriboTouch system are illustrated in FIGS. 2A-2E using a finger, but any conductive or non-conductive object can have the same effect. In one aspect, TriboTouch works by measuring the charge displaced when two objects come into contact or separate. No secondary mechanism is needed to induce charge in the object being sensed. There is no need to transmit a signal to be measured. Instead, charge is generated and received when an object contacts the sensing surface. FIG. 2A shows a finger above an insulating surface. In FIG. 2B, as the finger contacts the surface, charge flows and current is sensed. In FIG. 2C, current ceases at equilibrium. In FIG. 2D, finger separation causes charge redistribution and an opposite current. In FIG. 2E, equilibrium has been restored.

Charge transfer can occur between combinations of insulators, semi-conductors, and conductors with dissimilar surface properties (e.g., composition, surface microstructure, etc.). The polarity, surface charge density, and rate of charge transfer ("contact current") depend on the particular materials involved. The amount of charge transferred between two materials can be estimated from their relative positions in an empirically-determined "triboelectric series". A commonly-accepted series, ordered from most positive to most negative, is: air, human skin or leather, glass, human hair, nylon, wool, cat fur, silk, aluminum, paper, cotton, steel, wood, acrylic, polystyrene, rubber, nickel or copper, silver, acetate or rayon, Styrofoam, polyurethane, polyethylene, polypropylene, vinyl (PVC), silicon, and Teflon (PTFE). TriboTouch allows detection of contact by essentially any solid material.

Figure 3:
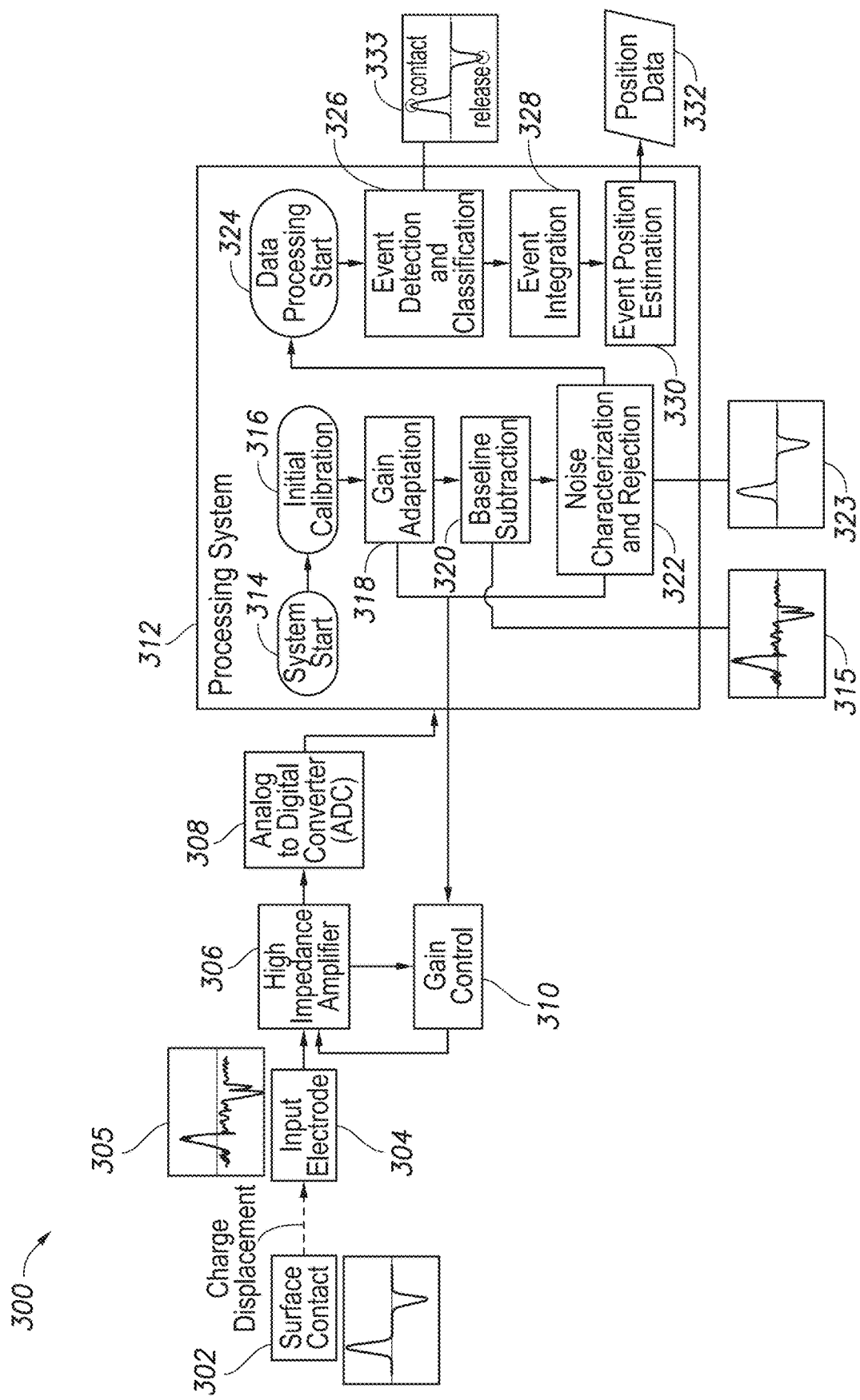
FIG. 3 illustrates an example architecture of a TriboTouch system.
Figure 4:
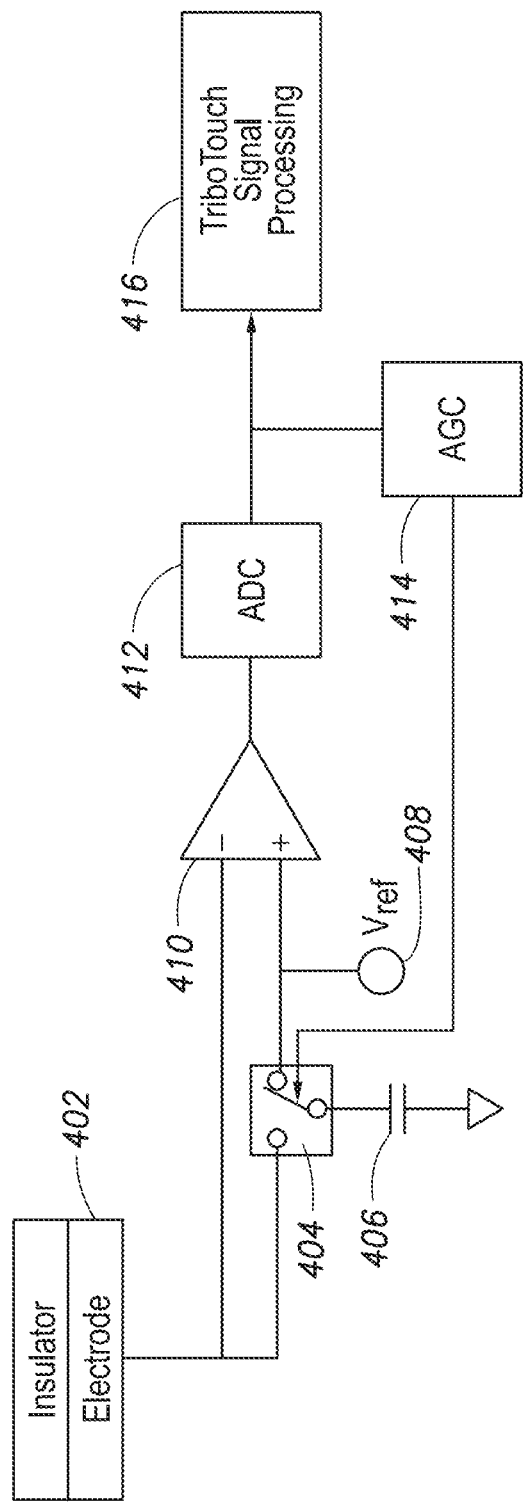
FIG. 4 illustrates an example alternative analog front-end.

FIG. 3 illustrates an example architecture of a TriboTouch system. A high impedance amplifier 306 amplifies incoming signals 305 received from an input electrode 304 in response to a surface contact 302, and a subsequent analog to digital converter (ADC) converts this signal 305 to digital form. The input electrode 304, high impedance amplifier 306, and ADC 308 convert the signal 305 as seen at the electrode 304 accurately to digital form. Other embodiments can use sigma-delta approaches, charge counting, charge balancing, or other means of measuring small charge displacements, as shown in FIG. 4. A gain control system 310 can optionally be used to maintain the values within the prescribed range of the system. In one or more embodiments, the components that receive and convert the input signal to digital form are referred to herein as an analog front-end. The analog front-end can include the input electrode 304, amplifier 306, ADC 308, and gain control 310, or a subset of those components. A processing system 312 receives the digital signal and generates position data 332. The processing system 312 can be implemented using hardware, software, or a combination of hardware and software. The processing system 312 starts at block 314 and performs initial calibration at block 316. Then the baseline can be determined by an adaptive method 318. The adaptive method can be, for example, a running average, a differential measurement with respect to a shield electrode, or a composite measure computed from an aggregate of measurement sites, or other methods. This may be triggered as the system is first initialized, or when the system detects that there is a drift in the signal, as indicated by a constant offset of values over a long period. Once this baseline is subtracted at block 320, the noise in the signal (for example to detect common 50/60 Hz noise, and frequencies above and below the expected range of the system) is modeled and rejected at block 322, leaving a signal due to contact charging effects. Contact charging events are then detected and classified, at block 326, as contact, separation, or motion by their time domain profile, using methods such as matched filters, wavelet transforms, or time-domain classifiers (e.g. support vector machines). These events are then integrated by a state machine at block 328 to create a map of contact states on the sensing surface, which allows the system to track when and where contact and release events take place. Finally, this map is used to estimate event types and coordinates at block 330. Note that TriboTouch does not ordinarily produce a continuous signal when a contact is stationary. However, it does produce opposite-polarity signals on contact and removal. These opposite-polarity signals can be used to keep track of how additional contacts are formed and removed in the vicinity of an existing contact point. The pattern of contacts can be understood by an analogy to the effects of dragging a finger through sand, in which a wake is formed before and after the finger. Similarly a "charge wake" is seen by the system, and the charge wake is used to determine motion. The final output is a high-level event stream 333 describing the user's actions. The output can include position data 332. In one or more embodiments, large objects, e.g., a finger, can be distinguished from a collection of multiple touch sites because large objects tend to produce a larger "imprint" of contact that is received at substantially the same time. By correlating the contacts in time, the TriboTouch system can keep track of which contacts belong together. Even when two objects are in close proximity, as in a pinch gesture, for example, the sensor actually detects two contact "peaks" very close together. Therefore the contact relationships can be maintained.

FIG. 4 illustrates an example alternative analog front-end. While the description of FIG. 3 has been related to the use of a high-impedance amplifier 306 followed by an analog-to-digital converter 308, TriboTouch can also employ a charge-balancing sigma-delta converter, or it can combine both approaches. In the configuration shown in FIG. 4, a capacitor 406 is switched by a switch 404 between a reference voltage source (Vref) 408 and the input electrode 402 to transfer packets of charge, thereby keeping the input electrode potential within the range of the input amplifier 410 (or comparator in the case of a 1-bit sigma-delta ADC). The subsequent signal processing chain combines the output 315 of the ADC 412 and output of the automatic gain control (AGC) 414 to reconstruct the input current with a higher dynamic range than would be possible with the input amplifier and ADC alone. The reconstructed input current is provide to TriboTouch signal processing 416, which can be the processing system, 312 or other signal processing system.

As described above, TriboTouch can sense signals directly generated by physical contact and need not transmit signals to be sensed. Therefore, the system does not emit spurious signals as a result of its activities outside of what may be normally expected from any electronic circuit, simplifying compliance with EMI regulations and design of noise-sensitive electronics positioned nearby. An additional benefit is the power savings from this design. There is direct savings from not having to transmit a field. Additionally, the system benefits from a simplified architecture, which means there are fewer electronic devices to power. Further, since there is no need to perform extensive noise rejection in hardware, there can be additional savings from reduction of complexity.

Figure 5:
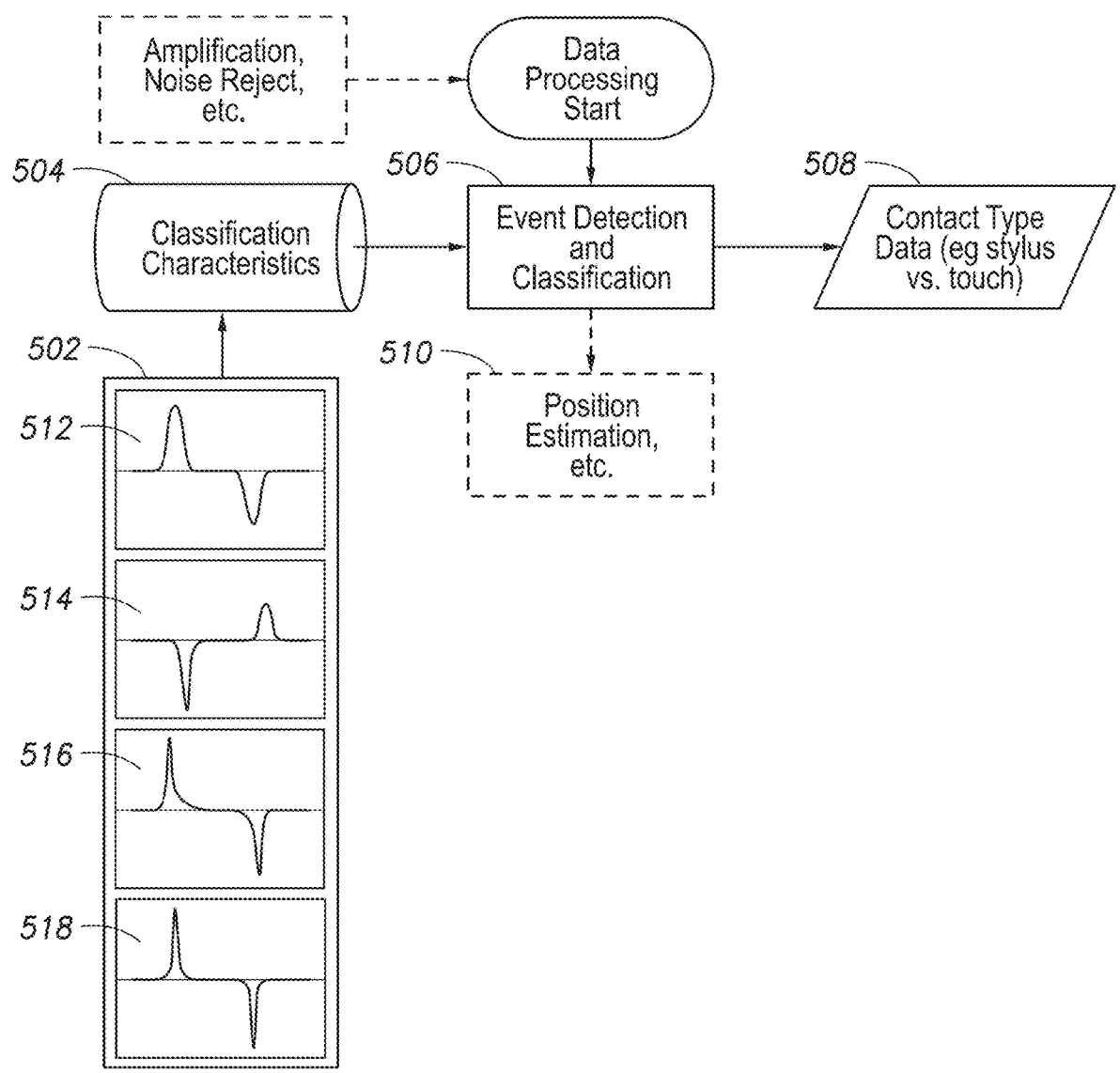
FIG. 5 illustrates principles of TriboTouch operation.

FIG. 5 illustrates principles of TriboTouch operation. The tribocharging caused by contact with the insulating surface is coupled capacitively to the electrode via dielectric polarization. TriboTouch is thus capable of detecting contact, motion, and separation of objects at the surface of the insulator. As such, it is possible to use any object (finger, glove, plastic stylus, paint brush, paper, etc.) to interact with the sensing surface. A data processing system can determine the type of object that interacts with the surface using an event detection and classification component 506. The event detection and classification component 506 uses classification characteristics 504 to determine contact type data 508, which identifies the type of the object. The classification characteristics 504 can include one or more signal patterns 502 that correspond to different types of objects. For example, a first signal pattern 512 can correspond to a finger, a second signal pattern 514 to a glove, a third signal pattern 516 to a plastic stylus, a fourth signal pattern 518 to a paint brush, and so on. The event detection and classification component 506 can, for example, compare the detected tribocharging signal to the signal patterns 502 and select one of the signal patterns 502 that best matches the detected signal. The event detection and classification component 506 can also estimate the position 510 of the detected signal, as described above with reference to FIG. 3.

Figure 6:
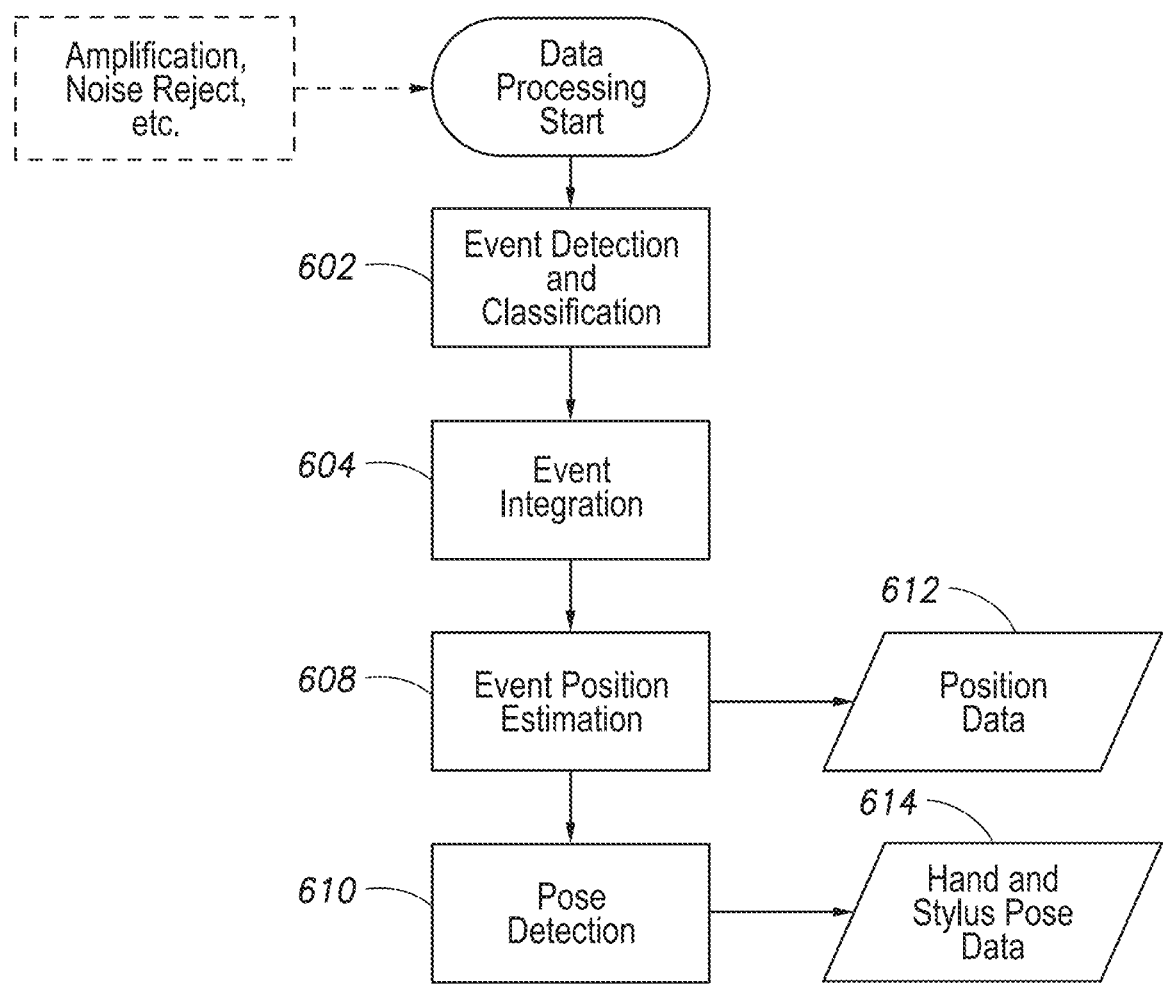
FIG. 6 illustrates an example process for determining types of contacts based on signal profiles.

FIG. 6 illustrates an example process for determining types of contacts based on signal profiles. Because TriboTouch can sense contact with, motion across, and separation of an object from the sensing surface, it is not necessary to algorithmically derive these events from capacitance measurements. TriboTouch can therefore produce more accurate identification of these events than capacitive sensing can ordinarily provide. Additionally, because of the localized nature of tribocharging, the position estimation algorithms can yield higher spatial and temporal resolution than capacitive sensing methods. This higher resolution can be used, for example, to perform palm rejection or other inadvertent contact rejection using the process shown in FIG. 6. The process of FIG. 6 detects and classifies events at block 602. Block 604 integrates events, e.g., by using a state machine to create a map of contact states on the sensing surface, as described above with reference to FIG. 3. The map can be used to track when and where contact and release events take place, and to estimate event type and coordinates. Block 608 estimates event positions to generate position data 612. Block 610 detects poses to generate hand and stylus pose data 614. As shown in FIG. 5, different types of contacts can have different characteristic signal profiles (examples shown are not indicative of actual material data) and the received signal's characteristics can be used to detect, for example, inadvertent palm contact while sketching with a stylus. In one or more embodiments, different object types can be detected based on the contact profiles of the objects without a special pickup design. These profiles can be expressed either in terms of example waveforms, or in terms of algorithmic approaches that capture distinctive features of the waveform.

The TriboTouch system can use one instance of the above-mentioned hardware for each touch position, or it can use a continuous larger electrode, and estimate the position based on the distance-dependent change in signal through the electrode. The change can be caused by material properties of the covering material, resistance of the electrode body, reactive impedance of the electrode, or any other method. TriboTouch can therefore distinguish position at a resolution higher than that of its electrode structure. In one or more embodiments, when an instance of the hardware is used for each touch position, the hardware instances operate in parallel, so that each electrode is handled individually. The parallel arrangement allows faster read speeds, but increases hardware complexity. Alternatively, scanning through each electrode in sequence offers different tradeoffs, because the digitization system should be faster (and thus consume more power), but the overall system is more compact (which can reduce the power consumption).

TriboTouch can be configured for single or multiple touch points, and additionally can be configured for either continuous position sensing (such as a phone or tablet), or discrete position sensing (such as a button). That is, position and motion can be sensed, as in a touchscreen, or discrete switches can be used. In one example, a 4-contact resistive-pickup system can be used. Alternatively, a row-column system that detects 2 simultaneous contacts can be used. As another alternative, pickups can be added to a resistive system. In another example, an array of pickups can be used to detect 5 contacts. The specific pickup configuration is a design option for the pickups and electronics. In the discrete position sensing applications, the strengths of the system remain in force, and make the system practical to use in many scenarios where environmental noise or contamination may be an issue, such as in automotive or marine uses, in factory floors, etc. In such cases, TriboTouch can provide the benefit of robust input without the need for additional precautions necessary for traditional capacitive sensing.

Figure 7:
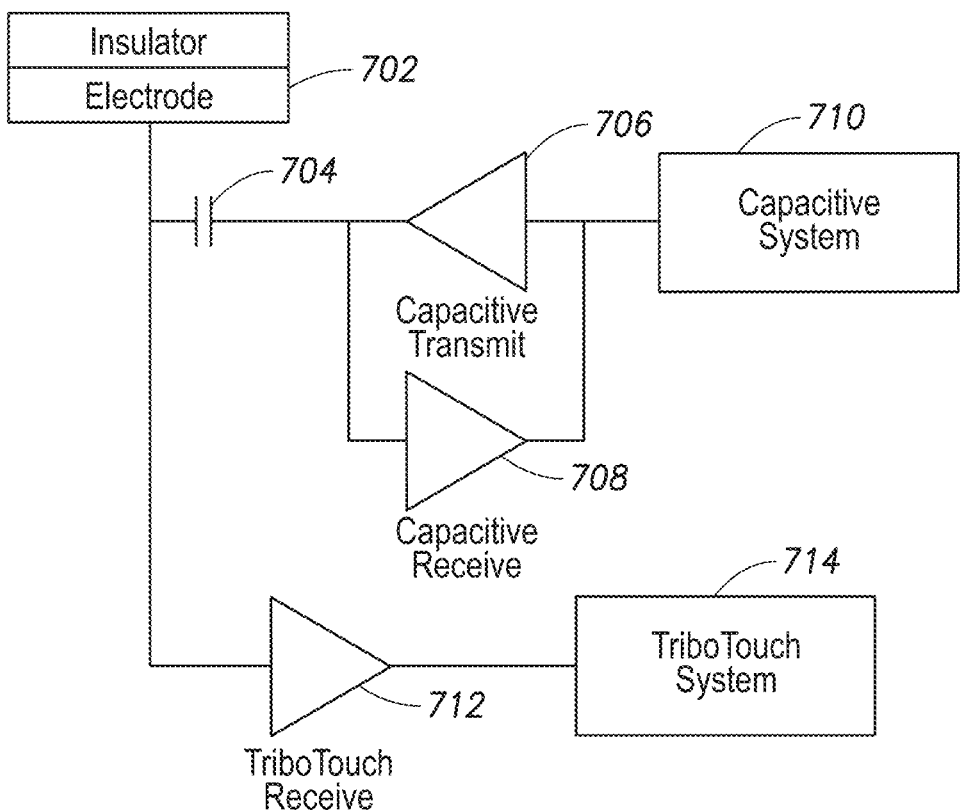
FIG. 7 illustrates an example of combining the capabilities of capacitive sensing and TriboTouch.

FIG. 7 illustrates an example of combining the capabilities of capacitive sensing and TriboTouch (e.g. direct sensing of contact with conductive and non-conductive objects). Because both strategies use sensitive measurements of charge displacement, it is possible to combine them using essentially the same analog front end hardware. FIG. 7 illustrates the basic principle whereby an electrode 702 can be shared between these two sensing methods. Capacitive sensing works by transmitting a balanced AC signal at high frequencies (typically >125 kHz) using a transmitter 706 into an electrode, and measuring either the transmit loading or the signal received at other electrodes. The capacitive measurement can be performed by a capacitive receiver 708. TriboTouch, however, works by measuring the local charge displacement using a receiver 712 at low frequencies (ordinarily <1 kHz). By capacitively decoupling the electrode 702 from the capacitive sensing circuit 708 using a capacitor 704, the triboelectric charge displacement can be maintained and measured separately, either by time-multiplexing the two sensing modes or by filtering out the transmit signal at the TriboTouch analog front-end or in subsequent signal processing. When time-multiplexing, the capacitive system 710 suspends access to the electrode 702 while the TriboTouch system 714 measures, and vice versa. When filtering, the TriboTouch system 714 uses a filter and knowledge of the signal being sent by the capacitive system 710 to remove the effects of capacitive measurements during the noise rejection phase of processing. Further examples of combining other types of touch sensors, such as resistive, capacitive, and inductive sensors, are described below with reference to FIGS. 45-47.

Figure 8:
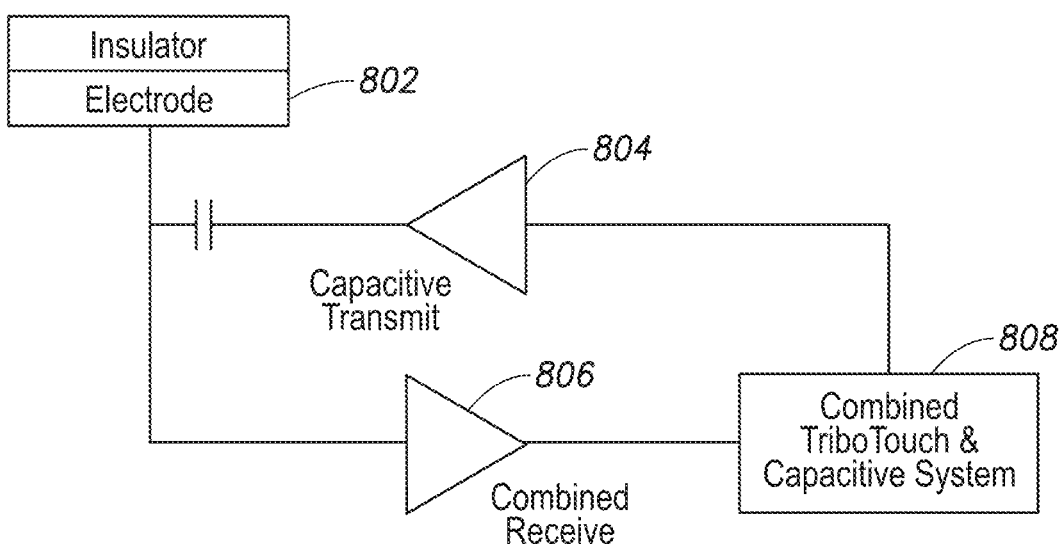
FIG. 8 illustrates an example of capacitively coupling a transmitter to an electrode while using the same receiver system for both capacitive and TriboTouch sensing.

FIG. 8 illustrates an example of capacitively coupling a transmitter 804 to an electrode 802 while using the same receiver system 806 for both capacitive and TriboTouch sensing. The capacitive software and the TriboTouch software can be combined into a single system 808. In this case, the capacitive software uses the same hardware as the TriboTouch software, taking turns to use the shared resources.

Figure 9:
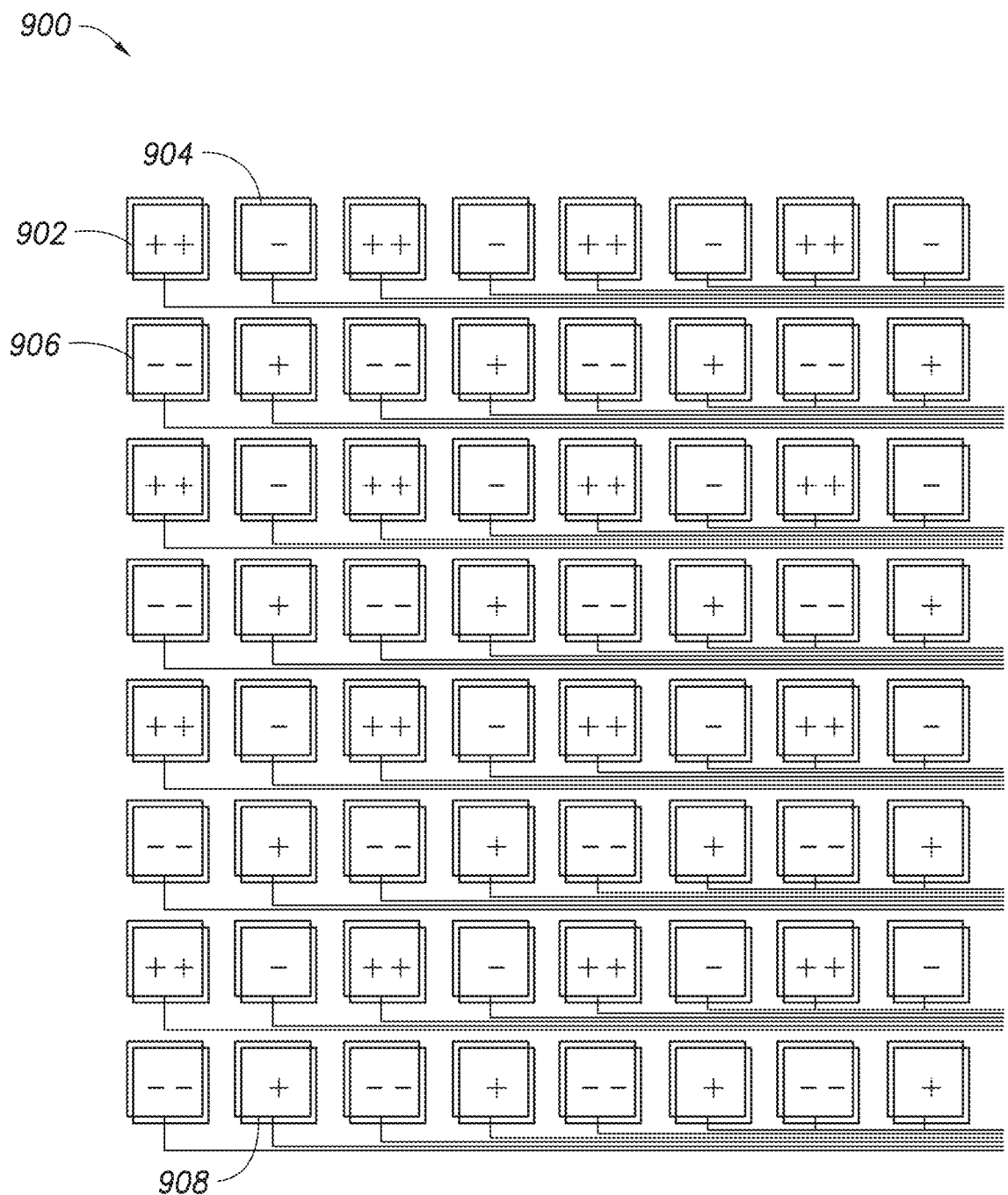
FIG. 9 illustrates a trioactive surface covered with an array of different materials.

FIG. 9 illustrates a trioactive surface covered with an array 900 of different materials. The embodiment shown in FIG. 9 makes it possible to distinguish between different contacting materials (e.g. skin, graphite, rubber, nylon, etc.) by patterning materials with different tribonegativity over sensing sites 902, 904, 906 on the TriboTouch surface. The principle is similar to that of a color CMOS image sensor, in which a color filter mask is superimposed over pixel sensors. In FIG. 9, the trioactive surface is covered with an array 900 of four different materials, ranging from strongly tribopositive (++) materials 902 to strongly tribonegative (--) materials 906. When an object interacts with a cluster of these sensors, a characteristic charge pattern is generated that allows determination of the object's material properties (i.e. tribospectroscopy). In one or more embodiments, the array can be laid over different electrodes. These electrodes can be clustered closely together, such that a small motion is sufficient to cross multiple electrodes. Differentiation between different material types can be performed fewer material types to speed up type detection.

FIGS. 10A-10C illustrate different positive and negative charge patterns generated when different objects make contact with the same patterned array 1008 of sensors. In FIG. 10A, contact with the finger 1002 generates negative charge patterns on the --, +, and - sensors, and a neutral charge pattern on the ++ sensor. Therefore, the finger 1002 is characterized by an overall strongly positive charge pattern. In FIG. 10B, contact with the pencil 1004 generates positive charge patterns on the + and ++ sensors, and negative charge patterns on the - and -- sensors. Therefore, the pencil 1004 is characterized by an overall neutral charge pattern. In FIG. 10C, contact with the eraser 1006 generates positive charge patterns on the +, -, and ++ sensors, and a neutral charge pattern on the -- sensor. The eraser 1006 is therefore characterized by a strongly positive charge pattern. These characteristic charge patterns can be used to identify an unknown object that makes contact with the sensor array 1008.

TriboTouch allows for detecting a single contact, dual touch (e.g., detect two fingers simultaneously making contact), multi-touch (e.g., detect three or more fingers simultaneously making contact), the order of touch (e.g., detect the order where index finger makes contact first and then middle finger), the state of the object/finger where the first object/finger is in a first state and the second object/finger is in a second state (for example, when rotating, the first finger can be stationary while the second finger rotates about the first finger), detect adjacent fingers versus non-adjacent fingers, detect thumb versus fingers, and detect input from prosthetic devices. TriboTouch also allows for detecting motion, and also detecting the position of the touch/motion.

When contact is detected, TriboTouch allows for determining the shape of the object making the contact, the type of materials of the object making the contact, activating controls based on the type of materials that are detected, activating modalities based on the shape and type of materials detected (e.g., brush vs. eraser), using contact shape to depict contact realistically, using contact shape to detect object to change modalities of application, and using contact shape to improve position accuracy.

The dual touch detection allows for detecting zoom gesture, panning gesture, and rhythmic gesture to create shortcuts or codes. In addition, multi-touch detection allows panning gestures to control application switching or multi-finger controls for games.

TriboTouch also allows the order of the touch to be detected so that, for example, rhythmic input can be used to create shortcuts or codes. Detecting adjacent fingers versus non-adjacent fingers can be used to detect input from chorded keyboard where multiple keys together form a letter. Detecting thumb versus fingers can be used to provide modified keyboard input mode, allow for chorded input, and allow imprint of fingers to be used as code. In addition, motion can be detected so that, for example, the following gestures can be detected: zoom in, zoom out, panning, dragging, scrolling, swipe, flick, slide, rotate clockwise, or rotate counterclockwise. The different types of contact, motion/gestures, and position described above can also be detected using NoiseTouch and TriboNoiseTouch.

In industrial settings, the noise-resistance and distinctive signal characteristics of TriboTouch (and NoiseTouch) allow operation is noisy, humid, or dirty environments. These conditions generally prohibit the use of capacitive sensors, and as a result the systems currently used are relatively primitive (though robust)—such as physical buttons, membrane switches, IR touchscreens, etc. TriboTouch techniques enable the same type of interfaces available to consumer users to be used in industrial settings, such as to easy-to-clean hard glass touch controls, and so on.

TriboTouch can be used to provide self-powered buttons, e.g., for transitioning from sleep mode to wakeup mode without capacitive sensing. When a contact takes place on a triboelectric control pickup, a small charge redistribution is triggered. As long as the electronics connected to the device are sufficiently low-power, this displacement current may be used to directly send a short message regarding the event. Alternatively, the device may collect power from static electricity produced during bulk motion, and later use that power to operate during relevant contact events. This may be coupled with a radio transmitter or similar device to allow for completely wireless and battery-less remote control of devices.

TriboTouch can provide indirect touch features, which can, for example, enable placing a paper on top of a touch screen and writing on the paper with a finger, stylus, brush, or the like. TriboTouch (and NoiseTouch) surfaces operate with an insulator between the electrode and the contacting object. However, the charge displacement effect can occur on any material. Therefore, the touch surface can be covered by an additional material such as a sheet of paper or cloth, and operation will not necessarily be impeded as a result. Since the contact of any two materials can produce a triboelectric effect, the makeup of the two materials making contact (while in contact with the touch surface), whether paper and pencil or brush and canvas, is not at an issue in contact detection.

Triboactive contact detection can be used to detect erasure, for example, by detecting the motion of an eraser on top of paper, thus mirroring the digital content to what is drawn on the paper itself. Attachments can also be made to the screen to speed up particular input. For example, for gaming applications, a soft passive joystick that makes contact with the screen when pressed in different directions can be used to provide the user with better haptic feedback. Similarly, a keyboard template may be used to provide physical passive keys that can be used to quickly trigger actions in applications such as drawings or 3D graphics, where switching between different modes and tools in rapid succession is common. Because triboactive contact sensing can sense contact from non-conductive materials, the choice of materials for the attachments is greatly increased, and conductive or electrically active components are not required. This allows a much broader class of input experiences at much lower cost, and use of a greater set of materials such as plastic, paper or wood for the attachments.

Gesture input can be provided using TriboTouch techniques. As discussed elsewhere herein, triboelectric charge displacement is analogous to the displacement of sand as a finger is run through it. A change in the angle of the finger (whether leaning left or right, angle of lean, and so on) can affect the way the sand is disturbed. Likewise, a change in the angle of the finger can affect the charge displacement. This change in displacement can be measured to estimate the pose of the hand, including angle, handedness, and the like.

Figure 11:
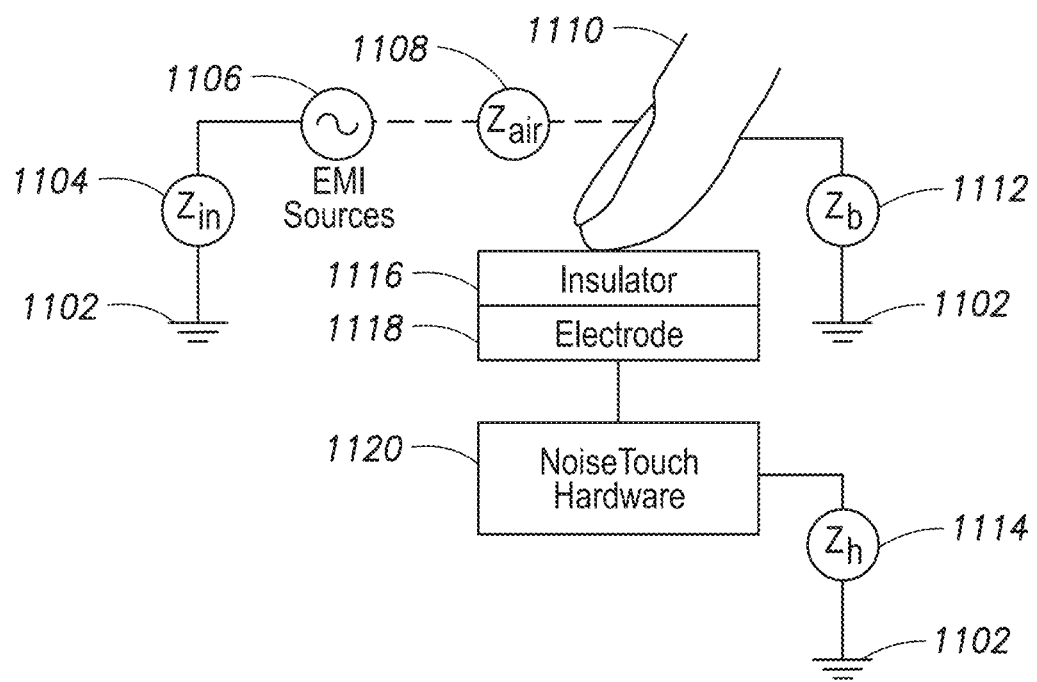
FIG. 11 illustrates an example configuration of a NoiseTouch system relative to a user and the environment.

FIG. 11 illustrates an example configuration of a NoiseTouch system relative to a user and the environment. A person can be surrounded by an electric field emitted by devices in the environment. This field is normally considered part of the electromagnetic interference (EMI) in the environment. This field is carried throughout the body, and can be coupled capacitively to electrodes in the device. Rather than attempting to reject this noise, a technique referred to herein as "NoiseTouch" uses the noise that is conducted by the body and picked up by the electrodes of the touch sensor to detect the position of the user's touch. Feature parity with capacitive sensors is maintained (hovering support, multitouch, etc.). NoiseTouch uses environmental noise and is thus immune to EMI, and does not need to emit an electric field to sense user interactions. NoiseTouch is scalable, i.e., can be applied to surfaces of any shape and size, responsive, and has reduced complexity.

Referring to FIG. 11, environmental EMI sources 1106 can be coupled to the ground 1102 via impedance $Z_{in}$ 1104, and to the human body 1110 via impedance $Z_{air}$ 1108. The body 1110 is also connected to ground 1102 via an impedance $Z_b$ 1112. The EMI 1106 is coupled to the electrode 1118 through an optional insulator 1116, and is then received by the NoiseTouch hardware 1120, which itself is coupled to ground 1102 via impedance $Z_h$ 1114. The differences between impedance values to ground of the different components in the system, and their exposure to EMI-induced electric field changes, result in a small potential difference sensed by the hardware 1120 from any source in the vicinity. In other words, when a large antenna, such as the human body 1110, is in proximity to the electrode 1118, the characteristic of the noise is different compared to when the human body 1110 is not in proximity. The NoiseTouch system 1120 can detect touch by sensing this change in the characteristics of the noise received by the electrode 1118.

Figure 12:
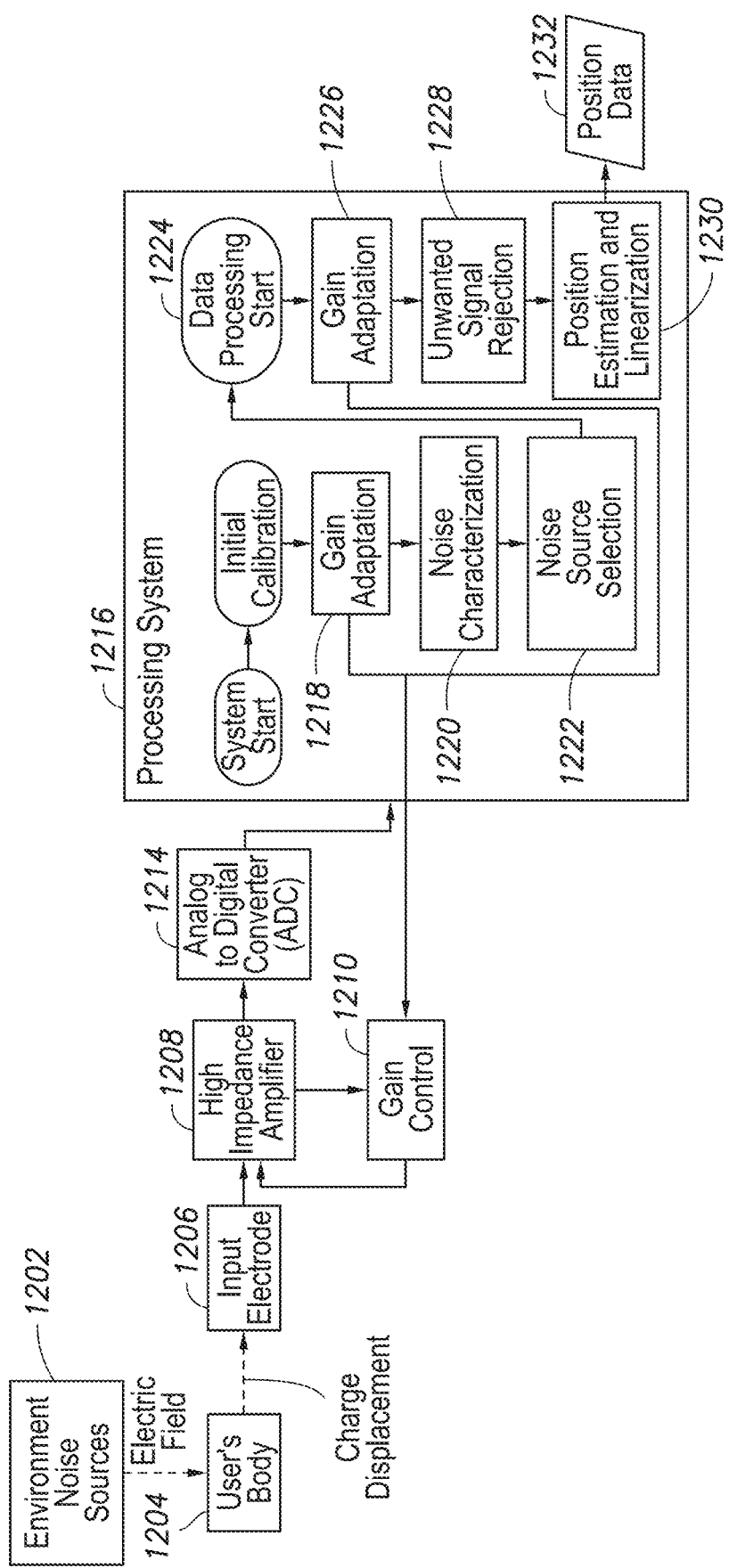
FIG. 12 illustrates an example NoiseTouch system architecture.

FIG. 12 illustrates an example NoiseTouch system architecture. Environmental noise (from power lines, appliances, mobile and computing devices, etc.) continuously emits electric fields that contribute to the environmental electromagnetic interference (EMI, i.e., electronic noise). The human body is a slight conductor, and thus acts as an antenna for these signals. When the body closely approaches the electrode, e.g., when the body is hovering over or touching a touch panel, this signal is capacitively coupled to an input electrode 1206. A high impedance amplifier 1208 amplifies the incoming signals, and a subsequent analog to digital converter (ADC) 1214 converts this signal to digital form.

In one or more embodiments, the processing system 1216 (e.g., processing software running on a computer system) has two functions. Initially, the processing system 1216 characterizes the noise at block 1220 and adapts the gain at block 1218 so that the signal does not overwhelm the amplifier 1208. The data processing system 1224 then continues gain adaptation at block 1226, while rejecting unwanted signals at block 1228 and estimating positions at block 1230. The gain adaptation information is fed back to a gain controller 1210, which can be a portion of the front-end hardware, to control the high-impedance amplifier 12078. The gain adaptation maintains the signal from the amplifier 1208 within the range of the ADC 1214.

The noise characterization system 1220 can be used to break the noise signal into bands and characterize the reliability of those bands based on how constantly they are available, and what variability they exhibit. Via this analysis, a profile of each band is created, which can then be used by the noise source selection system 1222 to select an appropriate band (or set of bands) for position estimation. The selection process can also decide to change the selection on a time-varying basis and the user location and the noise environment around the user changes. For example, when the user sits down in front of a TV, a particular band may be particularly fruitful. When leaving the home, this band may no longer be as useful as that band (or set of bands) that are produced by the car.

During operation, gain adaptation as described previously continues to occur as necessary to keep the signal within range of the hardware. Using the characterization data, block 1228 removes the unwanted bands of noise, and feeds the data to block 1230, which uses the signals to estimate where and how the user is approaching the surface. Block 1230 also carries our linearization, such that the position of the user is expressed as uniform values with relation to the edges of the surface. When used with an array of pickups, linearization in TriboTouch is essentially de-noising of the position data generated by the array. Because the positions are detected at each sensor, the position data is cleaned up and fit to a smoother motion. When used with the electrode pickup systems described herein (see, e.g., FIGS. 32-47, the linearization system mathematically maps the positions from the continuous range of values produced by the system to the Cartesian coordinates of the touch surface. In one or more embodiments, the process can be based on an individual mapping of touch positions to Cartesian coordinates.

In FIG. 12, noise from the environment can be picked up by the user's body. This noise is capacitively coupled by the electric field of the body to the input electrode 1206. The signal from the electrode is then digitized. The digitization can be done by a number of methods, including the high-gain amplifier 1208 followed by the ADC 1214, as shown in FIG. 12. The signal can also be converted by other techniques, such as instrumentation amplifiers, sigma-delta converters, charge counters, current metering approaches, and so on. The gain of the high impedance amplifier 1208 can be optionally controlled by the gain adaptation component 1218 of the processing system 1216, though the high impedance amplifier 1208 and ADC 1214 can alternatively have sufficient resolution such that gain control is not necessary. Following digitization, the data is fed to the processing system 1216, which can be implemented in hardware or software. An initial calibration is performed to set the gain if needed. Block 1220 characterizes the noise into frequency bands. The system can also determine the periodicity of various noise bands. This determination allows for the selection of a reliable band (or bands) at block 1222, based on continuous availability and signal strength. That information can be used to reject unwanted signals at block 1228. Block 1230 performs position estimation. During the course of processing, the signal characteristics may change. In case of such a change, the system can trigger additional gain adaptation 1226 or noise characterization 1220 to provide uninterrupted operations. Depending on the electrode structure, linearization can be performed at block 1230 to compensate for the nonlinear nature of a continuous sheet electrode, or a position can be estimated directly from the centroid of the activation seen in a row-column or matrix electrode array. Block 1230 then produces the resulting position data 1232.

In one or more embodiments, the NoiseTouch system does not include facilities for transmission of signals. Signal transmission facilities can be omitted because NoiseTouch senses environmental signals, and does not need to transmit signals in order to sense environmental signals. Since the receiving hardware is designed to accept EMI, it is resistant to interference from EMI sources. In addition, the system does not emit spurious signals as a result of its activities outside of what may be normally expected from any electronic circuit, simplifying compliance with EMI regulations and design of noise-sensitive electronics positioned nearby. An additional benefit is the power savings from this design. On one hand, there is direct savings from not having to transmit a field. Additionally, the system benefits from a simplified architecture, which means there is simply less electronics to power to begin with. Additionally, since there is no need to carry out extensive noise rejection in hardware, there is additional savings from the reduction of complexity on that front as well.

Figure 13:
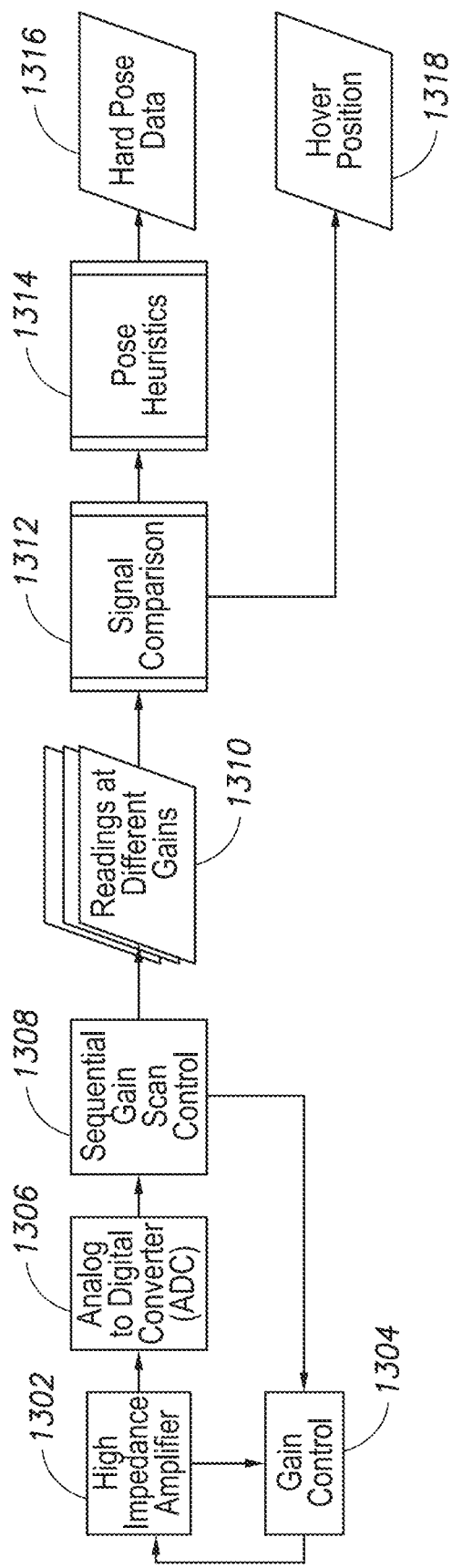
FIG. 13 illustrates an example process that determines hand poses or positions.

FIG. 13 illustrates an example process that determines hand poses or positions. The EMI conducted by the body is coupled capacitively to the electrode via the electric field surrounding the body. As an example, the process can determine when the user is holding or touching the screen from the left or right side, which is pose information. An ADC 1306 converts the analog input signal from the amplifier 1302 to a digital signal. By appropriately adjusting the gain of the system at blocks 1308 ad 1304, NoiseTouch can detect approach of a body part at a distance. As such, it is possible to distinguish when the user is hovering over the touch surface without making physical contact. Additionally, because of the speed afforded by the NoiseTouch system, the electrodes can be continuously scanned at multiple gain settings at block 1310, allowing for simultaneous detection of hover and touch. Multiple gain setting scanning may be used, for example, to allow for palm or inadvertent contact rejection, detection of holding pose (one-handed vs. two-handed, left vs. right handed, etc.), and the like. Block 1312 compares the signals read at different gains. Bock 1314 uses pose heuristics to determine pose data, such as the pose of a hand Block 1318 uses the results of the signal comparison 1312 to determine hover position.

The multi-gain surface scanning can detect the pose of the hand as the user holds a device that contains a NoiseTouch sensor. Multi-gain scanning provides different sensing depths, with resolution decreasing with the increase of the gain. At high gain, it can sense more distance objects, but does not determine position as exactly as when low gain is used. For example, multi-gain scanning can enable the system to distinguish right-handed pen input from left-handed pen input by locating the position of the hovering hand relative to the contact position. The location can be determined using a higher gain surface scanning setting to sense the approximate position of the hand that is making contact. Multi-gain scanning can also help to sense whether one or two hands are hovering, which from the sensing perspective will produce, respectively, one or two sensed "blobs" at medium gain, or a small or large "blob" at high gain. Since the sensing field at high gains extends out from the device to some distance, it is also possible to detect how a device with a NoiseTouch screen is being held relative to the location of the screen.

In one or more embodiments, gestures that are part of "touch" (e.g., multi-gain hover and the like) can be separated from how the machine can react to the presence of hover. For example, if a user is holding the phone in their right hand, the keyboard can automatically shift its touch points to the left so that the user can type more easily. Also, controls can appear on a tablet closer to the hand holding the tablet (or, alternatively, on the other side of the table, so that touching the tablet with the free hand is easier). In one aspect, hover can be a contextual cue for the software.

Figure 14:
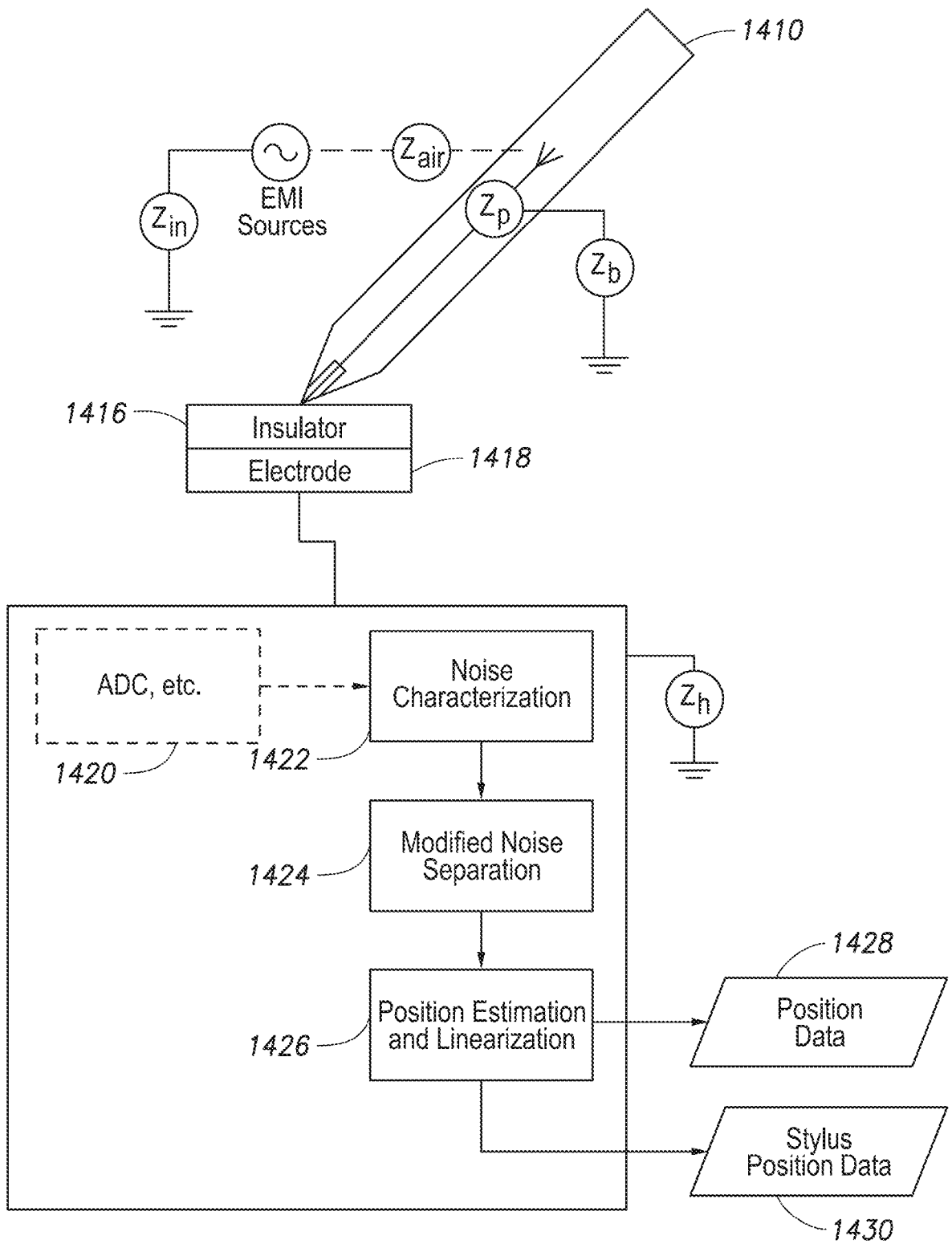
FIG. 14 illustrates an example method of separating touch and stylus data.

FIG. 14 illustrates an example method of separating touch and stylus data. Similar to the NoiseTouch techniques described above in FIG. 12, an input signal can received by an ADC 1420 and characterized by a noise characterization block 1422. Noise separation is performed by a modified noise separation block 1424, and position data 1428 is determined by a position estimation and linearization block 1426. While the description above focuses on the appendages of a user, it should be noted that NoiseTouch can function equally well with conductive or partially-conductive objects. As such, it is possible to fashion styli, pens, or other devices 1410 that can be detected by NoiseTouch. In such cases, the design of the stylus 1410 can include passive reactive elements, such as inductors or capacitors (or a combination of passive elements), which imprint the noise signal with a specific signature that is detectable by the position estimation 1426 and noise characterization 1422 blocks. Detecting the specific signature enables NoiseTouch to discern between the presence of a stylus 1410 and a finger. Therefore, separate finger position data 1428 and stylus position data 1430 can be generated by the position estimation and linearization block 1426.

Figure 15:
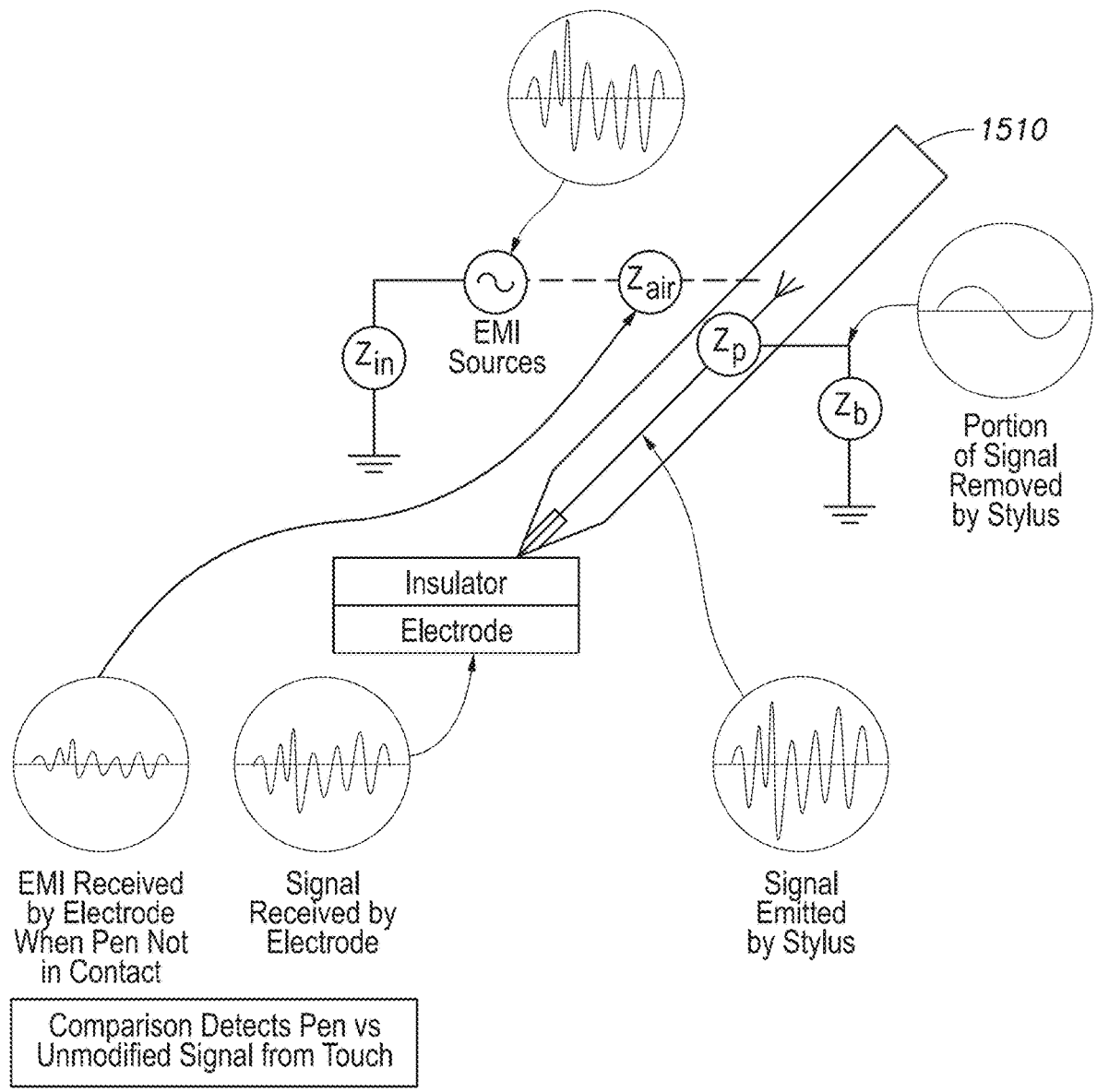
FIG. 15 illustrates detection of the signal modification characterizing the modification of ambient noise by the contact by a stylus or pen.

FIG. 15 illustrates detection of the signal modification characterizing the modification of ambient noise by the contact by a stylus or pen 1510. FIG. 15 illustrates example signals at different points of the analog front-end portion of the system shown in FIG. 14. The EMI sources emit an EMI signal. The stylus 1510 emits a signal, and another signal is received by the electrode 1418. The signal received by the electrode 1418 is different from the EMI received by the electrode at $Z_{air}$ when the stylus is not in contact with the insulator 1416.

An alternative implementation of the device may produce a certain amount of controlled generalized EMI from the device which is then used to detect position in areas where sufficient environmental EMI may not be available. This capability may be automatically switched on by the automated gain control systems once the levels of environmental EMI drops below a pre-programmed or dynamically selected threshold. The NoiseTouch system may be tuned to specifically use the regulatorily-allowed EMI emissions of the device exclusively, thus rejecting other sources of noise. This increases the robustness of the device since the EMI profile need not be dynamically characterized.

The NoiseTouch system may use one instance of the above-mentioned hardware for each touch position, or it may use a continuous larger electrode and estimate the position based on the distance-dependent change in signal through the electrode. The change may be caused by material properties of the covering material, resistance of the electrode body, reactive impedance of the electrode, or any other method. In this way, NoiseTouch can distinguish position at a higher resolution than the resolution of its electrode structure.

NoiseTouch can be configured for single or multiple touch points, and additionally can be configured for either continuous position sensing (such as a phone or tablet), or discrete position sensing (such as a button). In the latter application, the strengths of the system remain in force, and make the system practical to use in many scenarios where environmental noise or contamination may be an issue, such as in automotive or marine uses, in factory floors, etc. In such cases, NoiseTouch can provide the benefit of a robust input solution without the need for additional precautions necessary for traditional capacitive sensing.

Figure 16:
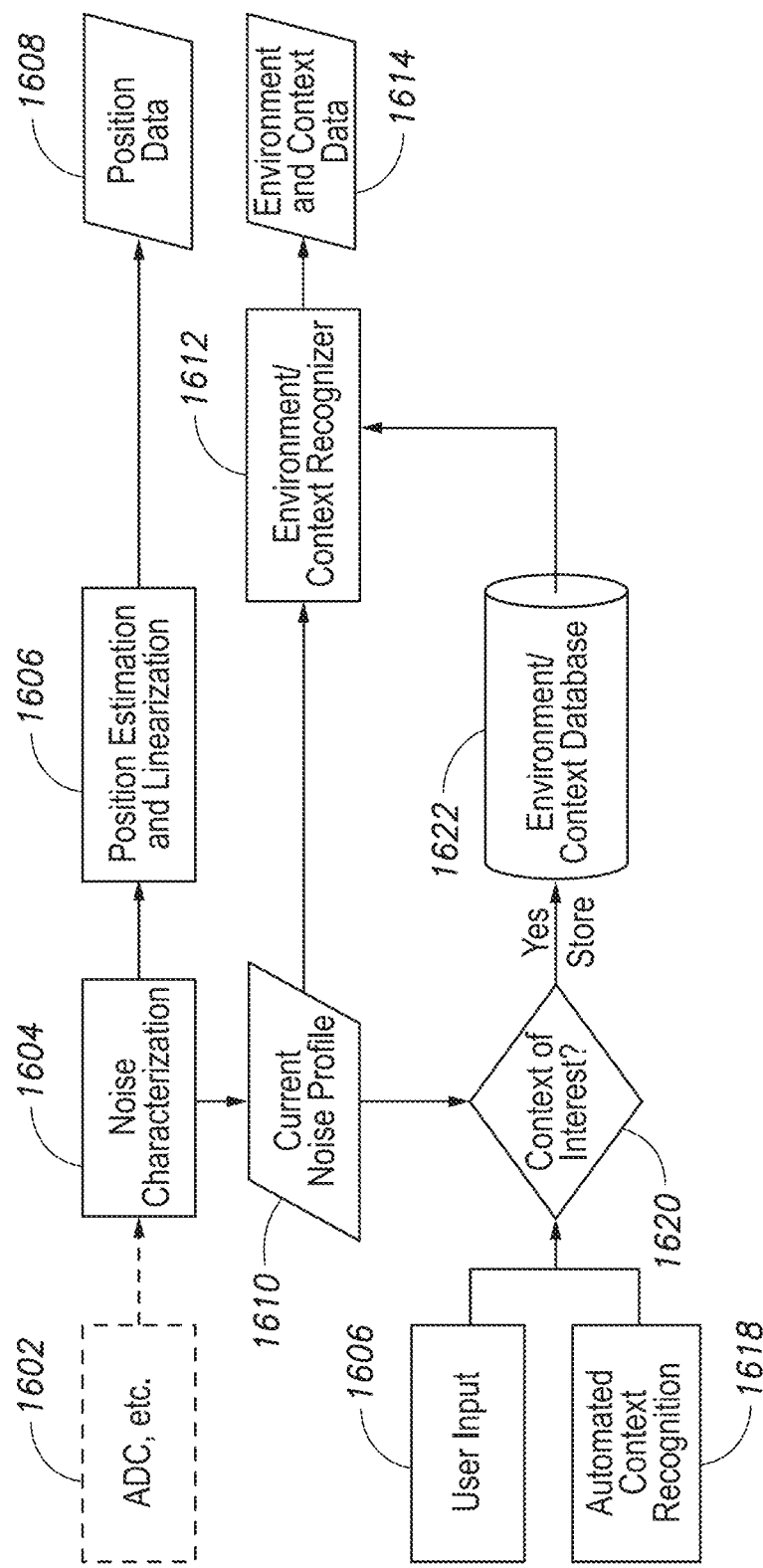
FIG. 16 illustrates an example process of passively sensing the environment and context of a user.

FIG. 16 illustrates an example process of passively sensing the environment and context of a user. NoiseTouch can continuously sense and characterize the environmental EMI, and this capability can be used to passively sense the environment and context of the user. For example, at home the user may surrounded by EMI from the TV, mobile phone, and refrigerator, while at office the user may be surrounded by the EMI from the desktop computer, office lighting, and office phone system. When the user makes contact with the NoiseTouch system, e.g., to awaken or unlock their device, the NoiseTouch system can capture this characteristic data and compare it to an internal database of noise and environments, using relevant similarities to deduce the user's location.

In the process of FIG. 16, an input signal is fed from a signal acquisition system 1602 to a Noise Characterization module 1604. Block 1604 performs noise characterization to determine a current noise profile 1610. Block 1604 breaks the signal down into bands (e.g., using FFT or the like), and analyzes both the magnitudes of signals in different signal bands, as well as the time-domain change in those magnitudes. The signals to be used for positioning are fed to block 1606. Block 1616 performs estimation and linearization to generate position data 1608, as described elsewhere herein. From user input 1606, as well as automatic sensing 1618, such as GPS, WiFi positioning, etc., block 1620 determines whether the device is in an environment of interest. If so, the current noise profile is stored in the Environment and Context Database 1622. The current profile and the entries in the Database are used by the Environment and Context recognizer 1612 to detect when the environment or context is encountered again, and when recognized again, events are generated accordingly.

Figure 17:
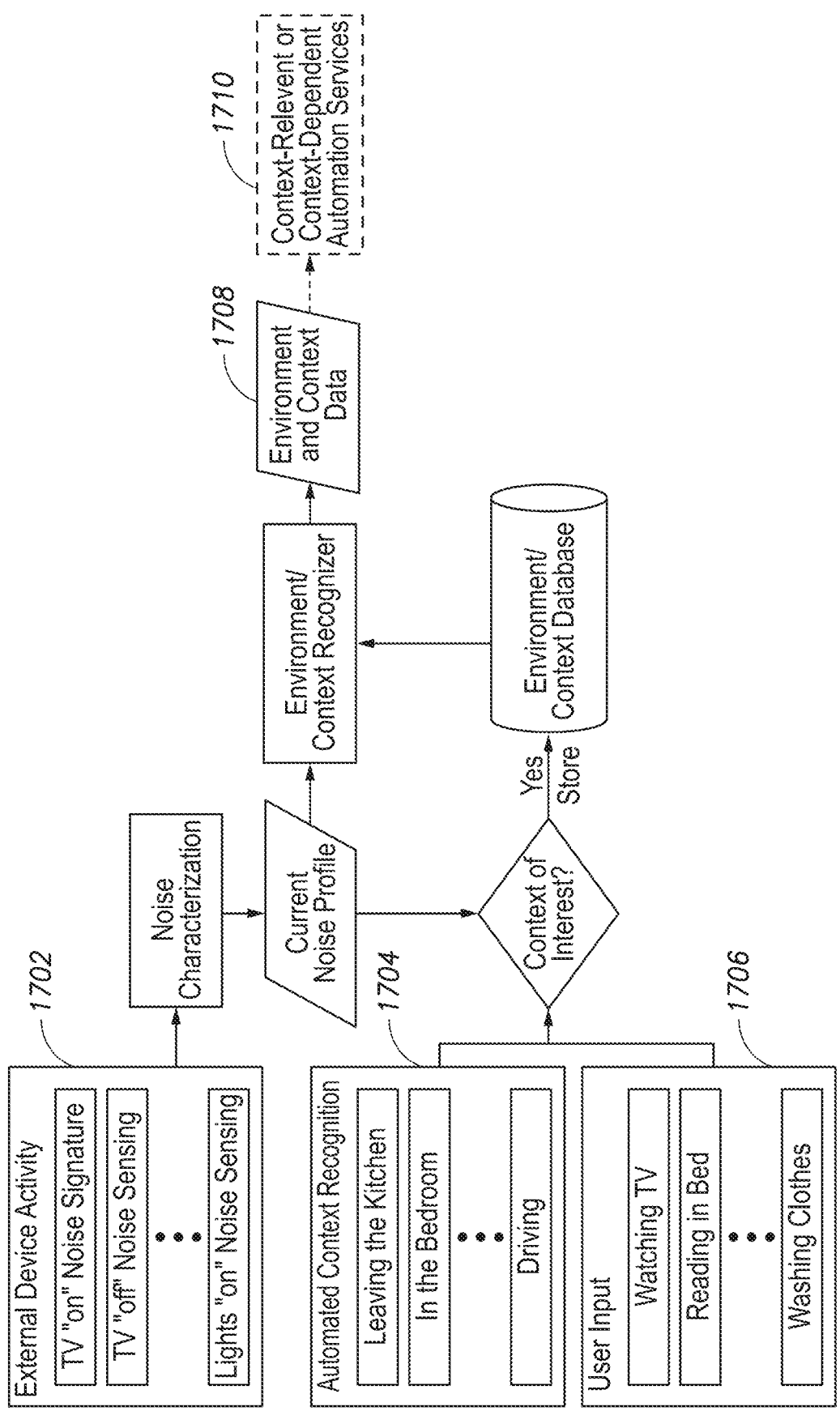
FIG. 17 illustrates examples of noise contexts that can be passively sensed.

FIG. 17 illustrates examples of noise contexts that can be passively sensed. Different rooms in a house or office can have different noise contexts. For example, a break room may include EMI from the coffee machine, while a meeting room may include EMI from a large TV or projector, as shown in FIG. 17. The device can then use the context estimates to make certain functionality easily accessible. For example, the device can automatically print queued documents from the user when the user approaches the printer, or allow control of the projector when the user is in the same room. The user may additionally configure capabilities on a per-area or per-context basis to help streamline tasks. The noise characterization can be performed based on external device activity 1702, such as whether a TV or lights are on or off. The context of interest can be based on automated context recognition 1704 or user input 1706. The automatic context recognition 1704 can determine that the context is "leaving the kitchen", "in the bedroom", or "driving", for example. The user input can be "watching TV", "reading in bed", or "washing clothes", for example. Based on these factors, the environment and context data 1708 is generated. and used as input for context-relevant or context-dependent automation services 1710.

Figure 18:
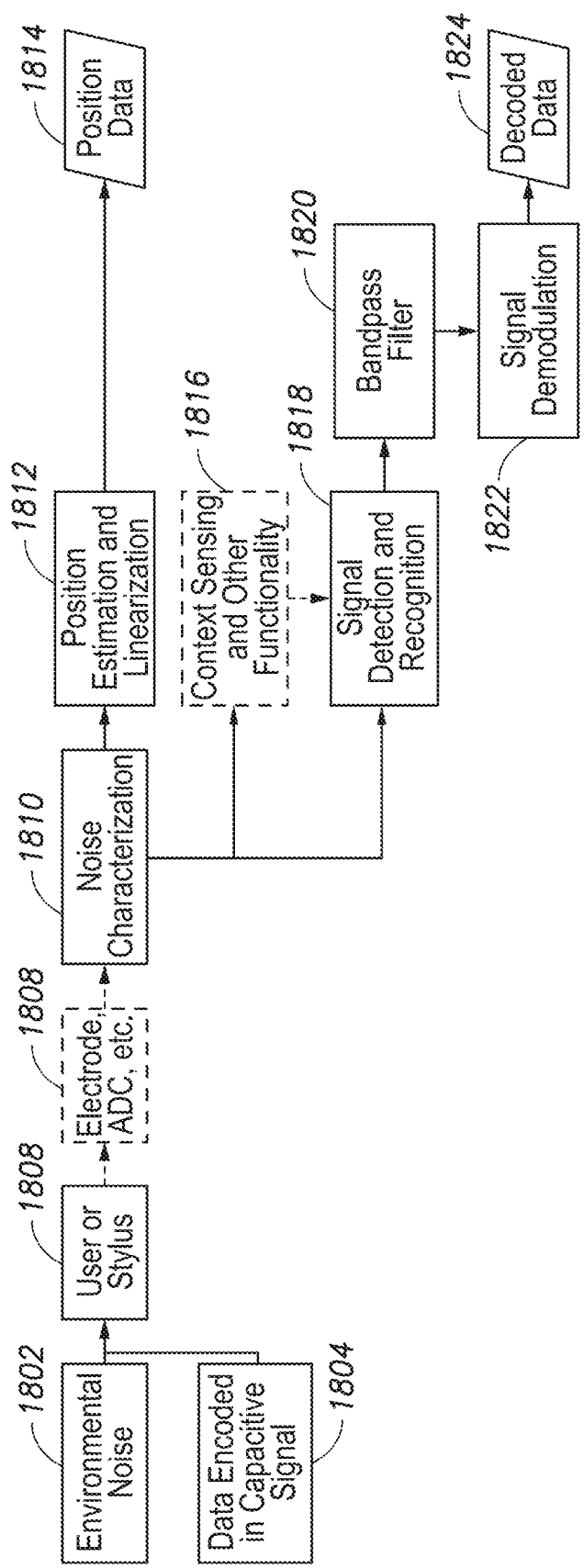
FIG. 18 illustrates an example process of using the context sensing system to communicate with a device having a NoiseTouch sensor.

FIG. 18 illustrates an example process of using the context sensing system to communicate with a device having a NoiseTouch sensor. A device wishing to communicate may emit a capacitive signal 1804 by applying a voltage to a conductive surface, including the metal frame or shielding of the device itself. This signal 1804 is combined into the environmental EMI field 1802 and received by NoiseTouch. The signal can be encoded by a user or stylus at block 1808, and received by an electrode and ADC at block 1808. Noise characterization can be performed at block 1810, and position estimation and linearization can be performed at block 1812 to generate position data 1814. A signal detection system 1818 can be used to search for such signals, possibly with additional information 1816 about the context which allows a narrowing of search parameters. Thereafter, the noise signal is filtered at block 1820 to only include the bands where transmission is taking place, and the signal is demodulated at block 1822 to receive 1824 data. Such data may be used to uniquely identify a device (for example, to allow immediate and direct control of a nearby appliance), or to send contextual data (such as the time remaining for an oven to heat up, or that a refrigerator door has been left open). Such communication may be made bidirectional, such that a device which does not include the position-sending capability may nonetheless include a NoiseTouch electrode for the purposes of receiving context and incoming data. Therefore a non-touch-enabled device (such as a microwave) may receive NoiseTouch-based communication from a nearby device for the purposes of control or query of functionality.

Example scenarios in which environmental sensing can be used include changing a phone's home screen depending on sensed context, changing a phone's home screen depending on sensed context, sending user location to external devices using context sensed by the phone, targeted sensing of activity of external devices, and monitoring energy consumption. The sensor system may be located on a device such as a watch or Fitbit-type device that is word by the user. The sensor system can also be on a laptop or a TV. For example, when a user enters a house, the phone detects the noise signature of the house and provide a set of applications on the home screen that are dedicated to home control, e.g. Alarm control, TV, Audio system, etc. A phone's home screen can be changed depending on sensed context. Upon the user entering the house, the phone detects the noise signature of home and provides a set of applications on the home screen that are dedicated to home control, e.g. Alarm control, TV, Audio system, etc. For example, a tablet or smartphone can display up a home screen page that contains music applications when a headphone is plugged in. Likewise, when the user is at home, the controls for various appliances, lighting systems, TV and other electronics, home HVAC controls, etc., can be brought up on a special page of the interface that makes access much more convenient. In another example, the home can be enabled to provide application dedicated to the control of devices in each room, privileging TV controls when in the living room, and timer when in the kitchen for example. When a user moves from room to room in the house, the home screen can be changed depending on the sensed environmental context. This technique can be applied on a per-room basis. For example, the user may customize a page that displays business-related applications such as email and business document management software when the user is in the study, the TV remote and current TV schedule in the living room, and the baby monitor, security system, and AC controls in the bedroom. These may associations can be designed to be customized and managed by the user.

A user's location can be sent to external devices using context sensed by the phone. For example, the phone detects the current room the user is in, and sends the information to the devices in the current room. Lights can be turned on when the user carrying his phone enters a given room, and turns off when leaving it; A preset profile, e.g. certain music and lighting conditions can be started automatically when the user enters the living room; Alarm could be de-activated when entering the house, and so on. For example, the system may notify the TV when it detects the user has moved away. At that point, the TV may turn off a power-consuming display panel, but leave the sound on, saving energy. The air conditioning may go into a power-saving mode likewise when the user is away, and quickly cool a room when the user enters. The user may configure the devices to act in a particular way based on his or her presence or absence from the vicinity. In one or more embodiments, If the TV is on, the phone may look up favorite programs the user selected previously, and tell the user that a particular channel is showing his favorite show.

Noise detection can also be used to target activity sensing of specific external devices, such as TV, lights, audio system etc. For example, a phone can detect that lights are left on when in the hallway before leaving a place, and notify the user. As another example, a phone can detect that a television s switched on and can provide recommendations, and the like. To perform energy consumption monitoring, noise detection can sense the overall noise level of a home to monitor the activity of electronic devices and give a sense of global energy consumption. Using signal processing on the global noise level, energy monitoring can also be targeted and device-specific. All electronics, when active, can produce more EMI than when off By sensing the overall changes in bulk EMI, the system may determine when the user is generally using more or less energy, and provide overall feedback without necessarily detecting particular devices or knowing anything particular about those devices. Therefore, when the user is in a room, the sensing system can detect if the lights are or not. When the user moves to a different area as noted by the system based on a change in the EMI environment, the system can notify the user that they left the lights on. This may be additionally gated by particular locations, such that it only applies to home, office, or otherwise. Note that on one or more embodiments this technique requires no special instrumentation of the lights or other infrastructure, and thus can be easily used with legacy unaugmented locations.

In addition, NoiseTouch and hover can be used to detect a single air touch/tap, dual air touch/tap, multi-finger air touch/tap, adjacent fingers hovering, or hovering thumb versus fingers. Furthermore, motion using hover can be detected such as, for example, zoom in, zoom out, panning, dragging, scrolling, swipe, flick, slide, rotation clockwise, or rotation counterclockwise. In addition, portions of content under the hovering object can be magnified or previewed. Also, objects can be recognized by detecting the conductive parts of the object. Furthermore, when holding insulating objects, NoiseTouch allows for detecting the tool angle, and the position of the hand relative to the object.

Figure 19:
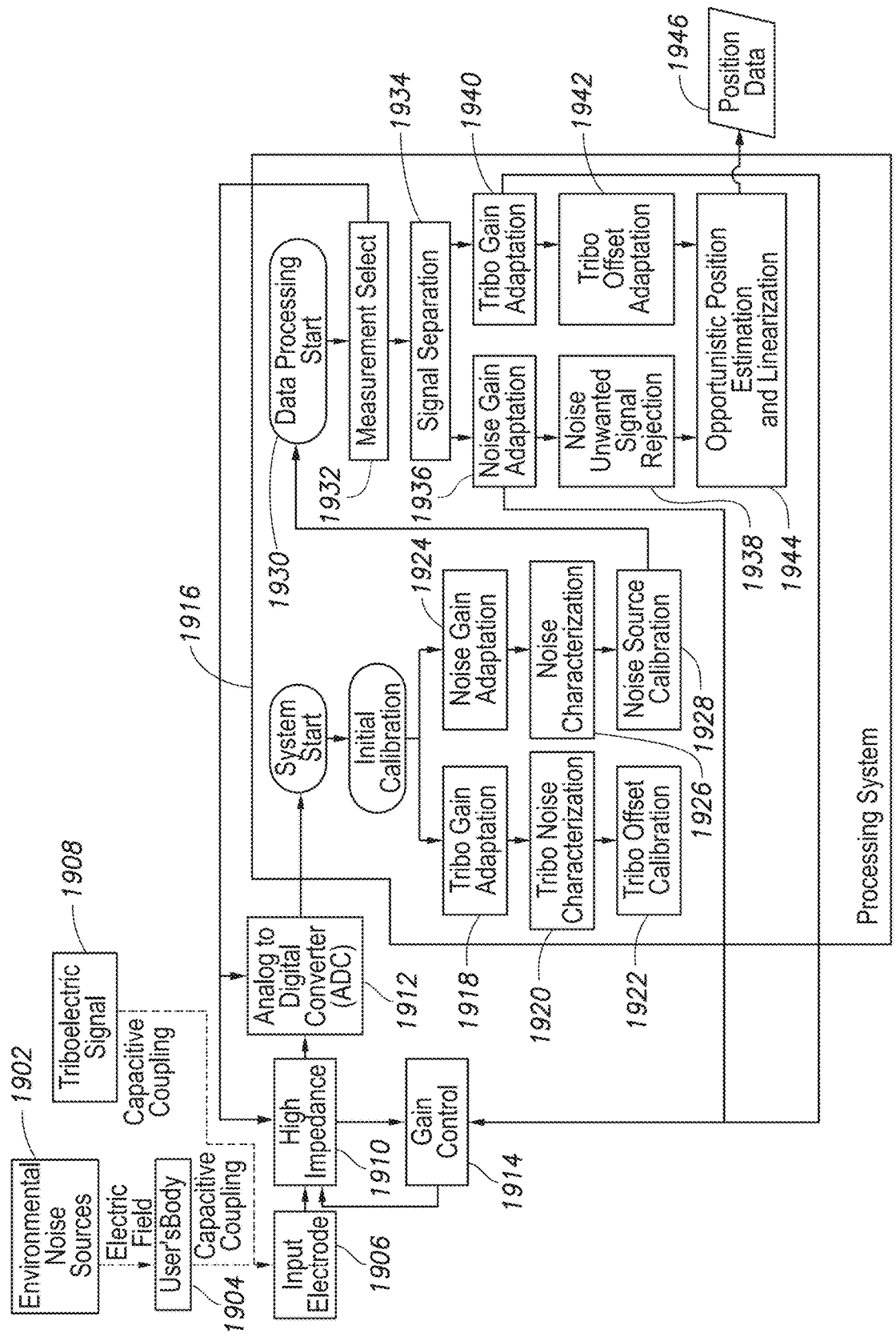
FIG. 19 illustrates an example architecture of a Tribo-NoiseTouch system.

FIG. 19 illustrates an example architecture of a TriboNoiseTouch system. In one or more embodiments, the TriboNoiseTouch techniques disclosed herein are based on a combination of the TriboTouch and NoiseTouch techniques. In one or more embodiments, NoiseTouch uses the noise that is conducted by the human body and picked up by the electrodes of the touch sensor to detect the position of the user's touch. In one or more embodiments, TriboTouch uses the charge displacement that occurs when two objects come in contact with each other. By measuring this displacement, TriboTouch can detect contact of the sensitive surface with any material. This is done using a sensing surface similar to capacitive sensors in use today and requires no physical displacement (as resistive screens do).

In one or more embodiments, TriboNoiseTouch combines the capabilities of TriboTouch and NoiseTouch using the same hardware, electrode geometry, and processing architecture. Therefore, the TriboNoiseTouch system has the capacitive touch features of NoiseTouch, and is also capable of sensing contact with a wide variety of materials using TriboTouch. TriboNoiseTouch opportunistically uses each methodology to offer improved capabilities, further improving the speed of contact detection over NoiseTouch, while providing non-contact and bulk contact (e.g., palm contact) sensing. TriboNoiseTouch uses environmental noise and surface interaction. TriboNoiseTouch can thus be immune to EMI, and need not emit an electric field. TriboNoiseTouch can sense the contact of non-conductive materials. Additionally, TriboNoiseTouch uses a combination of two physical phenomena to detect touch and provide robustness, speed, and differentiation of contacts by different materials (e.g., finger vs. stylus). The combination of NoiseTouch and TriboTouch technologies into a single panel can reduce complexity and provide savings in energy, and reduce hardware resource usage.

While the sources of signals for noise and trioactive measurement are different, the characteristics of the signals have similarities. Both signals are ordinarily coupled to the electrode capacitively via an electric field, and are therefore ordinarily amplified by a high-impedance amplifier. This allows the hardware for trioactive and noise-based position sensing to be economically combined into a single TriboNoiseTouch system. The TriboTouch and NoiseTouch techniques can be combined using time multiplexing or space multiplexing. For example, a full panel reading can be performed with TriboTouch, and then with NoiseTouch, or we some of the electrodes on a panel can be used for TriboTouch, and others for NoiseTouch, with optional switching of electrodes between TriboTouch and NoiseTouch for more continuous coverage.

Referring to the example TriboNoiseTouch system shown in FIG. 19, environmental noise sources 1902, such as power lines, appliances, mobile and computing devices, and the like, emit electric fields that contribute to the environmental electromagnetic interference (EMI, or colloquially, electronic noise). The human body 1904 is a slight conductor, and thus acts as an antenna for these signals. When the body 1904 closely approaches the electrode 1906, e.g., when the body 1904 is hovering over or touching a touch panel, this signal is capacitively coupled to the input electrode 1906. At the same time, the contact of the body or another object with the touch surface causes a triboelectric signal 1908 to be produced. Both signals are capacitively coupled to the electrode. A high-impedance amplifier or electrometer 1910 detects the incoming signals, and an analog to digital converter (ADC) 1912 subsequently converts this signal to digital form. These components may have additional switchable characteristics that aid in the separation of the two signals.

The signal is processed by a processing system 1916, which can be implemented as hardware, software, or a combination thereof. The processing system 1916 can include a calibration, which can be done at startup, and whenever internal heuristics determine that the signal is becoming intermittent or noisy. This is done, for example, by calculating mean and variance, and ensuring these values remain within a range. Deviations of the mean value may lead to gain adaptation, while excessive variance may cause the selection of a different noise band.

The processing system 1916 has two stages of execution. For the trioactive signal, the processing system 1916 characterizes the noise at block 1920 and adapts the gain at block 1918 so that the signal does not overwhelm the amplifier. This stage can be done separately for trioactive and noise signals, in which case the processing system 1916 characterizes the noise at block 1926 and adapts the gain at block 1924 for the noise signals. Additionally, offsets in the readings caused by charges adhered to the insulators or nearby objects can be offset for trioactive signals at block 1922. The initial conditions are calculated during the initialization phase. Noise source selection is performed at block 1928.

After initialization is complete, the data processing portion of the system begins at block 1930. Block 1932 selects the measurement to make, and block 1934 separates the signals by applying initial filters specific to the signals required. The characteristics of the filters are suited to the selection of noise signals, as well the means of interleaving the two types of measurements. For noise signals, the process continues gain adaptation at block 1936 and rejects unwanted signals at block 1938. For trioactive signals, the gain and offset are adapted to compensate for environmental drift at blocks 1940 and 1942, respectively. The gain adaptation information is fed back to gain control block 1914 to control the high-impedance amplifier 1910, so that the signal from the amplifier 1910 remains within the range of the ADC block 1912. The outputs of both signal paths feed into the opportunistic position estimation and linearization block 1944, which uses the most reliable and time-relevant features of both measures to calculate position estimates 1946.

Figure 20:
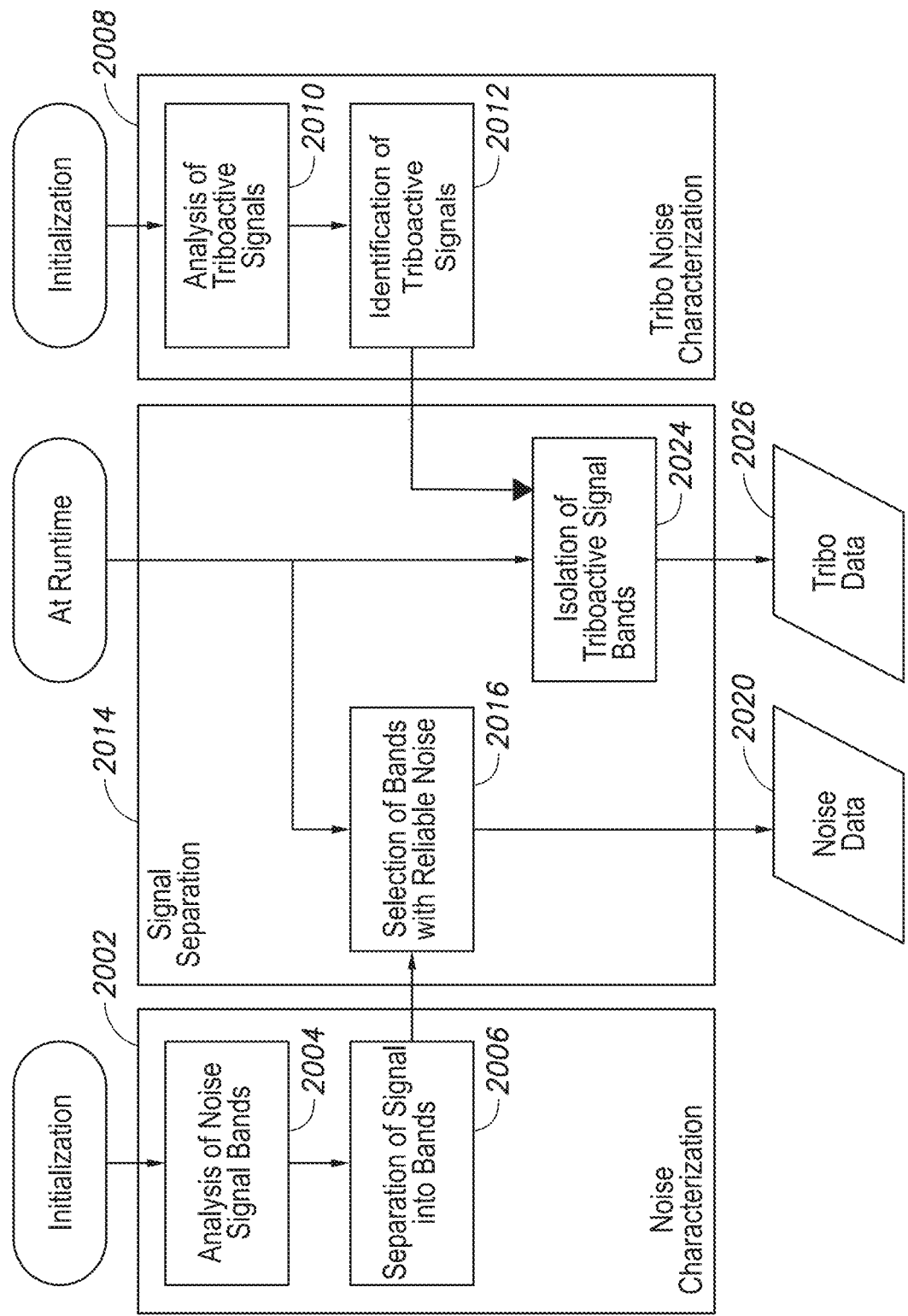
FIG. 20 illustrates an example method of separating triboactive data from noise data.

FIG. 20 illustrates an example method of separating trioactive data from noise data. As shown, during initialization a characteristic profile of noise and trioactive signals is created at blocks 2002 and 2008, respectively. At runtime, signal separation block 2014 characterizes the trioactive signal in time and frequency domains, indicating what signals come from trioactivity. The remaining signal is than analyzed by band and appropriate bands are selected for the noise analysis at block 2016.

The system starts with an initialization of the system where we determine (possibly offline) specific initial signal bands. Signal separation may operate in the time or frequency domain, and may be done by filtering specific frequency bands from the combined signal. At runtime, the signals are separated according to the initialization characteristics determined, and the data is separated into independent streams for processing. The band selection may be dynamically changed based on location, signal strengths, etc.

In one or more embodiments, the TriboNoiseTouch system does not include facilities for transmission of signals. Signal transmission facilities can be omitted because TriboNoiseTouch senses signals in the environment as well as to the contact itself, and does not need to transmit signals to sense environmental signals. Since the receiving hardware is designed to accept EMI, it is resistant to interference from EMI sources. In addition, the system does not emit spurious signals as a result of its activities outside of what may be normally expected from any electronic circuit, simplifying compliance with EMI regulations and design of noise-sensitive electronics positioned nearby. An additional benefit is the power savings from this design. For example, there can be direct savings from not having to transmit a field. The system benefits from a simplified architecture, which means there is simply less electronics to power to begin with. Additionally, since there is no need to carry out extensive noise rejection in hardware, there is additional savings from the reduction of hardware complexity.

Figure 21:
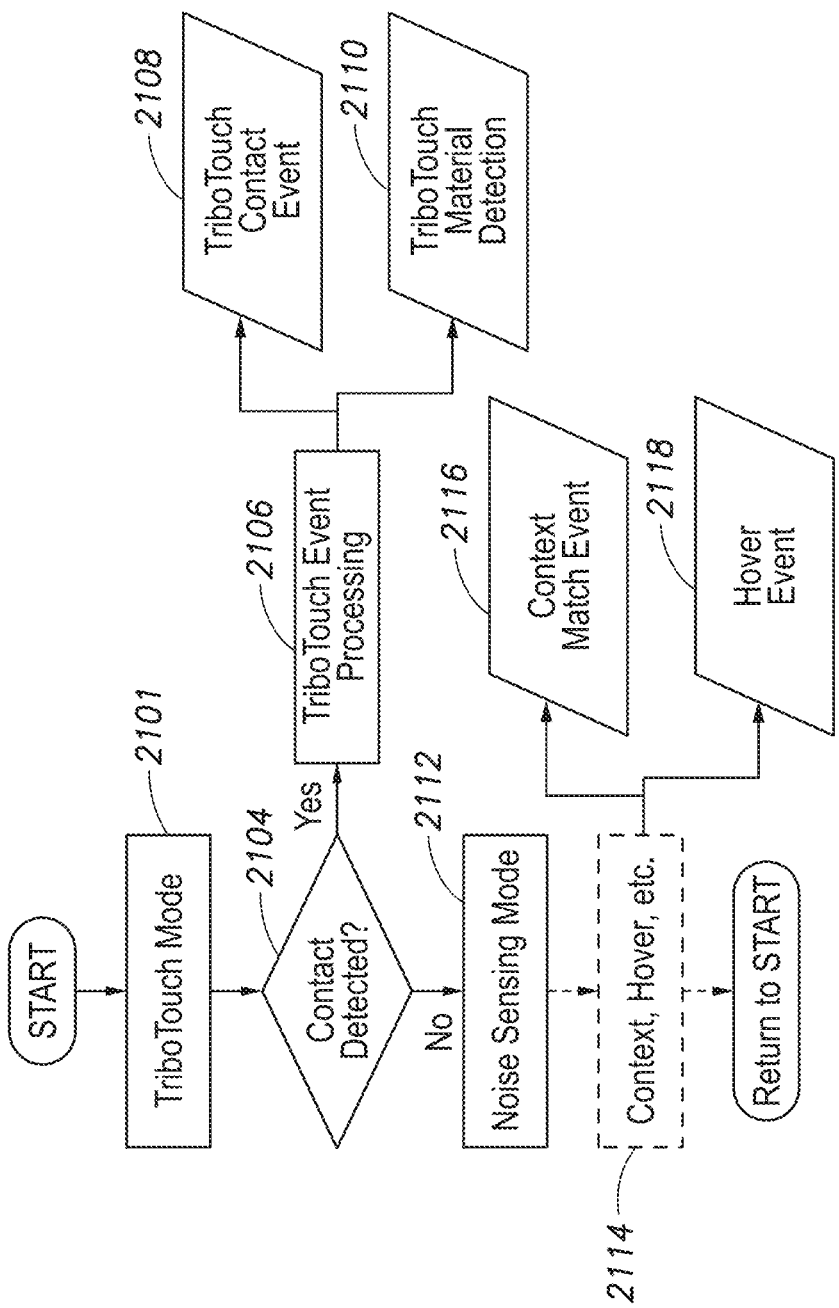
FIGS. 21-23 illustrate example TriboNoiseTouch processes for identifying triboelectricity-related events and noise-related events.
Figure 22:
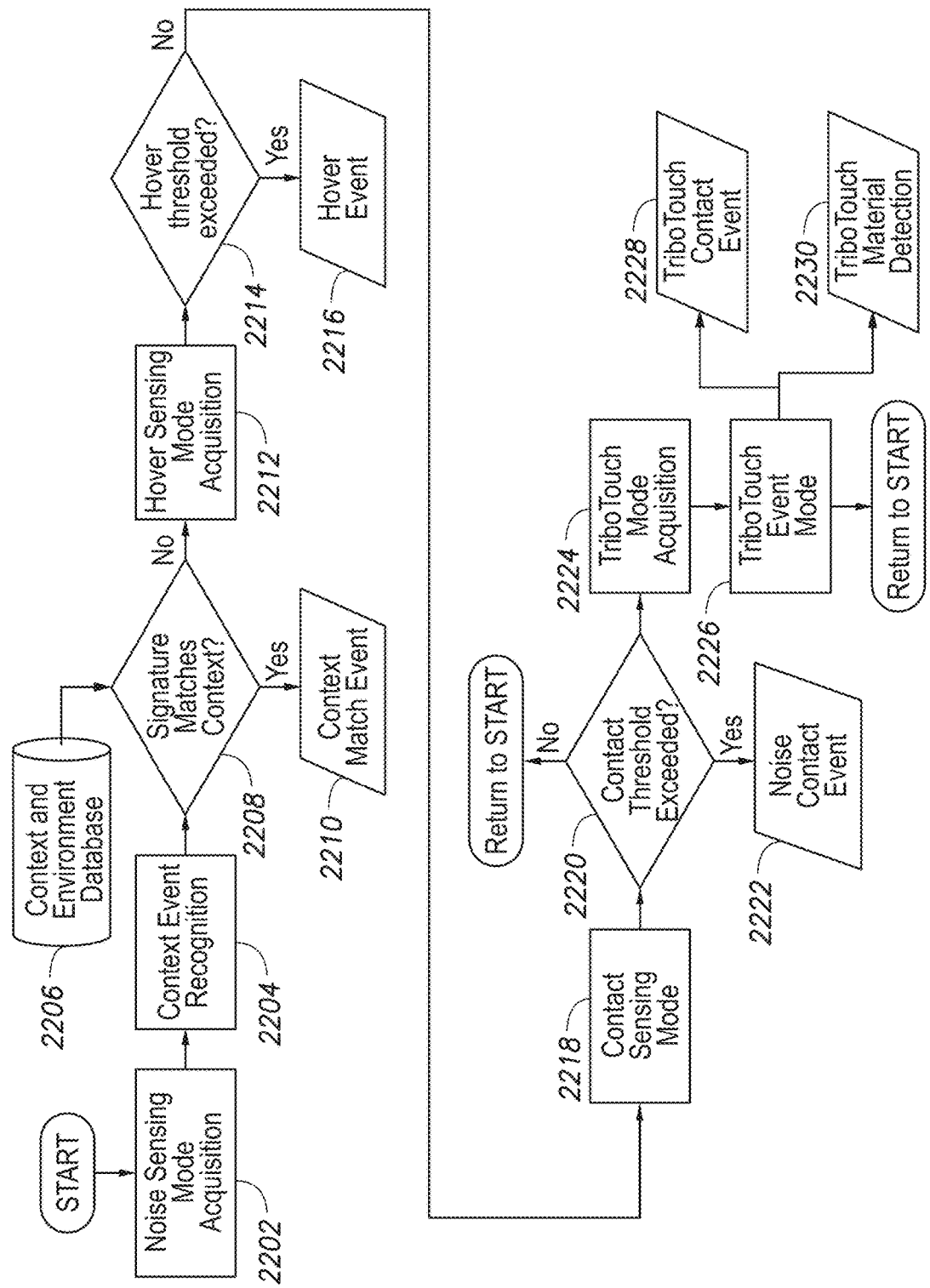
Figure 23:
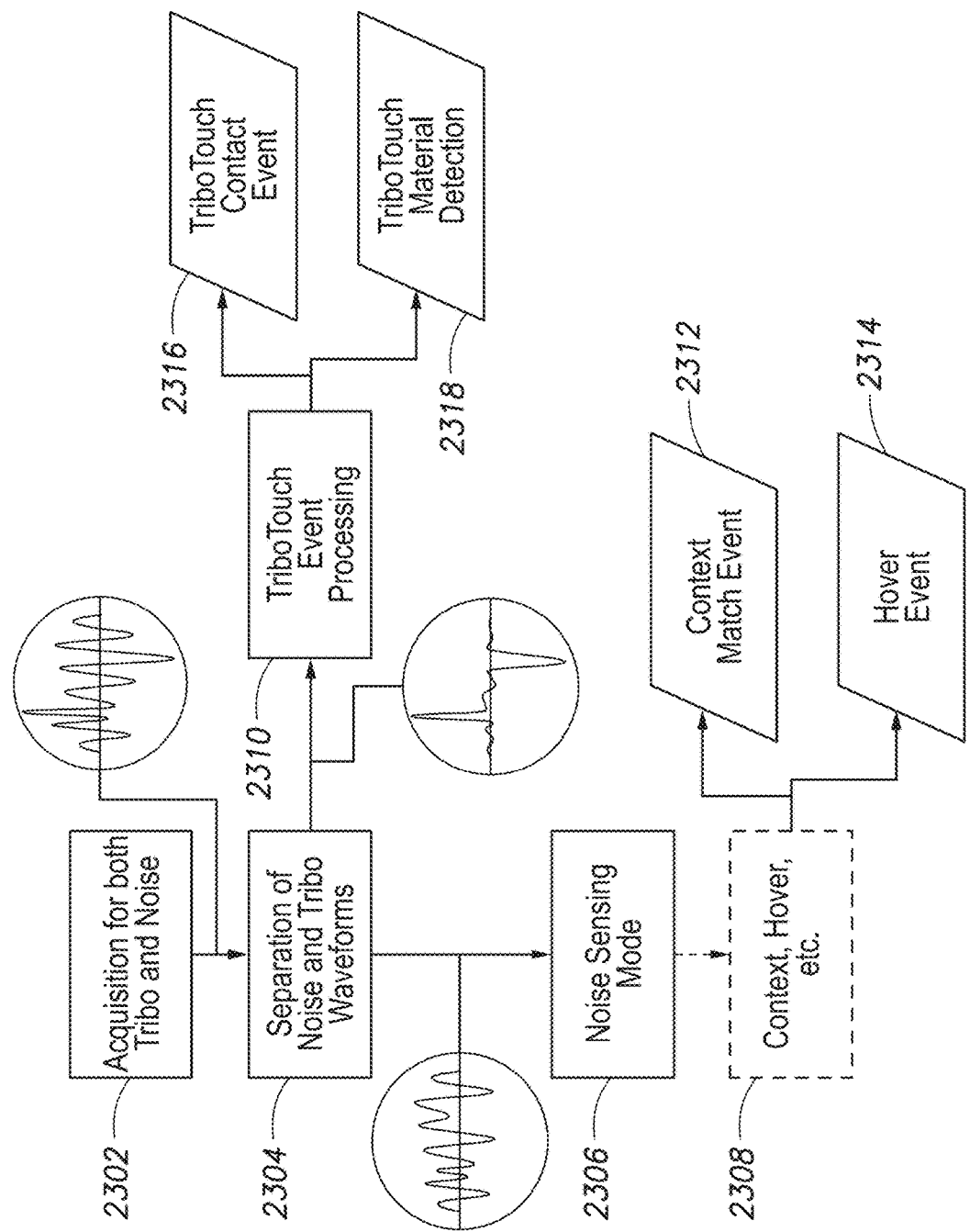

FIGS. 21-23 illustrate example TriboNoiseTouch processes for identifying triboelectricity-related events and noise-related events. Three example processes for sequencing TriboNoise event-sensing are described herein. The process of FIG. 21 identifies triboelectricity-related events, then identifies noise-related events (i.e., TriboTouch first). In one or more embodiments, the system can trigger the NoiseTouch subsystem when the TriboTouch portion of the system has received no signals after a period of time has elapsed. Each TriboTouch event transmits a touch-event or material classification event when detected.

The process of FIG. 22 identifies noise-events, then identifies triboelectricity events (i.e., NoiseTouch first). In one or more embodiments, in the NoiseTouch-first setup, a timer can be used to reset the noise gain settings after no interruption has been sent by a TriboTouch-recognition pipeline after a given amount of time has passed The process of FIG. 23 is an example sweep process that acquires a wide band signal and parallelizes triboelectricity sensing and noise sensing. The sweep process of FIG. 23 can be used, for example, when prioritization is to be set at a higher level, e.g., at application level. For example, a painting application may be more closely related to triboelectricity-based sensing, while location/context dependent applications may be more closely related to noise-based sensing.

The choice regarding the relative prioritizations of TriboTouch and TriboNoise can be device- and application-dependent. The triboelectricity-first approach is well-suited for applications where touch surfaces are used heavily by the user, while the "noise-first" approach is well-suited for more general application devices, such as mobile devices, where context sensing on and above the surface interaction can be used simultaneously. Similarly, context dependent-applications are likely to privilege noise-sensing, while drawing, painting, and other direct manipulation applications are likely to privilege triboelectricity-sensing.

By combining noise and triboactive measurements, it is possible to detect materials that are not sufficiently conductive to be visible to noise-based or capacitive measurements. In addition, the characteristic contact reading involved in triboactive measurement obviates the need for extensive threshold estimations for detecting touch. This means that the system is able to react to short contact events such as the user using a stylus to dot the lowercase letter "i". The combination of the systems also allows for the detection of body parts and hand-held instruments such as styli. In such cases, the stylus can simply be made of an insulator that is "invisible" to noise-based measurements, which allows the system to detect whether a contact is made by, for example, resting the wrist on the touch surface, or by the stylus held in the same hand.

FIG. 13, described in part above, illustrates a process of simultaneously detecting hand pose information and hover position. TriboNoiseTouch systems can determine when true contact has occurred, thus preventing phantom readings from fingers held close to the touch surface from accidentally invoking commands. This is a side effect of the fact that triboactive signals are only generated by direct contact. However, it is also possible to simultaneously detect hovering as well, thus presenting additional means of interaction. Since the EMI being conducted by the body is coupled capacitively to the electrode via the electric field surrounding the body, by appropriately adjusting the gain of the system, NoiseTouch is capable of detecting approach of a body part at a distance. Because of the TriboNoiseTouch system's speed, it can continuously scan the electrodes at several gain settings, allowing for simultaneous detection of hover and touch. This may be used, for example, to allow for palm or inadvertent contact rejection, detection of holding pose (one-handed vs. two-handed, left vs. right handed, and so on).

The process shown in FIG. 13 can take readings from the electrodes with a variety of gain settings, usually above the nominal setting used to detect contact. At higher gain, weaker and more distant electric fields are detected. By stacking up these weaker images at different gains, the system can detect what is near the sensing surface. For example, given a touch gain setting G, a finger hovering above would be detected at setting G+1, some of the knuckles at setting G+2, some of the hand and palm at gain setting G+3, and so on. Of course, further away objects cannot be "seen" by the sensor as well, but we can gather some information that then tells us if a user is hovering, which hand is holding the device, etc.

In one or more embodiments, TriboNoiseTouch hardware enables the detection of context, hover, contact, and material identification. Context dependent touch applications can then be provided. After context is sensed, specific touch applications and multi-material applications can be triggered, e.g. a remote control application when entering living room, or drawing application when entering the office. In addition, context can be used while the device is in standby to detect what applications and controls should be available to the user. Moreover, when TriboTouch is used to detect contact, the NoiseTouch can be used as backup or shut down completely to save power. TriboNoiseTouch can also provide high precision input. Using the integration of both TriboTouch and NoiseTouch, contact sensing coordinates can be used for high precision input in, e.g. technical drawing applications, or in interaction on very high definition displays.

An alternative implementation of the device may produce a certain amount of controlled generalized EMI from the device which is then used to detect position in areas where sufficient environmental EMI may not be available. This capability may be automatically switched on by the automated gain control systems once the levels of environmental EMI drops below a pre-programmed or dynamically selected threshold. This logic may take into account the demands placed on the system, such that when hovering functionality is not necessary, the system can switch to using triboactive mode exclusively, maintaining sensitivity while excluding detection of contact type. The noise-sensitive component of the system may be tuned to specifically use the regulatorily-allowed EMI emissions of the device exclusively, thus rejecting other sources of noise. This increases the robustness of the device since the EMI profile need not be dynamically characterized.

The TriboNoiseTouch system may use one instance of the above-mentioned hardware for each touch position, or it may use a continuous larger electrode and estimate the position based on the distance-dependent change in signal through the electrode. The change may be caused by material properties of the covering material, resistance of the electrode body, reactive impedance of the electrode, or any other method. By this means, TriboNoiseTouch may be able to distinguish position at a higher resolution than the resolution of its electrode structure. TriboNoiseTouch may be configured for single or multiple touch points, and additionally may be configured for either continuous position sensing (such as a phone or tablet), or discrete sensing (such as a button or slider). In the latter application, the strengths of the system remain in force, and make the system practical to use in many scenarios where environmental noise or contamination may be an issue, such as in automotive or marine uses, in factory floors, etc. In such cases, TriboNoiseTouch can provide the benefit of a robust input solution without the need for additional precautions necessary for traditional capacitive sensing. Additionally, the system remains sensitive even when the user is wearing a bulky glove or using a non-conductive tool to trigger the control, allowing greater flexibility in terms of method of use and environmental contamination or interference.

TriboNoiseTouch's features that continuously sense and characterize the environmental EMI can be used to passively sense the environment and context of the user. For example, at home the user may be surrounded by EMI from the TV, mobile phone, and refrigerator, while at office the user may be surrounded by the EMI from the desktop computer, office lighting, and office phone system. When the user makes contact with the TriboNoiseTouch system, perhaps to awaken or unlock their device, the TriboNoiseTouch system can capture this characteristic data and compare it to an internal database of noise and environments, using relevant similarities to deduce the user's location. This process is illustrated in FIG. 16. Note that different rooms in a house or office may have very different noise contexts. For example, the break room may include EMI from the coffee machine, while the meeting room may include EMI from a large TV or projector. The device can then use the context estimates to make certain functionality easily accessible. For example, it may automatically print queued documents from the user when the user approaches the printer, or allow control of the projector when the user is in the same room. The user may additionally configure capabilities on a per-area or per-context basis to help streamline tasks.

Figure 24:
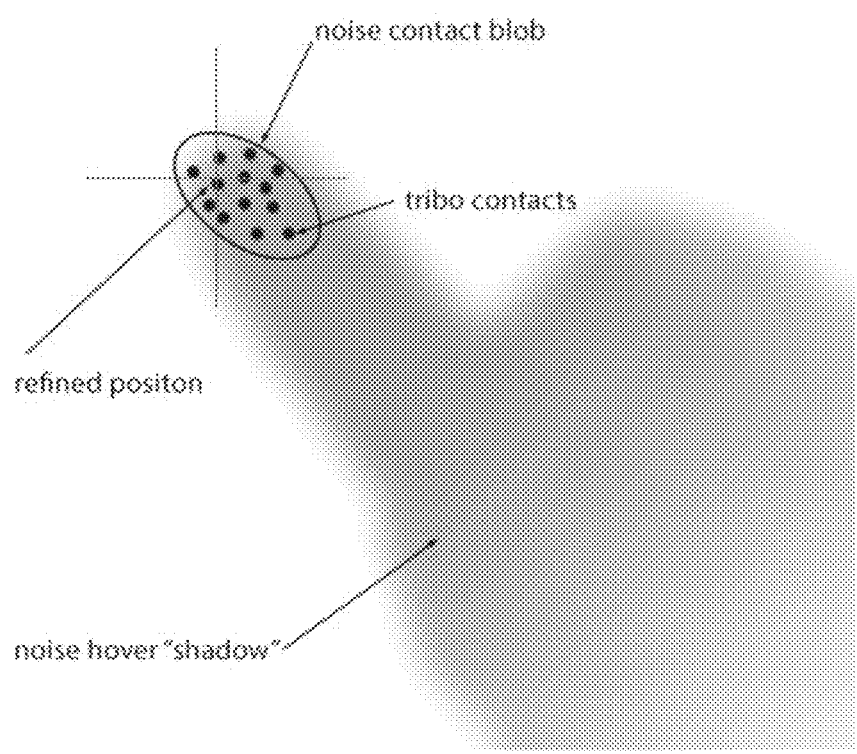
FIG. 24 illustrates a triboactive subsystem producing example high-resolution data based on individual microcontacts with a surface of a touch sensor, while a noise-based sensing subsystem produces an example blob around the area of contact or hover as well as a "shadow" of a hand hovering over the surface.

The trioactive portion of the system produces high-resolution data based on individual micro-contacts with the surface of the touch sensor, while the noise-based sensing subsystem produces a blob around the area of contact or hover as well as a "shadow" of the hand hovering over the surface (see FIG. 24). These three types of data can be combined to create additional capabilities that are not available to either sensing modalities in isolation.

Figure 25:
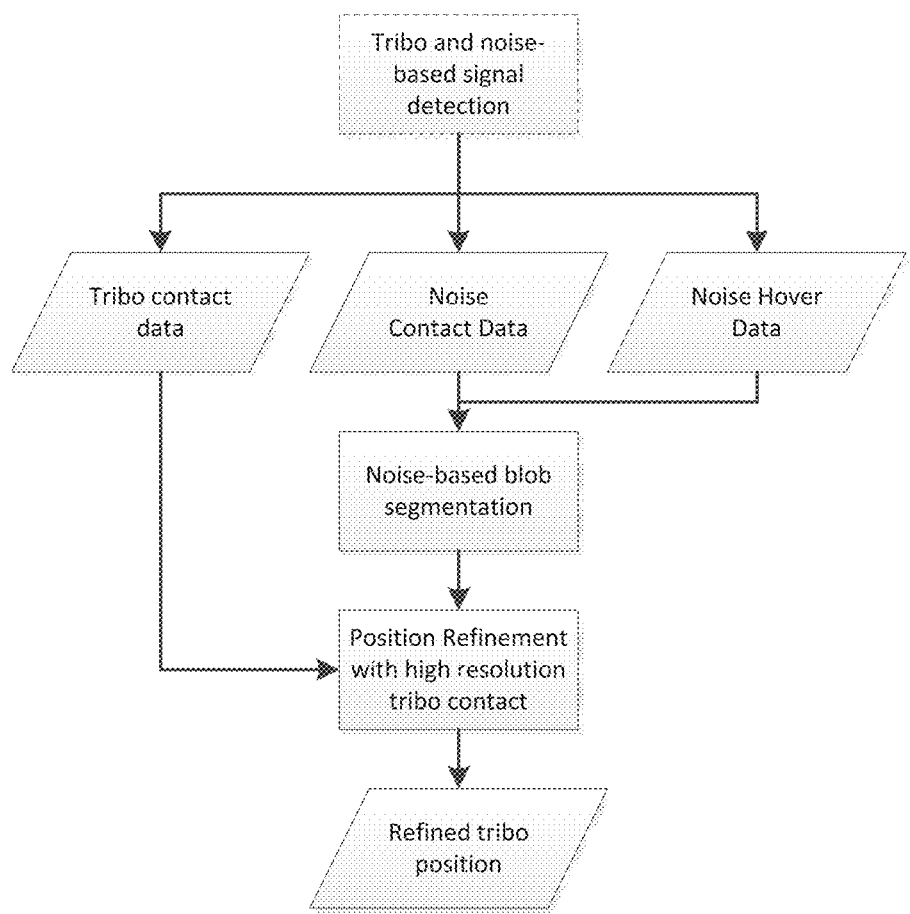
FIG. 25 illustrates an example method enhancing the accuracy of finger contact.

The accuracy of finger contact can be enhanced by using a combination of TriboTouch and NoiseTouch type sensing. TriboTouch-type normally will produce a cloud of contacts around a finger contact due to the micro-texture of the finger interacting with the sensing electrodes. The noise data can be used at the same time to give an accurate position for the centroid of the contact, thus allowing the tribo data to be cleanly segmented to be inside the noise blob. The exact tribo contact positions can them be used to estimate the shape, size, and intended exact contact position. FIG. 25 shows the method for doing this refinement.

Figure 26:
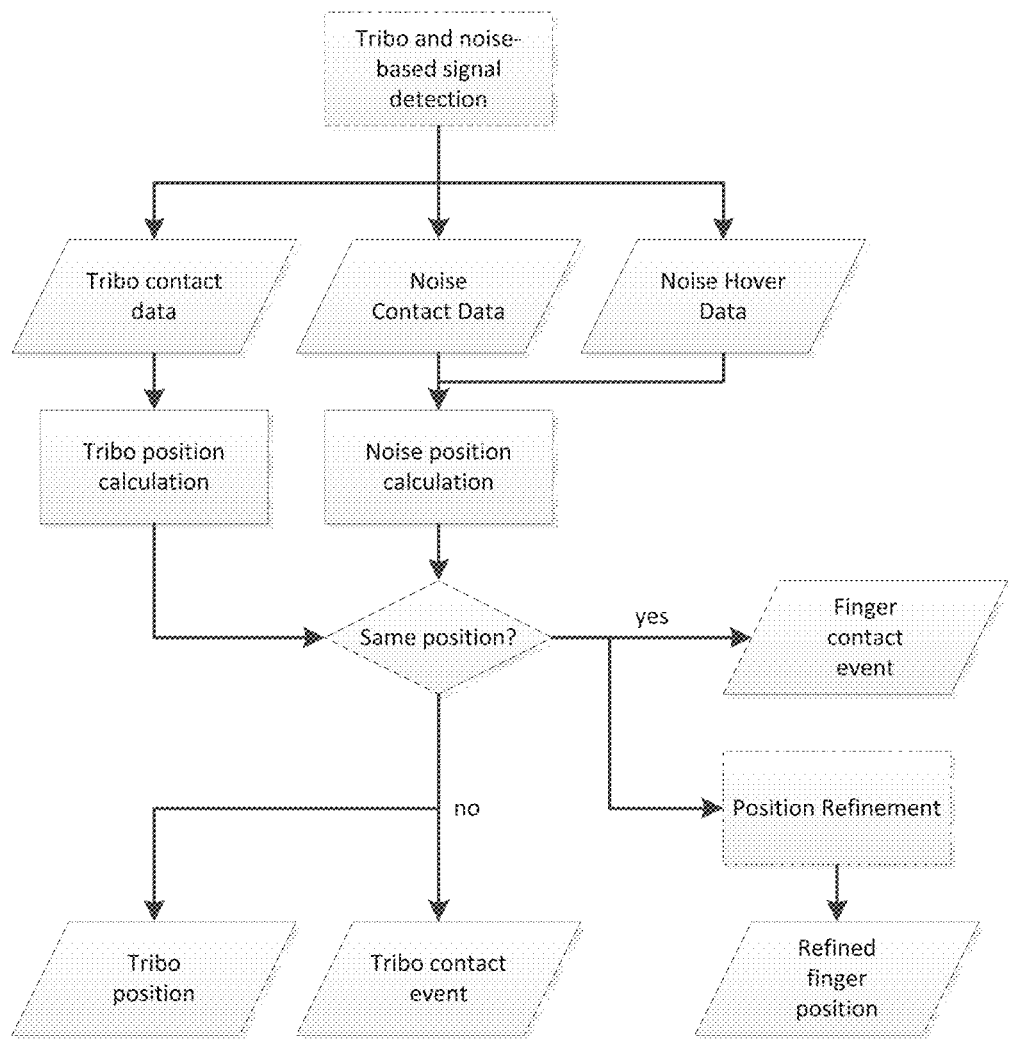
FIG. 26 illustrates an example method for detecting a finger contact and isolating it from a non-conductive pen contact.

Even if the touch sensing surface has not been treated to sense materials, or such algorithms are not active, a finger contact can be detected and isolated from a non-conductive pen contact. Since the pen is not conductive, it will not register in the noise-based sensing, while finger contact will produce both types of contact data. This can be used to control different refinement algorithms based on pen or finger contact, and to allow the simultaneous use of fingers and pens. The algorithm is shown in FIG. 26. The system provides both enhanced position based on type of contact, as well as notification of the type of contact event.

Figure 27:
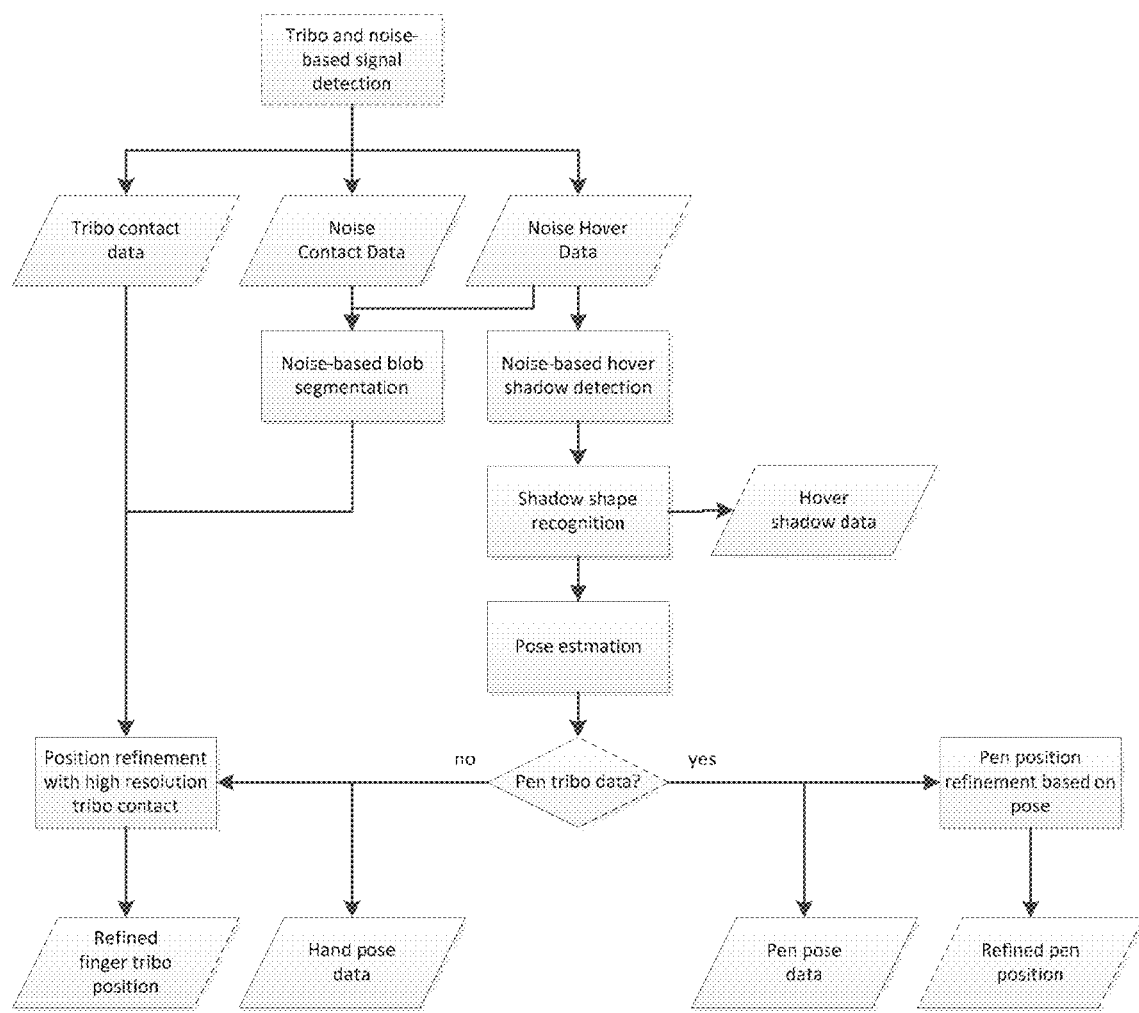
FIG. 27 illustrates example estimation of a pen or hand pose by detecting a hover shadow of the hand making contact or holding the pen.

The pen or hand pose can be estimated by detecting the hover shadow of the hand making contact or holding the pen. The overall shape of the hand, as well as the shape of the hand while holding a pen can be detected by using a pattern matching algorithm or heuristic, and this can be used to detect whether a contact is made by the left or right hand, as well as estimate of pen or finger tilt. Tilt is calculated by estimating the point where the stylus or pen is held, and the actual point of contact. The same approximate measurement can be made about finger contact and finger angle. The algorithm is shown in FIG. 27.

Additional data can be made available to client programs to detect over-screen gestures, as well as disambiguation of left and right-handed contact. This can allow for example control of tool type with one hand while the other is used for manipulation, without two contacts accidentally triggering pinching gesture heuristics.

As noted previously, the TriboTouch system can be used to detect the material making contact by examining the differences in charge displacement caused by various materials. Noise signals are transmitted through conductive and resistive object. As a result, it can help classification of materials done by TriboNoiseTouch hardware by quickly discriminating materials depending on their conductivity. For example, when interacting with the TriboNoiseTouch enabled display, the tip of the pencil could be detected to automatically trigger the drawing tool, while using the eraser of the pencil will trigger the erasing function. In this scenario, the NoiseTouch hardware will be able to detect the use of the tip of the pencil because it is conductive and will trigger both noise and tribo signals. On the other hand, the eraser will only generate tribo-electric signals.

TriboNoiseTouch can be configured such that NoiseTouch is triggered only after contact has been sensed by the TriboTouch hardware. This system will only focus on contact-based interaction, such as touch and pen interaction, and will not be able to sense interaction above the surface such as hover. However, this will enable power savings and prevent both Tribo and Noise hardware (and their respective signal processing pipelines) to actively wait for interaction events. While the same front end is used for both, the reduction in calculations reduces the dynamic power usage of the digital logic used to run the trioactive and noise-based position calculations.

Figure 28:
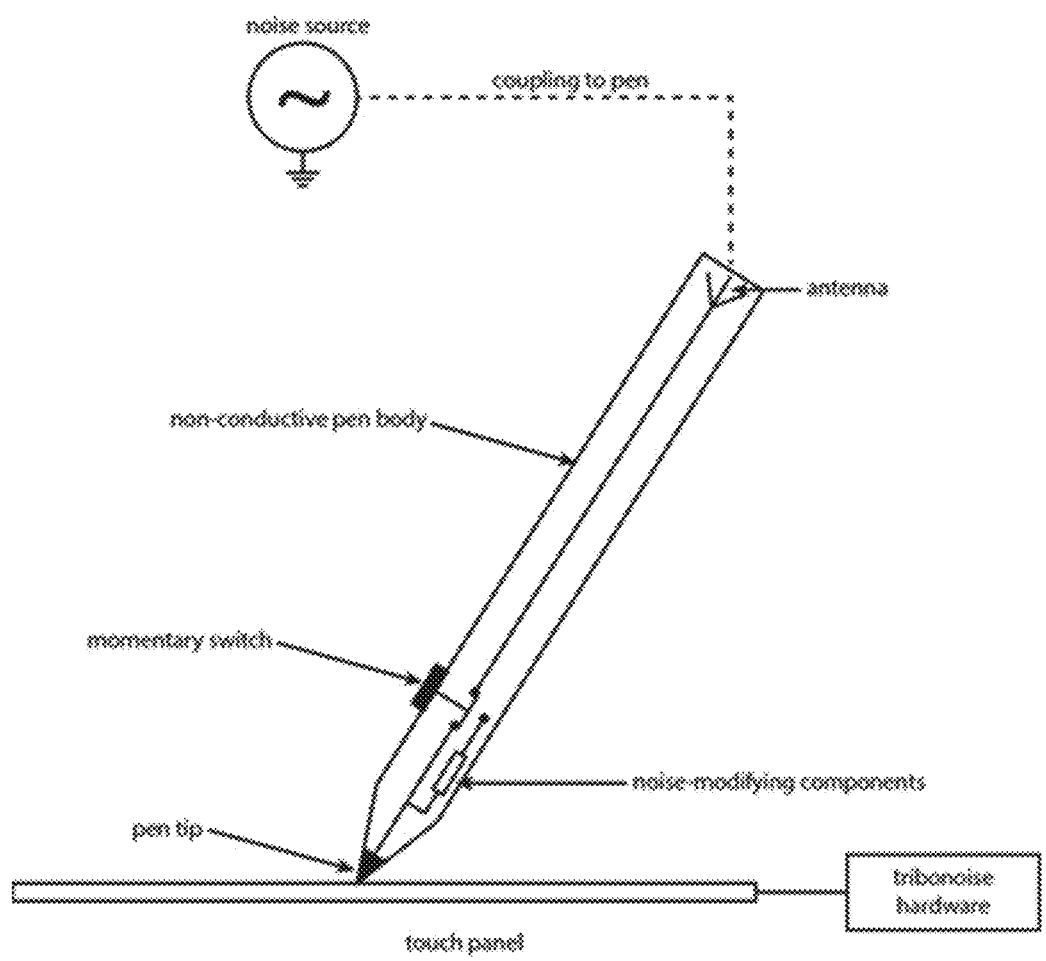
FIG. 28 illustrates example TriboTouch sensing for providing high resolution stylus sensing and example TriboNoise sensing for detecting a specifically designed stylus that features buttons to trigger menus and functions.

While TriboTouch sensing can provide high resolution stylus sensing, TriboNoise can be used to detect a specifically designed stylus that features buttons to trigger menus and functions. The stylus will use tribo and noise signals together to detect position, where for example triboelectric signals will enable sensing contact, release and dragging states, while sensing noise will help to recover position during dragging states, hold, as well as get information from button presses (see FIG. 28). The core of the stylus consists of an antenna that transmits noise signal to the panel when the pen is in contact with the surface. The button enables adding to the antenna path a filtering circuit that will affect the noise signal in a predictable way, by adding a complex impedance or nonlinear behavior (like a diode) to the signal path. By analyzing the signal injected into the panel by the pen, the system can detect if the button has been pressed or not. In the case of a change to impedance caused by a button, a change in phase or amplitude at certain frequency will be the indicator of a button press. In case of a diode or other non-linear element, harmonics of a certain frequency will be sensed when the button is pressed due to clipping or shaping of the incoming noise signal.

Figure 29:
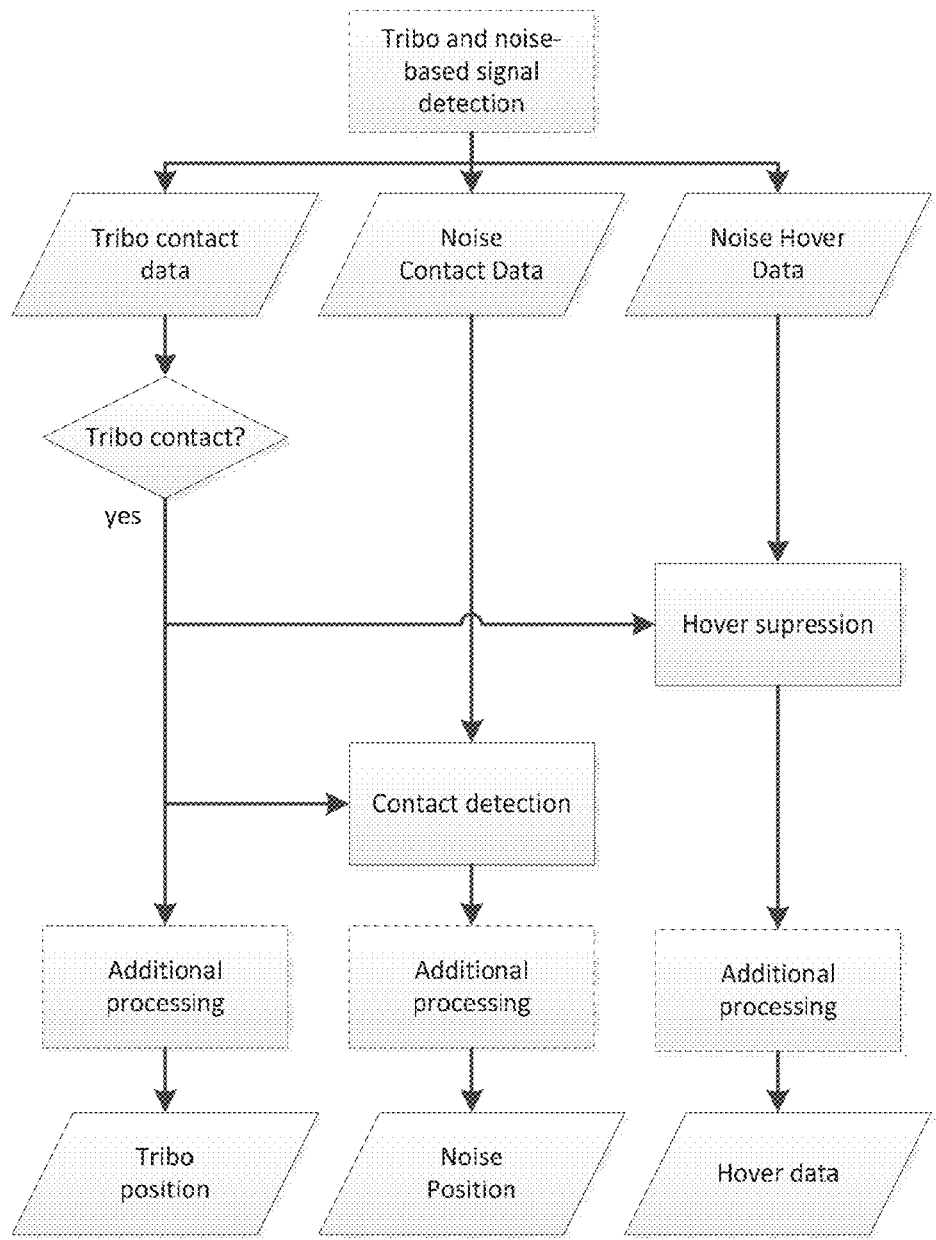
FIG. 29 illustrates an example method for improving a dynamic range for hover sensing.

Because triboelectric charging occurs when objects make or break contact, it is possible to detect these events more precisely using TriboTouch alone or in combination with NoiseTouch or other sensing methods. By contrast, NoiseTouch alone uses a threshold value (that may be adaptive) to determine when contact occurs. Because the tribocharge distribution and polarity depend on the direction of motion (toward, away from, and along the surface), these events can be distinguished from hovering or near-contact events. This allows a finer control over the range of values considered for hovering, and thus improves the dynamic range for hover sensing (see FIG. 29).

While TriboTouch is good at detecting contact, separation, and motion, it cannot detect static objects. Therefore it is complemented by the use of NoiseTouch to detect position and shape of conductive objects during long static contacts.

Another scenario is the simultaneous use of a nonconductive stylus, brush, or other object detected solely by TriboTouch in combination with finger gestures detected by both TriboTouch and NoiseTouch. An application can distinguish between the fingers and the stylus because of the differences in their TriboTouch and NoiseTouch characteristics, and therefore process their corresponding events differently. For example, stylus input can be used to draw and brush input to paint, while finger input can be used to manipulate the image. For example, this allows the user to zoom using hover and simultaneously use plastic stylus to draw; to adjust the drawing space as the user is drawing; to scale with fingers while drawing with stylus; or to control a drawing parameter such as brush color intensity with hover while simultaneously drawing with a stylus.

By patterning conductive and non-conductive materials onto an object, information may be encoded to allow recognition of the object. For example, the bottom of a game piece may be encoded with a pattern of materials that allow its identity and orientation to be detected.

Figures 30, 31:
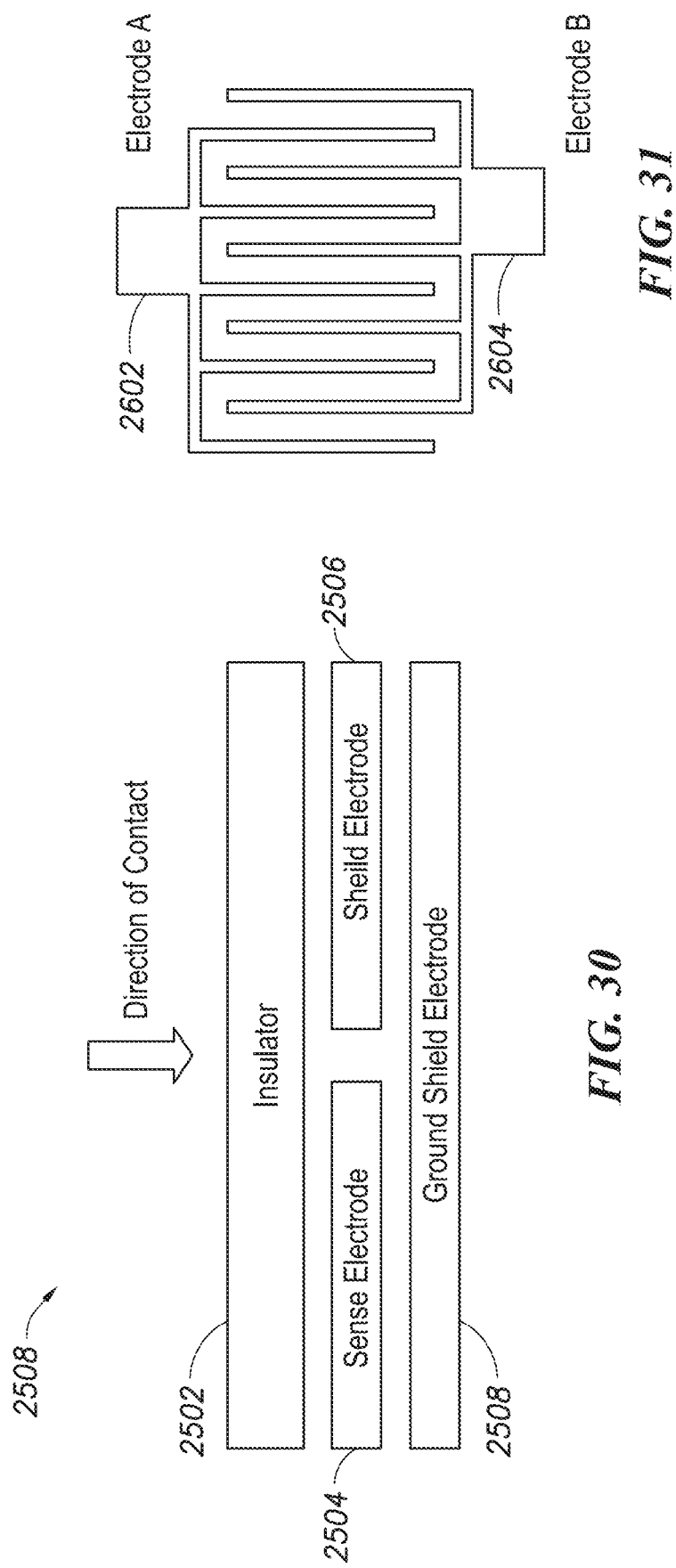
FIG. 30 illustrates example single-touch electrode components.
FIG. 31 illustrates two electrodes in an example interleaved pattern.

FIG. 30 illustrates example single-touch electrode components, which are one type of electrode configuration that can be used with the TriboTouch, NoiseTouch, and TriboNoiseTouch techniques disclosed herein. Other electrode configurations can also be used. In particular, the electrode types disclosed herein include (1) single-touch electrodes, (2) dual-touch electrodes, (3) array multi-touch electrodes, including the multiple-electrode configuration shown in FIG. 34, (4) continuous passive position sensing, (5) continuous two-dimensional passive position sensing, (6) dielectric-encoded passive position sensing, (7) continuous passive position sensing using an array of non-linear elements, and (8) spatially-distributed coordinate encoding. Types (1)-(7) can be used with any of TriboTouch, NoiseTouch, and TriboNoiseTouch. Type (8) can be used with TriboTouch or TriboNoiseTouch. Any of these valid electrode-detection combinations (e.g., a combination of one or more of the electrodes (1)-(8) and one of the TriboTouch, TriboNoise, and TriboNoiseTouch detection techniques) can be used with the same analog front-end, such as the analog front-end described above with reference to FIG. 3.

Referring again to FIG. 30, a single-touch electrode can be designed to act as a switch, or can be arranged in an array as an element of a larger surface. A single-touch electrode with these components is shown in FIG. 30. The components include an insulator layer and sense electrodes. The shield electrode and ground shield electrodes may be omitted at the cost of degraded performance, though performance may remain sufficient for touch detection. The shield electrode may be inter-digitated with the sense electrode such that the distance between the lines of the two electrodes is minimized. This may be done with simple inter-digitation, or via the use of a space-filling curve. A specific instantiation is the use of an inter-digitated Hilbert curve. The use of the inter-digitated electrodes is used to reduce the parasitic capacitance of the electrode relative to the environment by actively driving the electrode using the output of the high-impedance amplifier of the sensing system. An additional shield electrode may be used to reject input to the system from the direction opposed to the front of the surface. This prevents spurious detection of contact due to EMI produced by nearby electronics, such as the display in the case of a transparent touch surface application such as a tablet.

FIG. 31 illustrates two electrodes (2602 and 2604) in an example interleaved pattern. In the interleaved electrode, only the shield and pickup electrodes are shown. Electrodes may be used interchangeably for pickup or shield. This is a simple example of interleaved patterns, and the conductive portions of the electrodes may be more complexly intertwined.

FIG. 32 illustrates a row-column electrode grid that can be used to detect position of two touch points. Note that unlike capacitive touch sensors, row-column configurations do not directly offer the ability to sense multiple touch positions, since the electrodes are used as sense electrodes, and in the triboactive and noise-based sensors, transmit electrodes may not be present. In this configuration, two touch points can be distinguished, though their exact positions can be lost. However, this is sufficient for common gestures such as two-finger tap or pinch/expansion gestures. Other example gestures can be a wave or sweep motion made over the screen without contact, or a hovering motion over a control (which can elicit a highlighting feedback).

FIGS. 33 and 34 illustrate array multitouch configurations using single-touch electrodes in a grid. Each electrode individually picks up contact near it. However, since electric fields as well as the charge cloud produced by triboactivity expand outward from the source charge deflection, the field can be detected by nearby electrodes as well, as shown in FIG. 34. As a result, the position of the contact can be interpolated between the electrodes that receive the signal. Likewise, because capacitive coupling takes place at some distance, the noise-based sensor can detect the presence of a hovering conductive body such as the user's finger, allowing for hover sensing.

FIG. 35 illustrates an example of continuous passive position sensing using a resistive sheet electrode. For continuous passive position sensing, a sheet electrode with some known uniform resistance per unit of area can be used alongside pickup electrodes that are placed on this resistive sheet 3002. The configuration shown in FIG. 35 involves a linear sensor with two pickup electrodes. Continuous passive position sensing is performed by detecting the apportionment of charge displacement from a contact. When the impedance of the sheet matches (approximately) the impedance of the system, the value sensed at each pickup is some function of distance to the contact charge cloud. By characterizing and linearizing the readings from the pickups, it is possible to detect the position of the contact continuously at any position up to the accuracy and precision of the digitization electronics and the noise characteristics of the system itself. This approach leads to simpler electronics and a simpler patterning of the primary touch resistive sheet, which in turn leads to lower cost and complexity. The position of contact can be calculated based on the proportion of output each pickup relative to the total signal captured. Conversely, a global noise pickup layer may be laid under the resistive layer to sense to total amount of charge injected into the surface, thus allowing a direct comparison.

Figure 37:
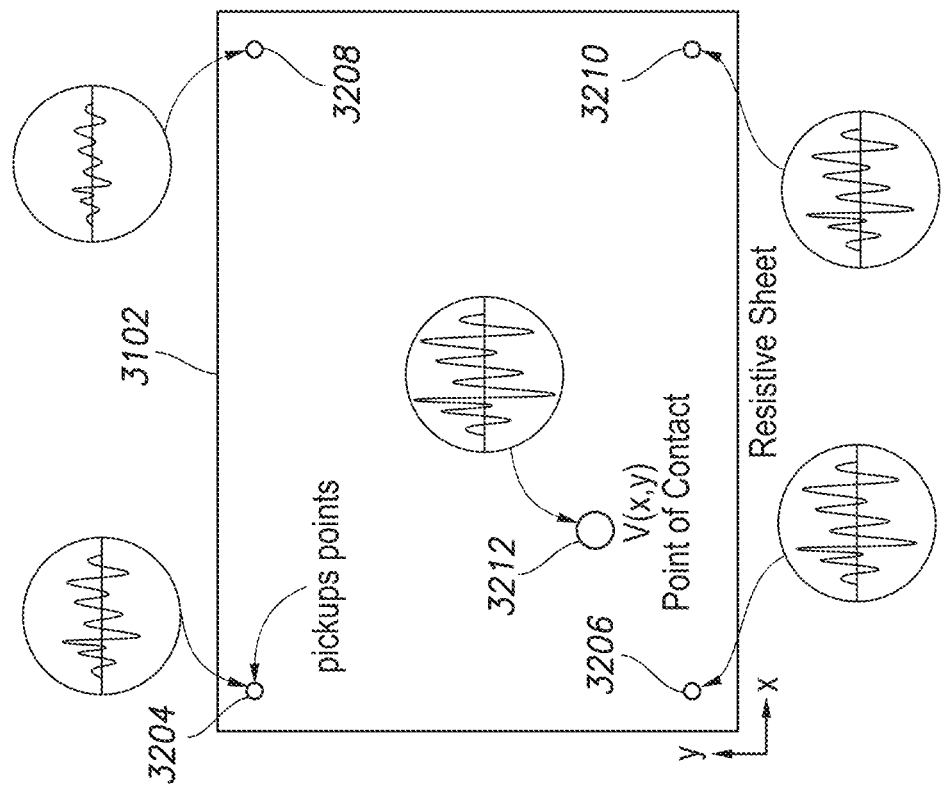
FIGS. 36 and 37 illustrate an example of continuous two-dimensional passive position sensing.
Figure 36:
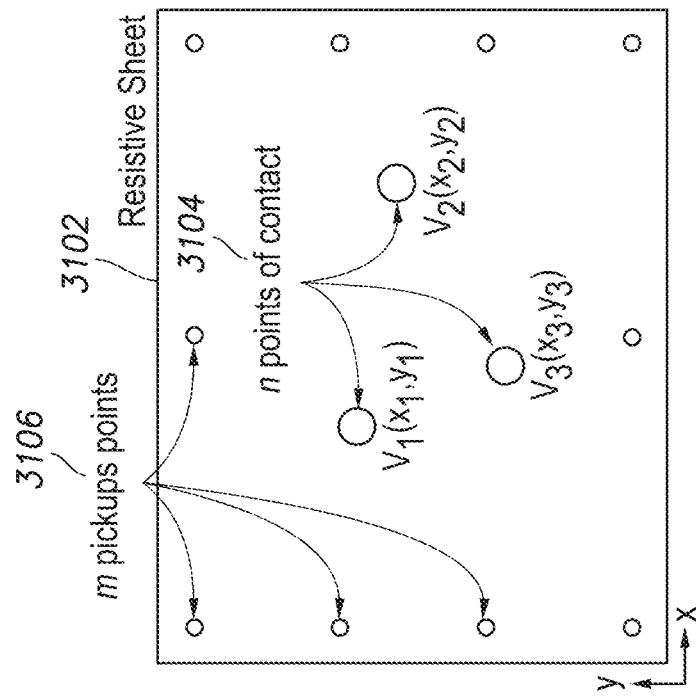

FIGS. 36 and 37 illustrate an example of continuous two-dimensional passive position sensing. The passive position sensing technique shown in FIG. 35 can be extended to two dimensions, as shown in FIG. 36. The two-dimensional technique can sense n points of touch 3104 from the signals induced in a resistive sheet 3102 with a known distribution of m pickup points 3106. The inputs to the touch surface at time t are n independent voltages Vi(t) at coordinates (xi, yi) 3212 for each point of touch, as shown in FIG. 37 Voltages are measured at m known pickup points 3204, 3206, 3208, 3210, 3212 on the edges of the resistive sheet 3102. By approximating the resistive sheet as M×N network of resistors and the use of already-known methods, the resistance between a pickup point and a touch point may be found. The relationship between the resistance between a given pickup point and a touch point is used to determine the voltage at a given pickup point. The resulting equation represents the dependence of the voltage level at a pickup location on the coordinates and input voltages at the touch points. From this system of equations for voltage levels at pickup points, the touch point coordinates (xi, yi) and input voltages Vi(t) are found. The number of required pickup point locations m is at least 3n; a larger number of pickups may be used to reduce errors due to numerical approximations and measurement error. The known distribution of pickup points and the non-linearity of the resistive sheet allow separation of the touch points and their distribution. This method can be further generalized from points of contact $(x_i, y_i)$ to points of hover $(x_i, y_i, z_i)$ by solving for a third unknown coordinate. This generalization to points of hover increases the minimum number of pickups m from 3n to 4n.

FIGS. 38-40 illustrate example electrode-sheet configurations. The electrodes can be designed with pickups and resistive sheet on different layers, or on the same layer, as shown in FIG. 38 and FIG. 39 respectively. FIG. 38 shows the pickups 3306 and resistive sheet 3302 as different layers, separated by pickup contacts 3304. Additionally, to increase the resolution of contact readouts, several of these patches may be arrayed next to each other with minimal gaps between them for pickup electrodes to create a single layer high-resolution touch surface. FIG. 39 shows the pickup contacts 3402 on the same layer as the resistive sheet 3404. Alternatively, as shown in FIG. 40, the contacts 3502 can be placed in the interior rather than the edge of the resistive sheet 2504 using a two-layer approach, effectively allowing some electrodes such as contact 3502 to be used for multiple patches 3506, 3508.

Figure 41:
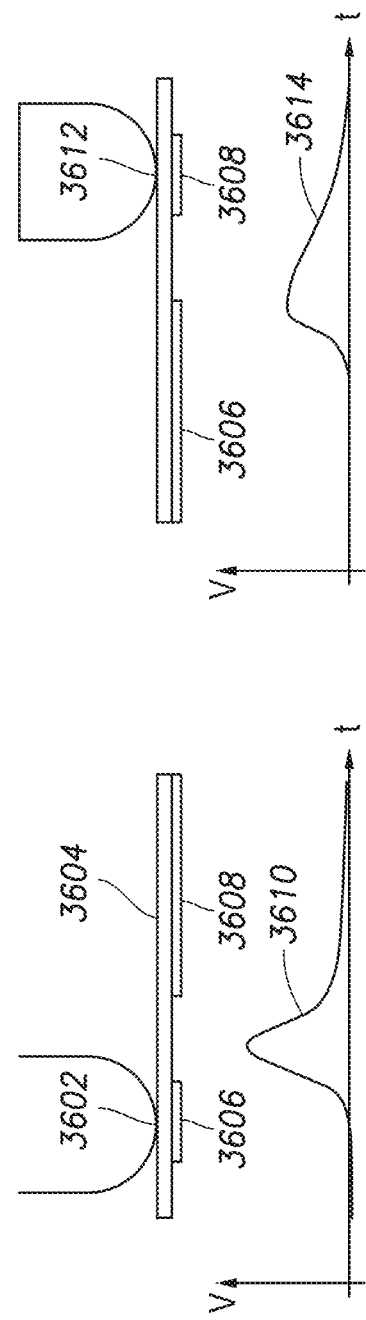
FIG. 41 illustrates an example of dielectric-encoded passive position sensing.

FIG. 41 illustrates an example of dielectric-encoded passive position sensing. A position of contact 3602, 3612 can be encoded to a single pickup electrode by a dielectric code printed to the touch surface. Since the signal from the contact is capacitively transferred to the electrode, it is possible to encode a dielectric pattern onto the surface that modifies the signal as it is transferred to the pickup electrodes. This dielectric pattern may be produced by etching, screen printing, subtractive lithography, mechanical, or other means. By knowing the dielectric pattern, it is possible to recover the position from a single electrode by the results of de-convolution or other inverse transforms 3610, 3614. Depending on the necessary contact area and resolution, multiple such patches 3606, 3608 can be placed next to each other to produce a complete touch surface, simplifying the code and increasing the size of the code relative to the size of the patch in each patch.

Figure 42:
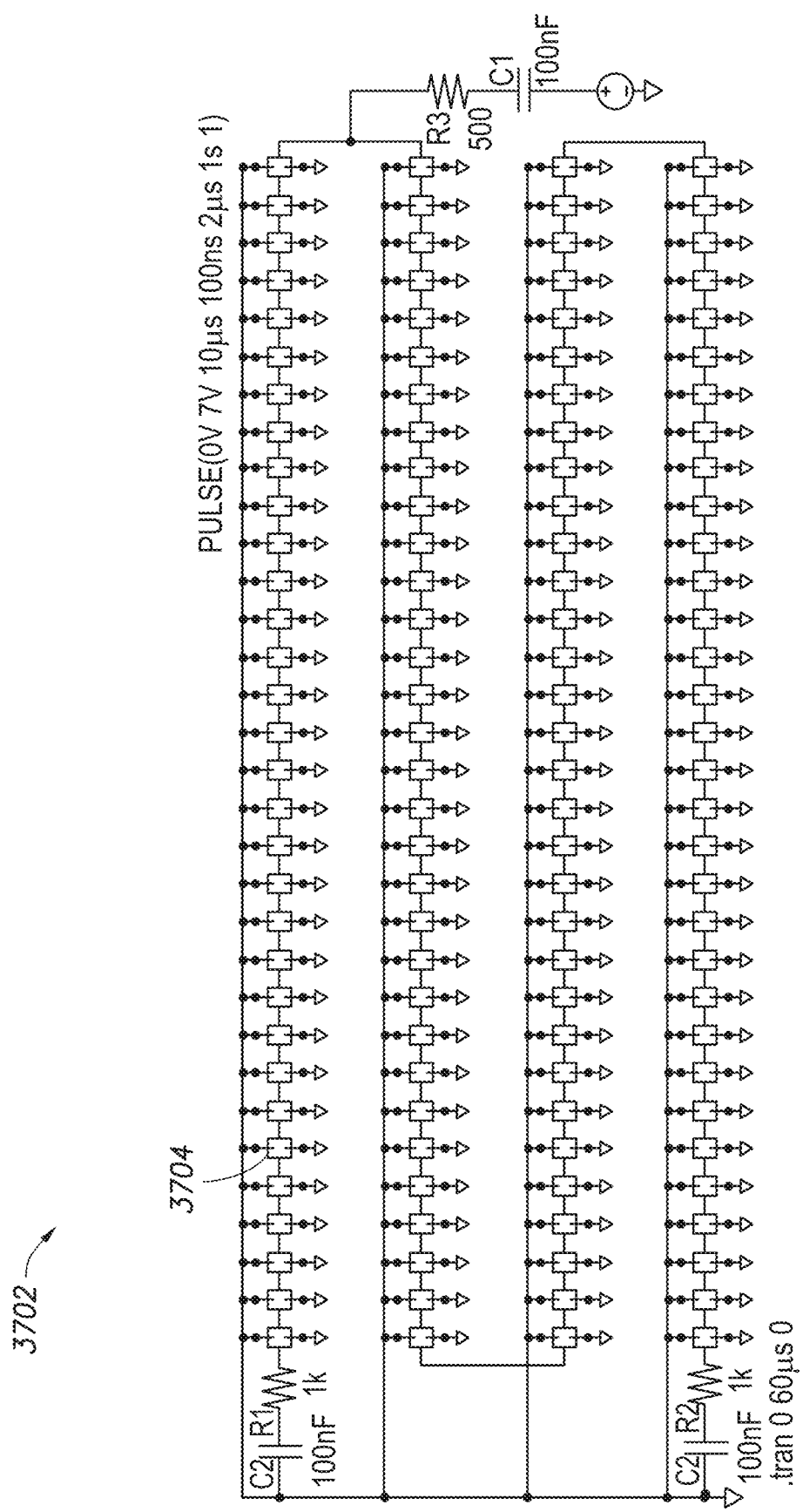
FIGS. 42 and 43 illustrate an example of continuous passive position sensing using an array of non-linear elements.
Figure 43:
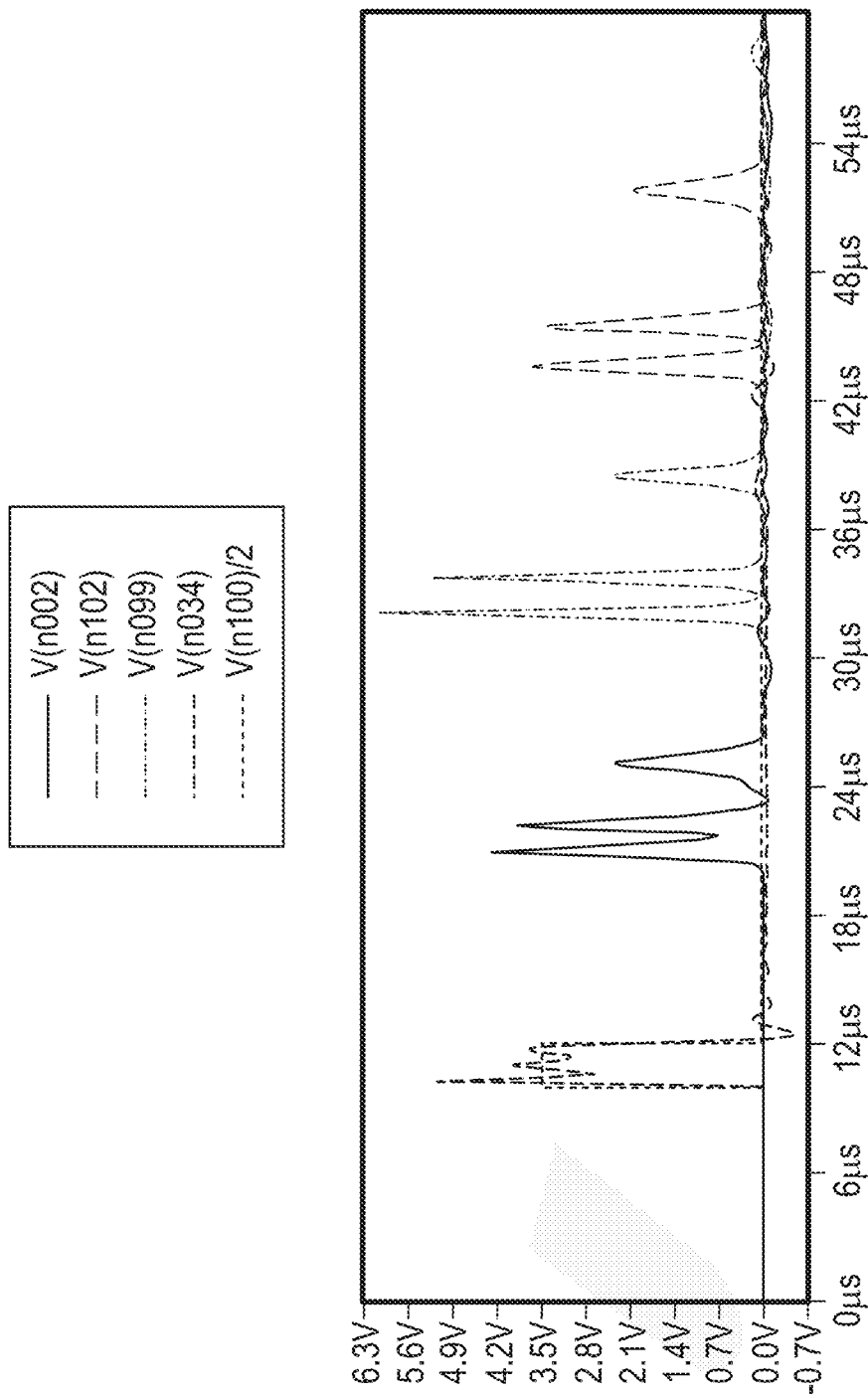

FIGS. 42 and 43 illustrate an example of continuous passive position sensing using an array 3702 of non-linear elements 3704. The continuous passive position sensing approach can be combined with row-column grid-based position sensing to calculate the position of fingers. Due to the non-linear response of the system to touch position, multiple touches on the same row or column can be distinguished. Therefore, it becomes possible to use a row-column grid to calculate high-resolution multi-touch position. Instead of using a continuous resistive sheet, it is possible to replace the resistive sheet with a lattice of nonlinear reactive elements or a sheet material that has a nonlinear reactance. FIG. 42 shows a one-dimensional lattice for simplicity; similar principles apply to two-dimensional lattices. A signal injected into this medium decomposes into a group of solitons (solitary excitations) that exhibit a distance- and frequency-dependent relative phase shift as they travel through the medium. In FIG. 43, each line pattern shows increasing distance from pickup. The soliton phase shifts can then be used to calculate the distance from each pickup point to the event, allowing determination of the event location. In one or more embodiments, a nonlinear transmission line (lattice of nonlinear reactive elements) can be used with a multitude of pickup points. In such a case, the surface can be broken into zones or strips, with one array covering each strip. The array also may be joined linearly, or in a matrix configuration with more than two connections to nearby elements.

Figure 44:
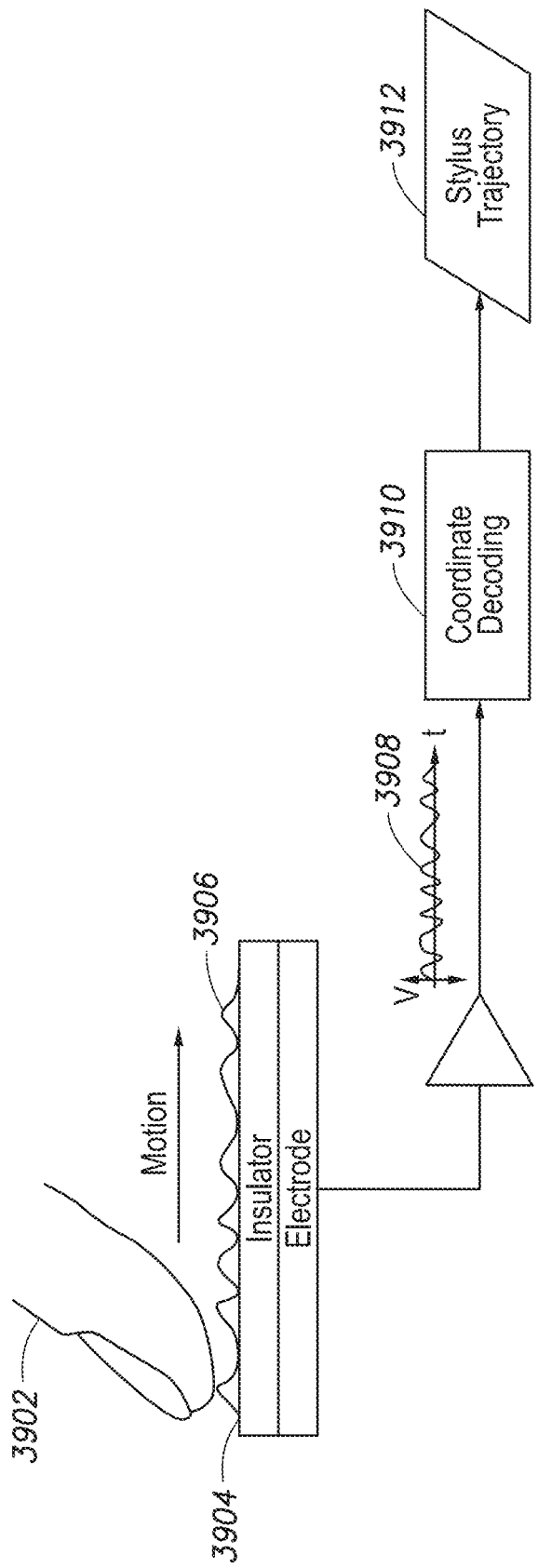
FIG. 44 illustrates an example of spatially-distributed coordinated encoding.

FIG. 44 illustrates an example of spatially-distributed coordinated encoding. In one or more embodiments, the position of a contact or motion event at the sensing surface can be determined by encoding coordinates in physical variations of the surface which are then decoded from the signal generated by the event. An example of this is shown in cross-section in FIG. 44: as a finger 3902 moves across a surface 3904 with a varying height profile 3906, the detected signal 3908 reflects the profile variations along the direction of motion. Position information can be encoded in these variations using a two-dimensional self-clocking code, and subsequent signal processing by a coordinate decoder 3910 can reconstruct the position and velocity of points along the trajectory 3912. This technique advantageously replaces an array of electrodes and associated electronics with a single electrode and amplifier, plus a textured surface to capture input motion, resulting in low-cost gestural input surfaces.

Figure 45:
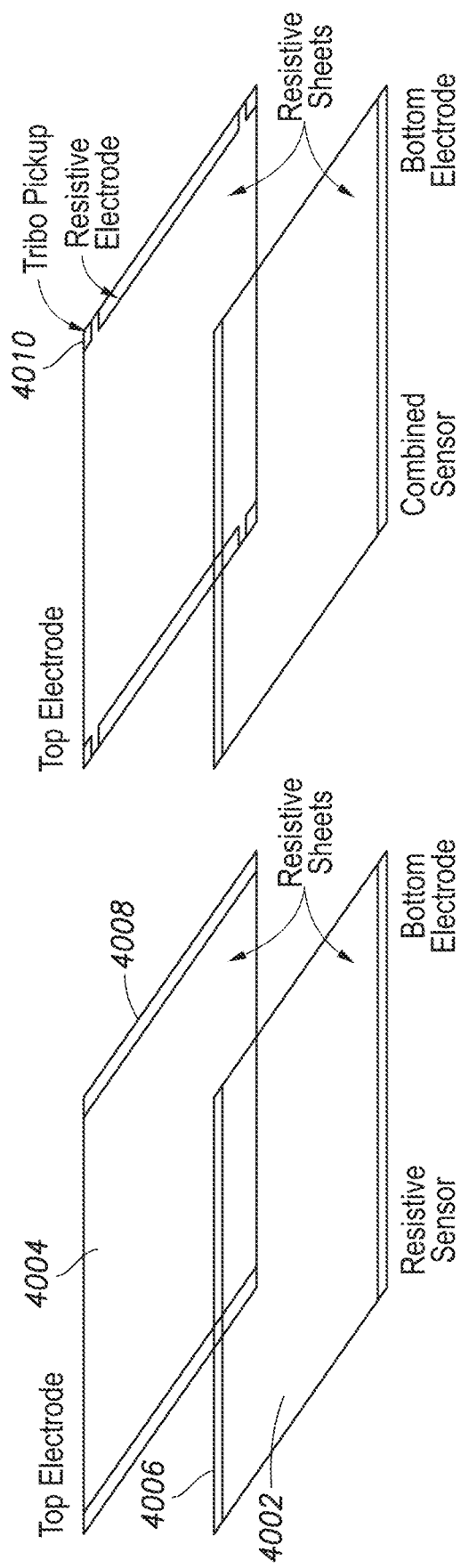
FIG. 45 illustrates an example combination of TriboTouch with resistive touch sensors.

FIG. 45 illustrates an example combination of TriboTouch with resistive touch sensors. TriboTouch can be combined with additional sensing approaches in order to use the existing physical designs, while upgrading the capabilities of the system with the benefits that TriboTouch technology offers, or to use the benefits of both approaches. Resistive sensors ordinarily use two layers 4002, 4004 coated with a resistive material, and separated by a small distance. There can be electrodes 4006, 4008 along opposing edges of each layer, in vertical and horizontal directions, respectively. When the layers make contact due to pressure from touch, a touch position is sensed. The electrodes can be used alternatively as receiver and as a voltage source to determine the vertical and horizontal position of the touch. TriboTouch can be combined with resistive sensors by placing pickups 4010 on the top resistive sheet 4002 used in a resistive sensor. The pickups 4010 can be used to derive the position of contacts on the top surface 4002. Note that since resistive sensors often use a full edge as a connector, additional or separable contacts may be needed. The resistive sensing capability can be maintained by interleaving the processing of the signals. Alternatively, in a quiescent state, the bottom layer 4004 can be connected to a voltage source, while the top layer 4002 is used for TriboTouch. If a contact is of sufficient force to contact the bottom layer, the TriboTouch system can detect the sudden large offset caused by contact with the bottom layer, hand off to the resistive system for resistive position detection, and begin interleaving at that time to use both systems. Such an approach allows for reduced switching and reduced power expenditure.

TriboTouch can also be combined with capacitive touch sensors. As shown in FIGS. 7 and 8, capacitive sensors operate by detecting the change in a transmitted electric field. In order to allow cooperation between the two systems, it is possible to connect a capacitive sensor ASIC directly to the same pads as a TriboTouch system and achieve coexistence by interleaved sensing. Since TriboTouch is capable of high-speed operation, it is possible to use existing capacitive technology without significant change. Note that capacitive signals are of a known form and frequency. Therefore, it is possible to operate non-transmitting electrodes in TriboTouch mode while they concurrently receive the signal being transmitted by other electrodes. In such a case, filters may be used to reject the capacitive signals from the TriboTouch processing system, either using traditional frequency-domain filtering, or by using synchronous filtering in cooperation with the excitation signal produced by the capacitive sensor.

Figure 46:
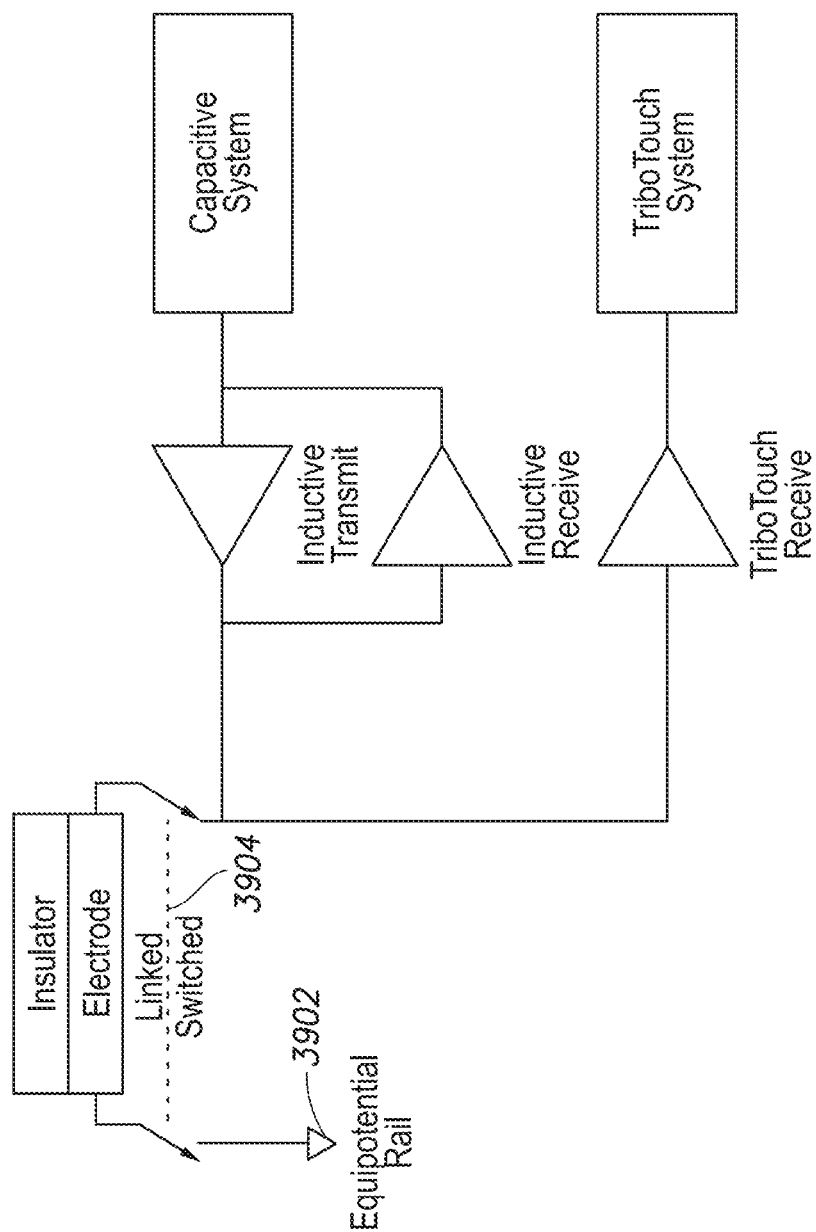
FIGS. 46 and 47 illustrate example combination of TriboTouch with inductive touch sensors.
Figure 47:
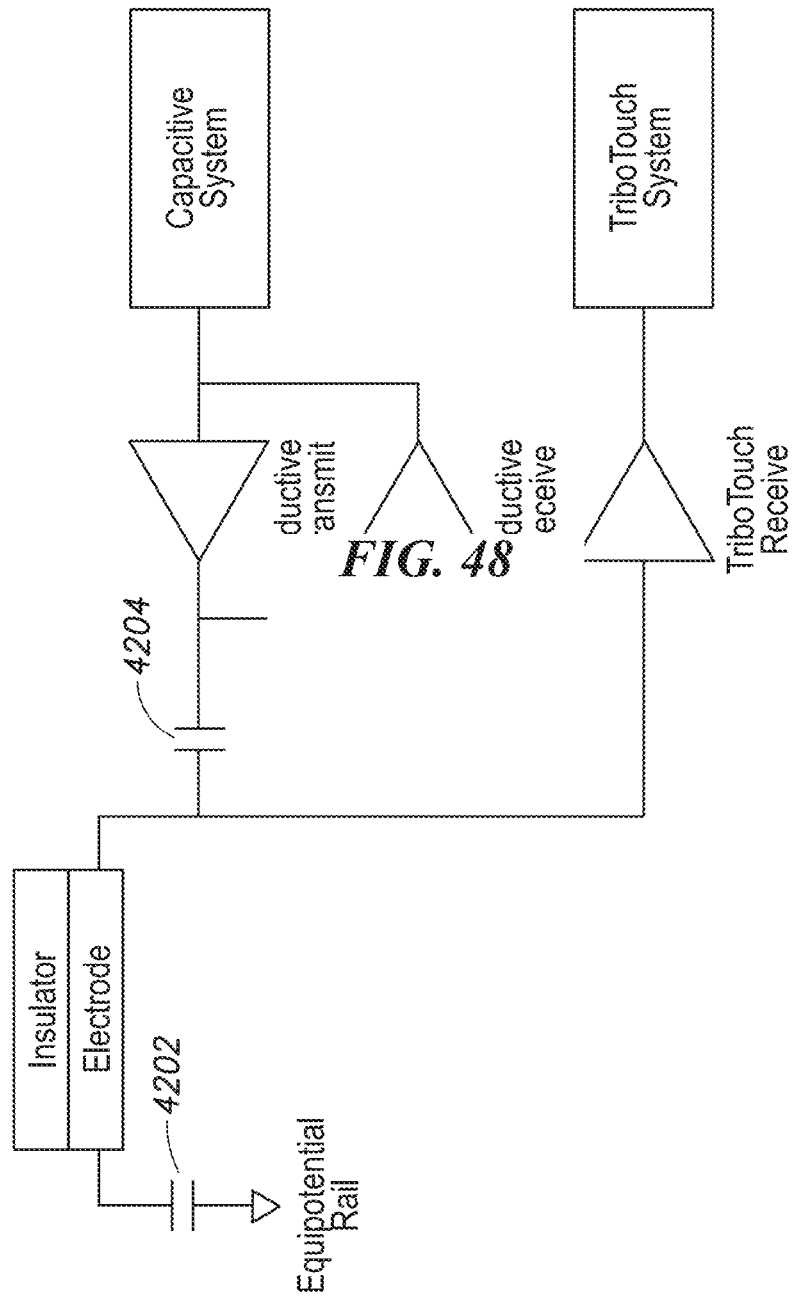

FIGS. 46 and 47 illustrate example combination of TriboTouch with inductive touch sensors. Inductive sensors operate by exciting an active stylus with a pulse of current using a matrix of wires. When a line is not being used to provide excitation, it is possible to use these lines as TriboTouch receiver lines. Since TriboTouch does not transmit any signals, the lines can be directly connected to the TriboTouch system. Note that if one end of the line is permanently attached to a fixed potential rail 3902, the rail should be disconnected so that the TriboTouch signal can be read. This disconnection can be achieved through an electronic switch 3904. Alternatively, as shown in FIG. 47, if the inductive system is being operated with current pulses, the inductive system can be coupled capacitively, e.g., via capacitors 4202, 4204, to the touch surface such that a continuous connection to a power rail does not exist. An additional benefit of incorporating TriboTouch technology is the reduction in power use. Since inductive sensing uses current flow to form a magnetic field, it is power-hungry. By detecting initial contact with the low-power TriboTouch technology, the inductive sensor can be disabled when there is no contact, leading to significant energy savings when the system is quiescent.

In one or more embodiments, TriboTouch, TriboNoise, TriboNoiseTouch, or combinations of those can be combined with other touch sensor types, such as surface acoustic wave, infrared, or acoustic touch sensors, as well as with any of the resistive, capacitive, and inductive sensors described above. TriboTouch, TriboNoise, and TriboNoiseTouch can also use the electrode types described herein, except for spatially-distributed coordinate encoding electrodes, which can be used with TriboTouch and TriboNoiseTouch, as discussed above with reference to FIG. 30.

Surface acoustic wave (SAW) touch sensors use transducers to produce an ultrasonic wave that is absorbed when a finger makes contact. The surface is ordinarily glass or a similar hard material. This surface can be patterned with a transparent conductive material to provide pickups for the TriboTouch system. No interleaving is necessary, since SAW systems do not use electrical signals transiting the surface itself to detect position.

Infrared touch sensors produce infrared light that is absorbed when a finger makes contact. This surface can be patterned with a transparent conductive material to provide pickups for the TriboTouch system. No interleaving is necessary, since infrared systems do not use electrical signals transiting the surface itself to detect position.

Acoustic touch sensors detect the specific sounds produced when an object touches the sensed surface to detect position. This surface can be patterned with a transparent conductive material to provide pickups for the TriboTouch system. No interleaving is necessary, since acoustic systems do not use electrical signals transiting the surface itself to detect position.

Figure 48:
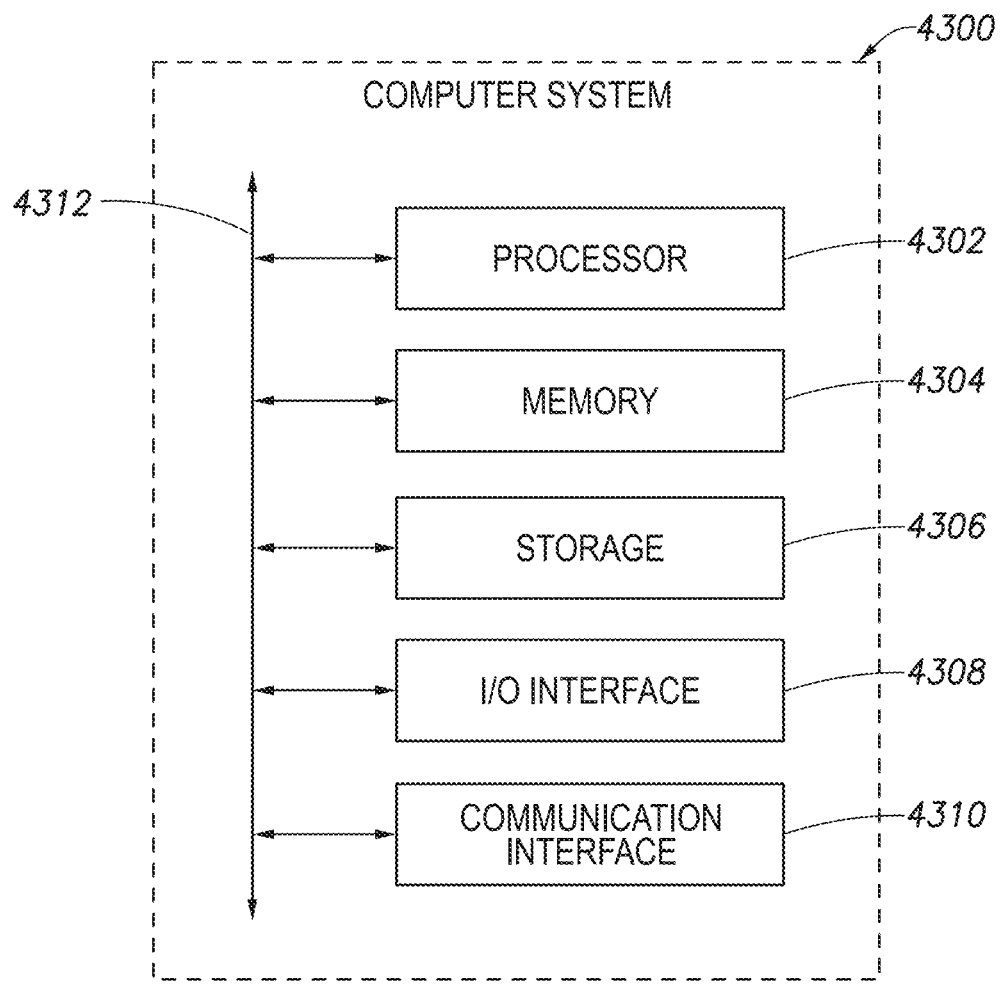
FIG. 48 illustrates an example computer system 4300.

FIG. 48 illustrates an example computer system 4300. In particular embodiments, one or more computer systems 4300 perform one or more steps of one or more methods described or illustrated herein. The processes and systems described herein, such as the processing system 312 of FIG. 3, the noise processing system 1216 of FIG. 12 or the TriboNoiseTouch processing system 1916 of FIG. 19, can be implemented using one or more computer systems 4300. In particular embodiments, one or more computer systems 4300 provide functionality described or illustrated herein. In particular embodiments, software running on one or more computer systems 4300 performs one or more steps of one or more methods described or illustrated herein or provides functionality described or illustrated herein. For example, the processing system 312 of FIG. 3, the noise processing system 1216 of FIG. 12 or the TriboNoiseTouch processing system 1916 of FIG. 19 can be implemented as one or more methods performed by software running on the one or more computer systems 4300. Particular embodiments include one or more portions of one or more computer systems 4300. Herein, reference to a computer system may encompass a computing device, and vice versa, where appropriate. Moreover, reference to a computer system may encompass one or more computer systems, where appropriate.

This disclosure contemplates any suitable number of computer systems 4300. This disclosure contemplates computer system 4300 taking any suitable physical form. As example and not by way of limitation, computer system 4300 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, or a combination of two or more of these. Where appropriate, computer system 4300 may include one or more computer systems 4300; be unitary or distributed; span multiple locations; span multiple machines; span multiple data centers; or reside in a cloud, which may include one or more cloud components in one or more networks. Where appropriate, one or more computer systems 4300 may perform without substantial spatial or temporal limitation one or more steps of one or more methods described or illustrated herein. As an example and not by way of limitation, one or more computer systems 4300 may perform in real time or in batch mode one or more steps of one or more methods described or illustrated herein. One or more computer systems 4300 may perform at different times or at different locations one or more steps of one or more methods described or illustrated herein, where appropriate.

In particular embodiments, computer system 4300 includes a processor 4302, memory 4304, storage 4306, an input/output (I/O) interface 4308, a communication interface 4310, and a bus 4312. Although this disclosure describes and illustrates a particular computer system having a particular number of particular components in a particular arrangement, this disclosure contemplates any suitable computer system having any suitable number of any suitable components in any suitable arrangement.

In particular embodiments, processor 4302 includes hardware for executing instructions, such as those making up a computer program. As an example and not by way of limitation, to execute instructions, processor 4302 may retrieve (or fetch) the instructions from an internal register, an internal cache, memory 4304, or storage 4306; decode and execute them; and then write one or more results to an internal register, an internal cache, memory 4304, or storage 4306. In particular embodiments, processor 4302 may include one or more internal caches for data, instructions, or addresses. This disclosure contemplates processor 4302 including any suitable number of any suitable internal caches, where appropriate. As an example and not by way of limitation, processor 4302 may include one or more instruction caches, one or more data caches, and one or more translation lookaside buffers (TLBs). Instructions in the instruction caches may be copies of instructions in memory 4304 or storage 4306, and the instruction caches may speed up retrieval of those instructions by processor 4302. Data in the data caches may be copies of data in memory 4304 or storage 4306 for instructions executing at processor 4302 to operate on; the results of previous instructions executed at processor 4302 for access by subsequent instructions executing at processor 4302 or for writing to memory 4304 or storage 4306; or other suitable data. The data caches may speed up read or write operations by processor 4302. The TLBs may speed up virtual-address translation for processor 4302. In particular embodiments, processor 4302 may include one or more internal registers for data, instructions, or addresses. This disclosure contemplates processor 4302 including any suitable number of any suitable internal registers, where appropriate. Where appropriate, processor 4302 may include one or more arithmetic logic units (ALUs); be a multi-core processor; or include one or more processors 4302. Although this disclosure describes and illustrates a particular processor, this disclosure contemplates any suitable processor.

In particular embodiments, memory 4304 includes main memory for storing instructions for processor 4302 to execute or data for processor 4302 to operate on. As an example and not by way of limitation, computer system 4300 may load instructions from storage 4306 or another source (such as, for example, another computer system 4300) to memory 4304. Processor 4302 may then load the instructions from memory 4304 to an internal register or internal cache. To execute the instructions, processor 4302 may retrieve the instructions from the internal register or internal cache and decode them. During or after execution of the instructions, processor 4302 may write one or more results (which may be intermediate or final results) to the internal register or internal cache. Processor 4302 may then write one or more of those results to memory 4304. In particular embodiments, processor 4302 executes only instructions in one or more internal registers or internal caches or in memory 4304 (as opposed to storage 4306 or elsewhere) and operates only on data in one or more internal registers or internal caches or in memory 4304 (as opposed to storage 4306 or elsewhere). One or more memory buses (which may each include an address bus and a data bus) may couple processor 4302 to memory 4304. Bus 4312 may include one or more memory buses, as described below. In particular embodiments, one or more memory management units (MMUs) reside between processor 4302 and memory 4304 and facilitate accesses to memory 4304 requested by processor 4302. In particular embodiments, memory 4304 includes random access memory (RAM). This RAM may be volatile memory, where appropriate, and this RAM may be dynamic RAM (DRAM) or static RAM (SRAM), where appropriate. Moreover, where appropriate, this RAM may be single-ported or multi-ported RAM. This disclosure contemplates any suitable RAM. Memory 4304 may include one or more memories 4304, where appropriate. Although this disclosure describes and illustrates particular memory, this disclosure contemplates any suitable memory.

In particular embodiments, storage 4306 includes mass storage for data or instructions. As an example and not by way of limitation, storage 4306 may include a hard disk drive (HDD), a floppy disk drive, flash memory, an optical disc, a magneto-optical disc, magnetic tape, or a Universal Serial Bus (USB) drive or a combination of two or more of these. Storage 4306 may include removable or non-removable (or fixed) media, where appropriate. Storage 4306 may be internal or external to computer system 4300, where appropriate. In particular embodiments, storage 4306 is non-volatile, solid-state memory. In particular embodiments, storage 4306 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 4306 taking any suitable physical form. Storage 4306 may include one or more storage control units facilitating communication between processor 4302 and storage 4306, where appropriate. Where appropriate, storage 4306 may include one or more storages 4306. Although this disclosure describes and illustrates particular storage, this disclosure contemplates any suitable storage.

In particular embodiments, I/O interface 4308 includes hardware, software, or both, providing one or more interfaces for communication between computer system 4300 and one or more I/O devices. Computer system 4300 may include one or more of these I/O devices, where appropriate. One or more of these I/O devices may enable communication between a person and computer system 4300. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 4308 for them. Where appropriate, I/O interface 4308 may include one or more device or software drivers enabling processor 4302 to drive one or more of these I/O devices. I/O interface 4308 may include one or more I/O interfaces 4308, where appropriate. Although this disclosure describes and illustrates a particular I/O interface, this disclosure contemplates any suitable I/O interface.

In particular embodiments, communication interface 4310 includes hardware, software, or both providing one or more interfaces for communication (such as, for example, packet-based communication) between computer system 4300 and one or more other computer systems 4300 or one or more networks. As an example and not by way of limitation, communication interface 4310 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 4310 for it. As an example and not by way of limitation, computer system 4300 may communicate with an ad hoc network, a personal area network (PAN), a local area network (LAN), a wide area network (WAN), a metropolitan area network (MAN), body area network (BAN), or one or more portions of the Internet or a combination of two or more of these. One or more portions of one or more of these networks may be wired or wireless. As an example, computer system 4300 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 4300 may include any suitable communication interface 4310 for any of these networks, where appropriate. Communication interface 4310 may include one or more communication interfaces 4310, where appropriate. Although this disclosure describes and illustrates a particular communication interface, this disclosure contemplates any suitable communication interface.

In particular embodiments, bus 4312 includes hardware, software, or both coupling components of computer system 4300 to each other. As an example and not by way of limitation, bus 4312 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 4312 may include one or more buses 4312, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An electronic device, comprising:
    a display;
    an electrode disposed onto the display and configured to detect a charge displacement in response to one or more of a plurality of objects contacting the display, wherein each of the plurality of objects is associated with a different predetermined charge pattern comprising a combination of one or more of a positive charge, a negative charge, or a neutral charge;
    a computer-readable non-transitory storage medium embodying instructions; and
    one or more processors coupled to the computer-readable non-transitory storage medium and operable to execute the instructions to:
        determine, based on the charge displacement detected by the electrode, a first object of the plurality of objects;
        in response to determining the first object of the plurality of objects, launch at least one application corresponding to the first object; and
        display, on the display, a performed action with respect to the at least one application, the performed action being performed utilizing the first object.

2. The electronic device of claim 1, wherein the first object comprises a pencil, a paintbrush, an eraser, a pen, or a stylus.

3. The electronic device of claim 1, wherein the instructions to launch the at least one application comprise instructions to launch one or more of a drawing application, a painting application, a gaming application, or a direct manipulation application.

4. The electronic device of claim 1, wherein the instructions to display the performed action with respect to the at least one application comprise instructions to:
    detect a performed action through an external material overlaying the display, the performed action being performed on the external material while overlaying the display; and
    display, on the display, the performed action as performed on the external material.

5. The electronic device of claim 1, wherein the instructions to launch the at least one application comprise instructions to launch the at least one application based on a determined context of the electronic device.

6. The electronic device of claim 5, wherein the determined context of the electronic device comprises a current location of the electronic device.

7. A non-transitory computer-readable storage medium comprising instructions that is operable when executed by one or more processors to:
    detect a charge displacement by an electrode disposed onto a display of an electronic device, wherein the electrode is configured to detect the charge displacement in response to one or more objects of a plurality of objects contacting the display, and wherein each of the plurality of objects is associated with a different predetermined charge pattern comprising a combination of one or more of a positive charge, a negative charge, or a neutral charge;

determine, based on the charge displacement, a first object of the plurality of objects;

in response to determining the first object of the plurality of objects, launch at least one application corresponding to the first object; and display, on the display, a performed action with respect to the at least one application, the performed action being performed utilizing the first object.

8. The non-transitory computer-readable storage medium of claim 7, wherein the first object comprises a pencil, a paintbrush, an eraser, a pen, or a stylus.

9. The non-transitory computer-readable storage medium of claim 7, wherein the instructions to launch the at least one application comprise instructions to launch one or more of a drawing application, a painting application, a gaming application, or a direct manipulation application.

10. The non-transitory computer-readable storage medium of claim 7, wherein the instructions to display the performed action with respect to the at least one application further comprise instructions to:

detect a performed action through an external material overlaying the display, the performed action being performed on the external material while overlaying the display; and display, on the display, the performed action as performed on the external material.

11. The non-transitory computer-readable storage medium of claim 7, wherein the instructions to launch the at least one application further comprise instructions to launch the at least one application based on a determined context of the electronic device.

12. The non-transitory computer-readable storage medium of claim 11, wherein the determined context of the electronic device comprises a current location of the electronic device.

13. A method comprising:

detecting a charge displacement by an electrode disposed onto a display of an electronic device, wherein the electrode is configured to detect the charge displacement in response to one or more objects of a plurality of objects contacting the display, and wherein each of the plurality of objects is associated with a different predetermined charge pattern comprising a combination of one or more of a positive charge, a negative charge, or a neutral charge;

determining, based on the charge displacement, a first object of the plurality of objects;

in response to determining the first object of the plurality of objects, launching at least one application corresponding to the first object; and displaying, on the display, a performed action with respect to the at least one application, the performed action being performed utilizing the first object.

14. The method of claim 13, wherein the first object comprises a pencil, a paintbrush, an eraser, a pen, or a stylus.

15. The method of claim 13, wherein launching the at least one application comprises launching one or more of a drawing application, a painting application, a gaming application, or a direct manipulation application.

16. The method of claim 13, wherein displaying the performed action with respect to the at least one application further comprises:

detecting a performed action through an external material overlaying the display, the performed action being performed on the external material while overlaying the display; and displaying, on the display, the performed action as performed on the external material.

* * * * *